(12) United States Patent
Park et al.

(10) Patent No.: US 10,943,939 B2
(45) Date of Patent: *Mar. 9, 2021

(54) VIA STRUCTURES INCLUDING ETCH-DELAY STRUCTURES AND SEMICONDUCTOR DEVICES HAVING VIA PLUGS

(71) Applicant: Samsung Electronics Co., Ltd., Suwon-si (KR)

(72) Inventors: Byung-Jun Park, Yongin-si (KR); Chang-Rok Moon, Seoul (KR); Seung-Hun Shin, Suwon-si (KR); Seong-Ho Oh, Incheon (KR); Tae-Seok Oh, Seoul (KR); June-Taeg Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/271,917

(22) Filed: Feb. 11, 2019

(65) Prior Publication Data

US 2019/0189668 A1 Jun. 20, 2019

Related U.S. Application Data

(60) Continuation of application No. 15/625,387, filed on Jun. 16, 2017, now Pat. No. 10,229,949, which is a (Continued)

(30) Foreign Application Priority Data

Feb. 3, 2014 (KR) .................. 10-2014-0012275

(51) Int. Cl.
*H01L 29/40* (2006.01)
*H01L 27/146* (2006.01)
(Continued)

(52) U.S. Cl.
CPC .. *H01L 27/14636* (2013.01); *H01L 21/76898* (2013.01); *H01L 23/481* (2013.01);
(Continued)

(58) Field of Classification Search
CPC ......... H01L 27/14636; H01L 21/76898; H01L 27/1469; H01L 27/1464; H01L 25/0657;
(Continued)

(56) References Cited

U.S. PATENT DOCUMENTS 6,767,073 B2 7/2004 Tschida
6,867,073 B1 3/2005 Enquist
(Continued)

FOREIGN PATENT DOCUMENTS

JP 2012033878 2/2012
JP 2013080838 5/2013
KR 1020110107747 10/2011

*Primary Examiner* — Mohammad M Hoque
(74) *Attorney, Agent, or Firm* — Myers Bigel, P.A.

(57) ABSTRACT

A semiconductor device includes a lower device and an upper device disposed on the lower device. The lower device includes a lower substrate, a lower plug pad disposed on the lower substrate, and a lower interlayer dielectric layer on the lower plug pad. The upper device includes an upper substrate, an etch-delay structure in a lower portion of the upper substrate, an upper plug pad disposed on a bottom surface of the upper substrate, an upper interlayer dielectric layer on the upper plug pad, and a via plug configured to penetrate the upper substrate and contact the upper plug pad and the lower plug pad. The via plug includes a first portion in contact with the upper plug pad and the first etch-delay structure, and a second portion in contact with the lower plug pad.

20 Claims, 46 Drawing Sheets

Related U.S. Application Data division of application No. 14/561,854, filed on Dec. 5, 2014, now Pat. No. 9,728,572.

(51) Int. Cl.
*H01L 23/48* (2006.01)
*H01L 25/065* (2006.01)
*H01L 21/768* (2006.01)
*H01L 25/00* (2006.01)

(52) U.S. Cl.
CPC ...... *H01L 25/0657* (2013.01); *H01L 27/1464* (2013.01); *H01L 27/1469* (2013.01); *H01L 27/14634* (2013.01); *H01L 21/76805* (2013.01); *H01L 25/50* (2013.01); *H01L 2225/06541* (2013.01); *H01L 2225/06544* (2013.01); *H01L 2225/06548* (2013.01); *H01L 2924/0002* (2013.01)

(58) Field of Classification Search
CPC . H01L 27/14634; H01L 23/481; H01L 25/50; H01L 2225/06544; H01L 21/76805; H01L 2924/0002; H01L 2225/06548; H01L 2225/06541; H01L 31/186–208
USPC ......................................................... 257/774
See application file for complete search history.

(56) References Cited

U.S. PATENT DOCUMENTS

| | | | |
|---|---|---|---|
| 7,037,755 B2 | 5/2006 | Enquist | |
| 8,129,833 B2 | 3/2012 | Kang et al. | |
| 8,168,529 B2 * | 5/2012 | Lin | H01L 21/76898 438/622 |
| 8,227,889 B2 | 7/2012 | Kuo | |
| 8,492,878 B2 | 7/2013 | Farooq et al. | |
| 8,709,936 B2 | 4/2014 | Volant et al. | |
| 8,946,898 B2 | 2/2015 | Takahashi et al. | |
| 9,209,220 B2 | 12/2015 | Kobayashi et al. | |
| 9,263,488 B2 | 2/2016 | Kataoka | |
| 9,374,511 B2 | 6/2016 | Akiyama | |
| 2008/0079131 A1 | 4/2008 | Kim et al. | |
| 2009/0079000 A1 | 3/2009 | Yamazaki et al. | |
| 2009/0134500 A1 | 5/2009 | Kuo | |
| 2010/0178018 A1 | 7/2010 | Augusto | |
| 2011/0102657 A1 | 5/2011 | Takahashi et al. | |
| 2011/0133339 A1 * | 6/2011 | Wang | H01L 21/76898 257/773 |
| 2011/0155893 A1 * | 6/2011 | Endo | H01L 27/14612 250/208.1 |
| 2011/0171582 A1 * | 7/2011 | Farooq | H01L 21/3085 430/314 |
| 2011/0233702 A1 | 9/2011 | Takahashi et al. | |
| 2011/0304026 A1 * | 12/2011 | Tsui | H01L 21/76898 257/621 |
| 2012/0038814 A1 | 2/2012 | Tayanaka | |
| 2012/0256319 A1 | 10/2012 | Mitsuhashi | |
| 2013/0020468 A1 | 1/2013 | Mitsuhashi et al. | |
| 2013/0070131 A1 | 3/2013 | Ohkubo et al. | |
| 2013/0105924 A1 | 5/2013 | Kobayashi et al. | |
| 2013/0161629 A1 | 6/2013 | Han et al. | |
| 2013/0175673 A1 | 7/2013 | Jin et al. | |
| 2013/0321680 A1 * | 12/2013 | Kumano | H01L 27/14634 348/273 |
| 2014/0070426 A1 | 3/2014 | Park et al. | |
| 2014/0091414 A1 | 4/2014 | Shimotsusa | |
| 2014/0094030 A1 | 4/2014 | Shimotsusa | |
| 2014/0217486 A1 | 8/2014 | Akiyama | |
| 2014/0264709 A1 * | 9/2014 | Tsai | H01L 23/481 257/459 |
| 2014/0264862 A1 * | 9/2014 | Tsai | H01L 25/00 257/741 |
| 2014/0264916 A1 | 9/2014 | Chao-Yuan et al. | |
| 2014/0264947 A1 * | 9/2014 | Lin | H01L 27/14636 257/777 |
| 2014/0361347 A1 | 12/2014 | Kao | |
| 2015/0054962 A1 | 2/2015 | Borthakur et al. | |
| 2015/0179613 A1 * | 6/2015 | Tsai | H01L 21/76898 257/773 |
| 2015/0187701 A1 * | 7/2015 | Tsai | H01L 23/481 257/621 |
| 2015/0295002 A1 | 10/2015 | Kang et al. | |
| 2015/0311241 A1 | 10/2015 | Park et al. | |

* cited by examiner

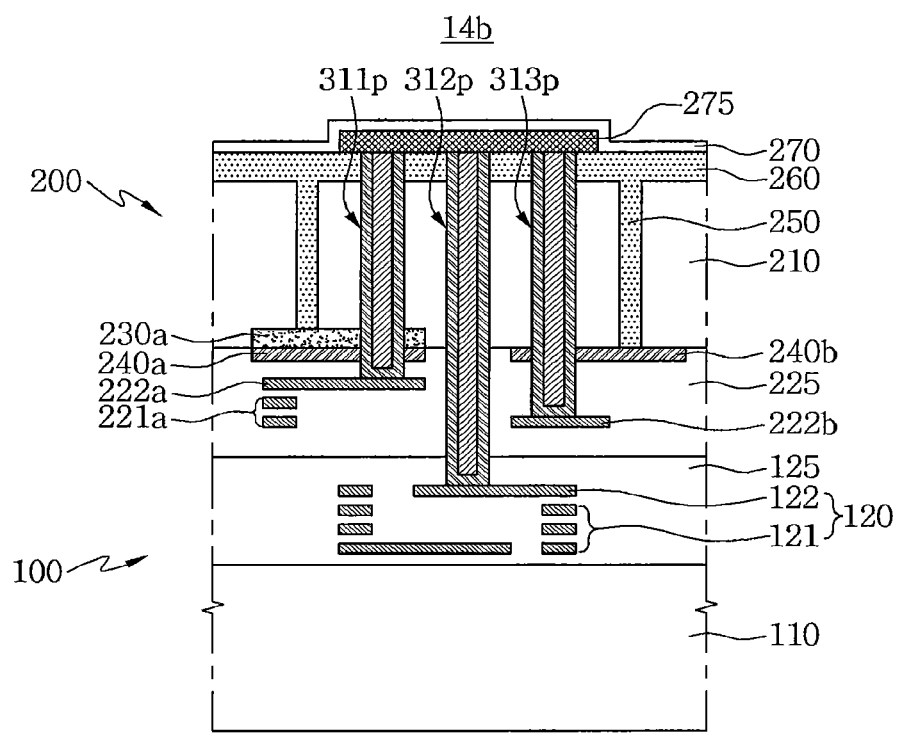
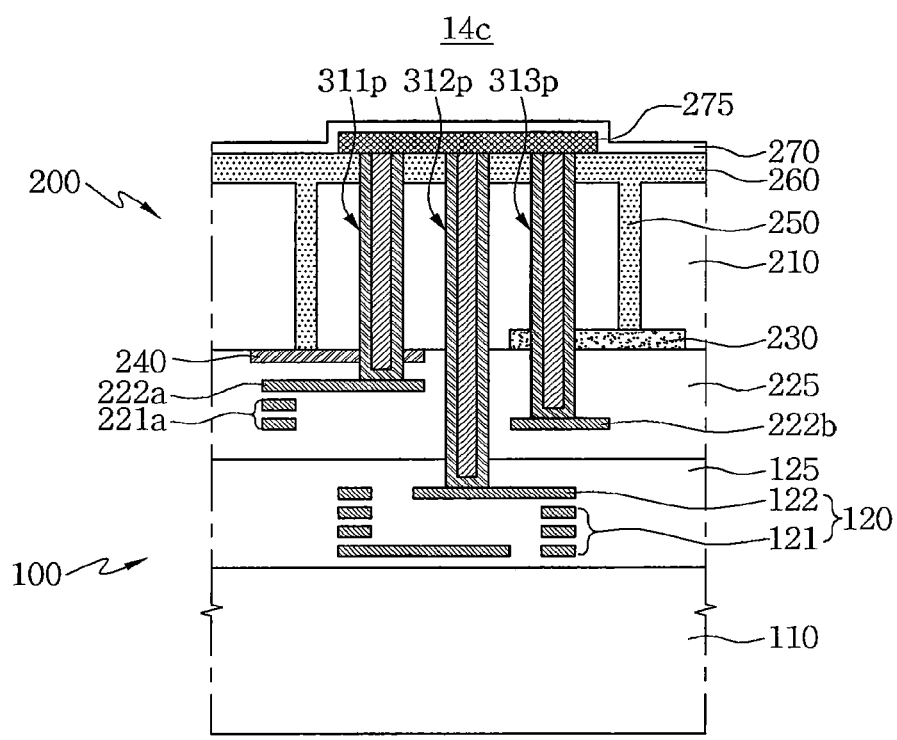

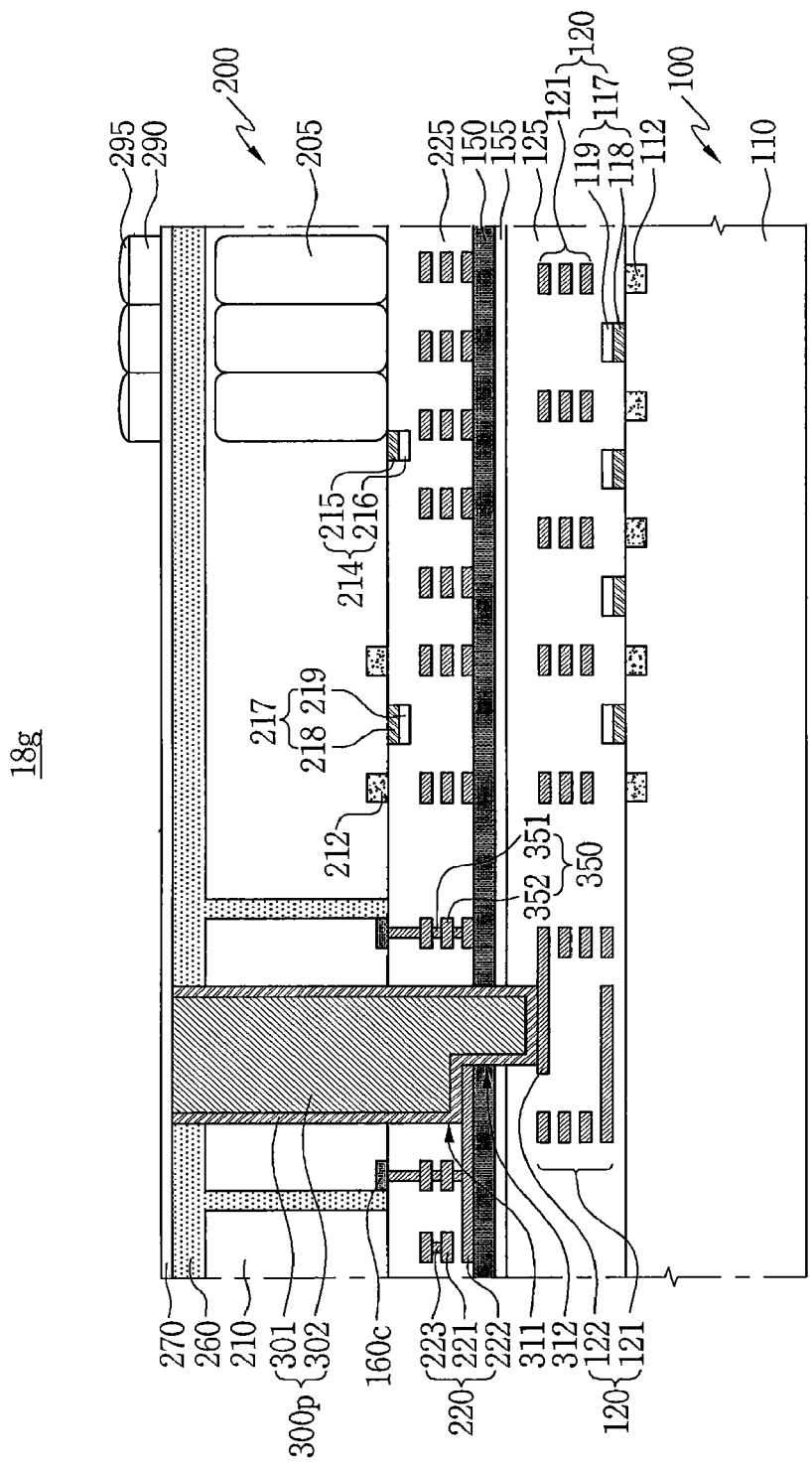

VIA STRUCTURES INCLUDING ETCH-DELAY STRUCTURES AND SEMICONDUCTOR DEVICES HAVING VIA PLUGS

CROSS-REFERENCE TO RELATED APPLICATION

The present application is a continuation application of and claims priority from U.S. patent application Ser. No. 15/625,387, filed Jun. 16, 2017, which is a divisional of and claims priority from U.S. patent application Ser. No. 14/561,854, filed Dec. 5, 2014, now U.S. Pat. No. 9,728,572, and claims priority under 35 U.S.C. § 119 to Korean Patent Application No. 10-2014-0012275, filed Feb. 3, 2014, the disclosure of which is hereby incorporated by reference in its entirety.

BACKGROUND

1. Field

Embodiments of the inventive concepts provide via structures and semiconductor devices having via plugs and methods of manufacturing the same.

2. Description of Related Art

A backside illuminated image sensor may include an upper device and a lower device, which are bonded to each other, and through-silicon vias (TSVs). The TSVs may be formed through a substrate of the upper device and electrically connected to an upper circuit interconnection of the upper device and a lower circuit interconnection of the lower device and externally transmit or receive electric signals. A via plug to be connected to the upper circuit interconnection of the upper device may have a relatively small vertical length, and a via plug to be electrically connected to the lower circuit interconnection of the lower device may have a relatively great vertical length. The two via plugs having different lengths may be formed by performing two photolithography processes and two etching processes.

SUMMARY

Embodiments of the inventive concepts can provide via structures and semiconductor device having via plugs.

Other embodiments of the inventive concepts can provide methods of manufacturing a via structure and semiconductor devices having via plugs.

Other embodiments of the inventive concepts can provide backside illuminated image sensors having the via structure.

Other embodiments of the inventive concepts can provide methods of manufacturing a backside illuminated image sensor having the via structure.

Other embodiments of the inventive concepts can provide camera systems and electronic systems having the backside illuminated image sensors.

The technical objectives of the inventive disclosure are not limited to the above disclosure; other objectives may become apparent to those of ordinary skill in the art based on the following descriptions.

In accordance with an aspect of the inventive concepts, a semiconductor device includes an upper device disposed on a lower device. The lower device includes a lower substrate, a lower plug pad disposed on the lower substrate, and a lower interlayer insulating layer on the lower plug pad. The upper device includes an upper substrate, an etch-delay structure under the upper substrate, an upper plug pad disposed on a bottom surface of the upper substrate and an upper interlayer dielectric layer on the upper plug pad, and a via plug extending through the upper substrate and configured to contact the upper plug pad and the lower plug pad. The via plug includes a first portion configured to contact the upper plug pad and the etch-delay structure, and a second portion configured to contact the lower plug pad.

In accordance with another aspect of the inventive concepts, a semiconductor device includes a lower substrate, a lower plug pad disposed on the lower substrate and a lower interlayer dielectric layer surrounding the lower plug pad, an upper plug pad disposed on the lower interlayer dielectric layer and an upper interlayer dielectric layer surrounding the upper plug pad, an upper substrate disposed on the upper interlayer dielectric layer, an etch-delay structure disposed adjacent to an interface between the upper interlayer dielectric layer and the upper substrate, and a via plug configured to vertically penetrate the upper substrate, the via plug having a first portion in contact with the etch-delay structure and a second portion in contact with the lower plug pad and having a larger vertical length than the first portion.

In accordance with yet other aspects of the inventive concepts, a semiconductor device includes a substrate, a first via plug that extends from a face of the substrate into the substrate, and a second via plug that is spaced apart from the first via plug and extends from the face of the substrate deeper into the substrate than the first via plug. A buried non-conductive layer is provided in the substrate beneath the face and surrounding the first via plug from a plan view, wherein the first via plug extends deeper into the substrate from the face than the buried non-conductive layer and wherein the buried non-conductive layer does not surround the second via plug from a plan view.

In other embodiments, the substrate comprises a lower device and an upper device on the lower device such that an outer face of the upper device defines the face, the buried non-conductive layer is buried in the upper device, the first via plug does not extend into the lower device, and the second via plug extends through the upper device and into the lower device. In still other embodiments, the buried non-conductive layer has higher etch resistance to a given etchant than a portion of the substrate adjacent the buried non-conductive layer. Still other embodiments comprise a third via plug that is spaced apart from the first and second via plugs and extends from the face of the substrate deeper than the first via plug but less deep than the second via plug, wherein the buried non-conductive layer is a first buried non-conductive layer, wherein the device further comprises a second buried non-conductive layer in the substrate beneath the face and surrounding the third via plug from a plan view, and wherein the second buried non-conductive layer does not surround the second via plug from a plan view. In some embodiments, the second buried non-conductive layer also surrounds the first via plug from a plan view.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 1A, 1C, and 1D, 2A through 2C, 3A through 3C, and 4A through 4C are longitudinal sectional views of via structures according to various embodiments of the inventive concepts;

FIGS. 6A through 6C, 7A through 7C, and 8A through 8H are longitudinal sectional views of semiconductor devices according to various embodiments of the inventive concepts;

DETAILED DESCRIPTION OF THE EMBODIMENTS

Figure 1A:
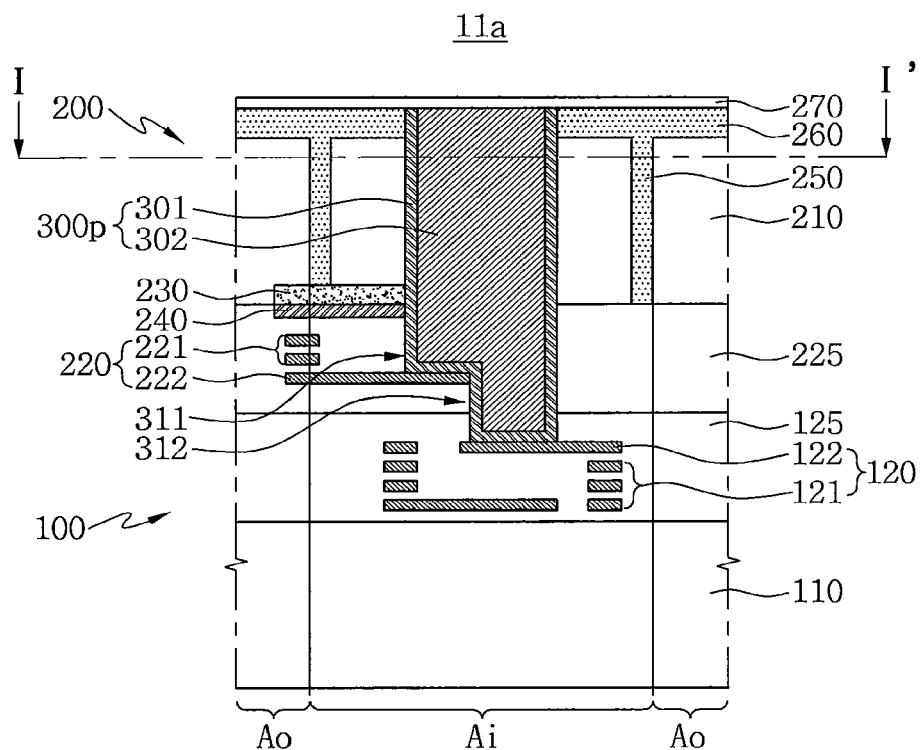

The inventive concepts will now be described more fully hereinafter with reference to the accompanying drawings, in which embodiments of the inventive concepts are shown. This inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art.

The terminology used herein is for the purpose of describing particular embodiments only and is not intended to be limiting the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the inventive concepts are described herein with reference to cross-section and/or plan illustrations that are schematic illustrations of idealized embodiments of the inventive concepts. As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concepts.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

In the specification, "via plugs" may refer to a through-silicon via (TSV) passing through a silicon wafer (or substrate) and silicon oxide (that is on the substrate).

Figure 1B:
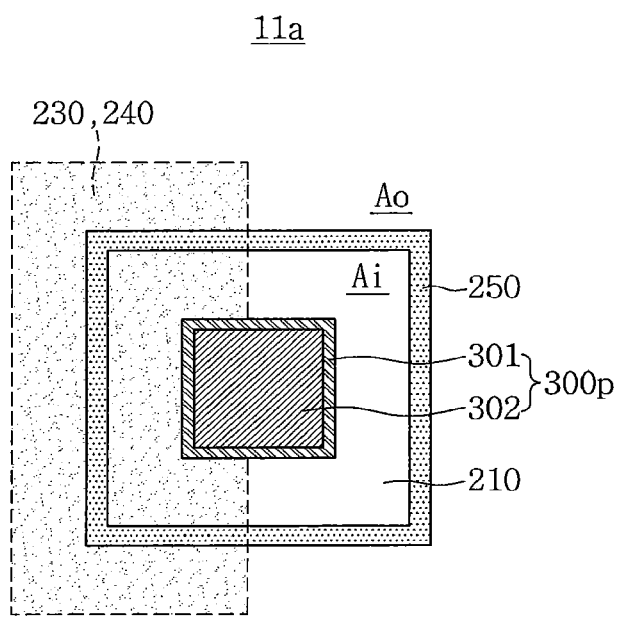
FIG. 1B is a cross-sectional view taken along line I-I' of FIG. 1A.

FIGS. 1A, 1C, 1D, 2A through 2C, 3A through 3C, and 4A through 4C are longitudinal sectional views of via structures according to various embodiments of the inventive concepts and FIG. 1B is a cross-sectional view taken along line I-I' of FIG. 1A.

Referring to FIG. 1A, a via structure 11a according to embodiments of the inventive concepts may include a lower device 100 and an upper device 200 stacked and disposed on the lower device 100. The lower device 100 and the upper device 200 may be bonded to each other.

The lower device 100 may include a lower substrate 110 and a lower circuit 120 on the lower substrate 110.

The lower circuit 120 may include a lower interconnection 121 and a lower interlayer dielectric layer 125 configured to surround, and in some embodiments to cover, the lower interconnection 121.

The lower circuit 120 may further include a lower plug pad 122.

The lower substrate 110 may include a bulk single-crystalline silicon wafer, a silicon-on-insulator (SOI) wafer, a compound semiconductor wafer including, for example, a silicon-germanium (SiGe) and/or a wafer on which a silicon epitaxial layer is grown.

The lower interconnection 121 and the lower plug pad 122 may include a metal such as tungsten, aluminum and/or copper, a metal silicide such as tungsten silicide and/or titanium silicide, a metal compound such as tungsten nitride and/or titanium nitride, and/or a doped polycrystalline silicon (poly-Si).

The lower interlayer dielectric layer 125 may include an insulator, such as silicon oxide.

The upper device 200 may include a first etch-delay structure 230 and a floating insulating layer 250 in the upper substrate 210, a second etch-delay structure 240 and an upper circuit 220 on a bottom surface of the upper substrate 210, a capping insulating layer 260 and a passivation layer 270 on a top surface of the upper substrate 210, and a via plug 300p extending through the upper substrate 210.

The upper circuit 220 may include an upper interconnection 221 and an upper interlayer dielectric layer 225 configured to surround, and in some embodiments to cover, the upper interconnection 221.

The upper circuit 220 may further include an upper plug pad 222.

The upper substrate 210 may include a bulk single-crystalline silicon wafer, an SOI wafer, a compound semiconductor wafer formed of, for example, SiGe and/or a wafer on which a silicon epitaxial layer is grown.

The first etch-delay structure 230 may be buried in the upper substrate 210. The first etch-delay structure 230 may include a material (e.g., silicon oxide) different from the upper substrate 210 and having a higher etch resistance to a given etchant than a portion of the upper substrate 210 adjacent the first etch-delay structure 230. A silicon nitride layer may be interposed at an interface between the first etch-delay structure 230 and the upper substrate 210.

The floating insulating layer 250 may penetrate the upper substrate 210 to be in contact with the first etch-delay structure 230 and/or the upper interlayer dielectric layer 225. The floating insulating layer 250 may include silicon oxide. The floating insulating layer 250 may have a layout having a circular or polygonal closed-curve shape in a top view. Accordingly, the via plug 300p may be electrically floated in the upper substrate 210.

The second etch-delay structure 240 may be on the upper substrate 210 and include thereon, and in some embodiments may be covered with, the upper interlayer dielectric layer 225. The second etch-delay structure 240 may include a material (e.g., silicon) different from the upper interlayer dielectric layer 225 and having a higher etch resistance to a given etchant than a portion of the substrate 210 (e.g., a portion of the upper interlayer dielectric layer 225) adjacent thereto. The upper interlayer dielectric layer 225 may include silicon oxide like the lower interlayer dielectric layer 125.

The upper interconnection 221 and the upper plug pad 222 may include a metal such as tungsten, aluminum and/or copper, a metal silicide such as tungsten silicide and/or titanium silicide, a metal compound such as tungsten nitride and/or titanium nitride, or doped poly-Si.

The capping insulating layer 260 may include the same material as the floating insulating layer 250 to be materially in continuity with the floating insulating layer 250. For example, the capping insulating layer 260 may include silicon oxide.

The via plug 300p may include a first portion 311 having a relatively small vertical length and a second portion 312 having a relatively great vertical length. An ending of the first portion 311 may be aligned with and in contact with the upper plug pad 222, while an ending of the second portion 312 may be aligned with and in contact with the lower plug pad 122. The first portion 311 may be in contact with the first and second etch-delay structures 230 and 240. The ending of the first portion 311 may be disposed in the upper interlayer dielectric layer 225, and the ending of the second portion 312 may be disposed in the lower interlayer dielectric layer 125.

The via plug 300p may include a via barrier layer 301 and a via core 302. The via barrier layer 301 may conformally cover side and bottom surfaces of the via core 302. The via barrier layer 301 may include titanium (Ti), titanium nitride (TiN), tantalum (Ta), tantalum nitride (TaN), titanium tungsten (TiW) and/or various other barrier metals. The via core 302 may include a metal, such as tungsten, aluminum, cobalt, nickel and/or copper, and/or a metal silicide.

The passivation layer 270 may be on top surfaces of the via plug 300p and the capping insulating layer 260. The passivation layer 270 may include silicon nitride.

The via structure 11a according to the embodiment of the inventive concepts may include the via plug 300p, which may be in contact with both the plug pads 122 and 222 disposed at different levels. The via plug 300p may include the first portion 311, which may extend relatively shallowly and have the ending disposed in the upper interlayer dielectric layer 225, and the second portion 312, which may extend relatively deeply and have the ending disposed in the lower interlayer dielectric layer 125. The first portion 311 of the via plug 300p, of which the ending is disposed in the upper interlayer dielectric layer 225, may fill a via hole formed by penetrating or removing the etch-delay structures 230 and 240. Accordingly, the ending of the first portion 311 may be disposed at a higher level than the ending of the second portion 312. That is, the first portion 311 of the via plug 300p may have a smaller vertical length than the second portion 312 thereof.

Referring to FIG. 1B, the via structure 11a according to the embodiment of the inventive concepts may include the via plug 300p and a floating insulating layer 250 surrounding the via plug 300p in four directions. The floating insulating layer 250 may electrically isolate the via plug 300p from an outer region Ao of the substrate 210. The via plug 300p may be electrically connected to an inner region Ai of the substrate 210. The etch-delay structures 230 and 240 may partially overlap the via plug 300p and the floating insulating layer 250. The etch-delay structures 230 and 240 may overlap the inner region Ai and the outer region Ao of the substrate 210. The inventive concepts shown in FIG. 1B may be applied to various other embodiments.

Referring to FIG. 1B, as compared with the via structure 11a shown in FIG. 1A, the second etch-delay structure 240 may be omitted in a via structure 11b according to the embodiment of the inventive concepts.

Figure 1C:
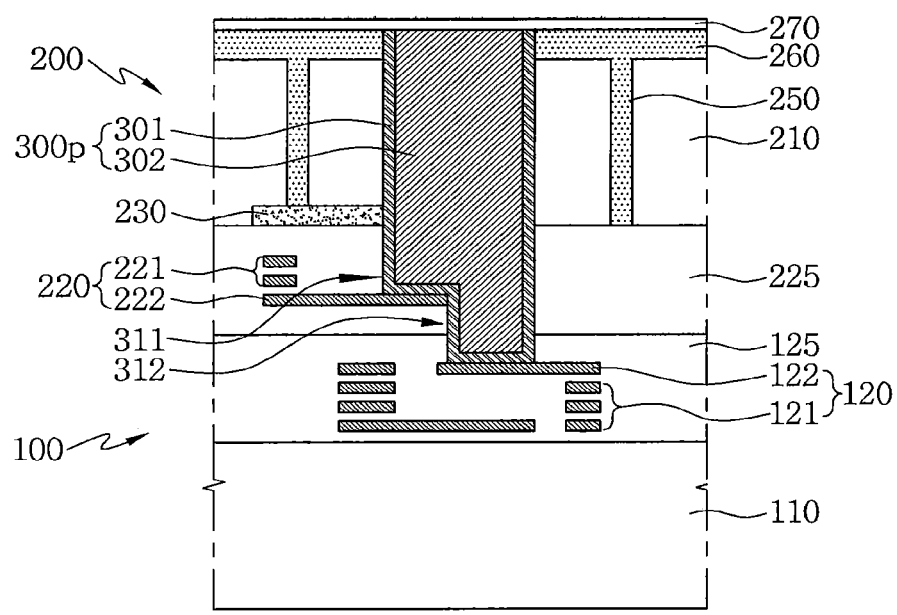
Figure 1D:
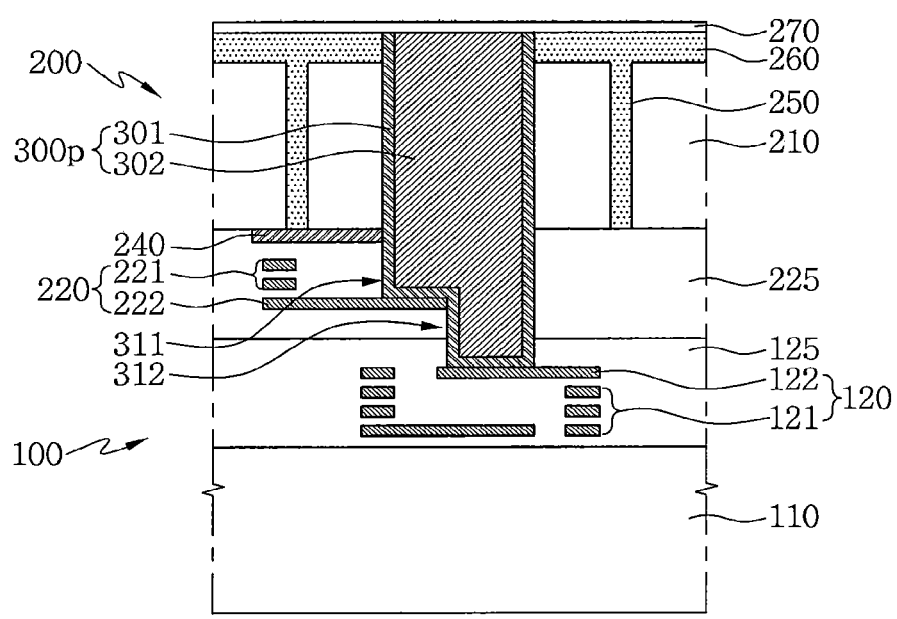

Referring to FIG. 1C, as compared with the via structure 11a shown in FIG. 1A, the first etch-delay structure 230 may be omitted in a via structure 11c according to the embodiment of the inventive concepts.

Figure 2A:
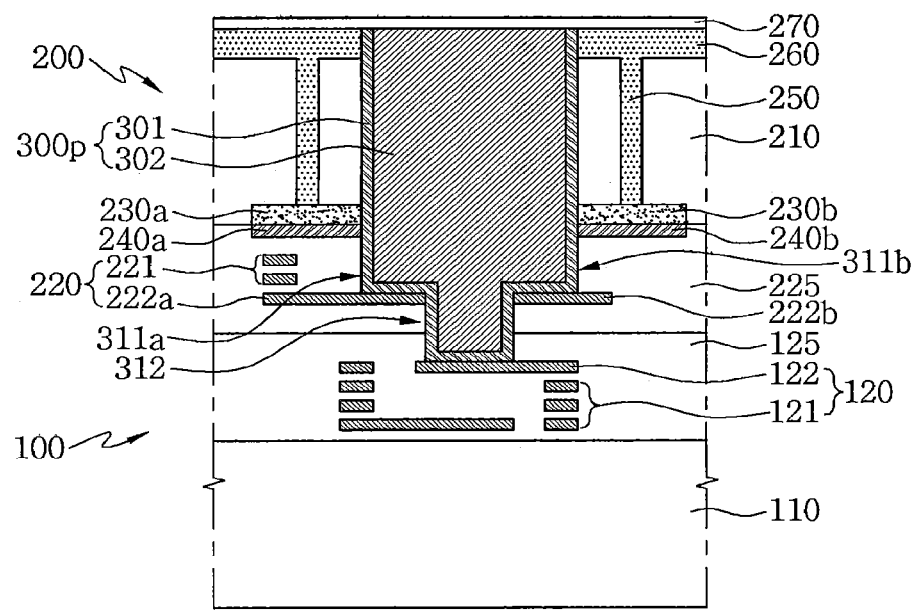

Referring to FIG. 2A, a via structure 12a according to the embodiment of the inventive concepts may include at least two upper plug pads 222a and 222b. Accordingly, the via plug 300p may include at least two first portions 311a and 311b having a relatively small length and a second portion 312 having a relatively great length. Also, the via plug 300p may include at least two first etch-delay structures 230a and 230b and at least two second etch-delay structures 240a and 240b.

Figure 2B:
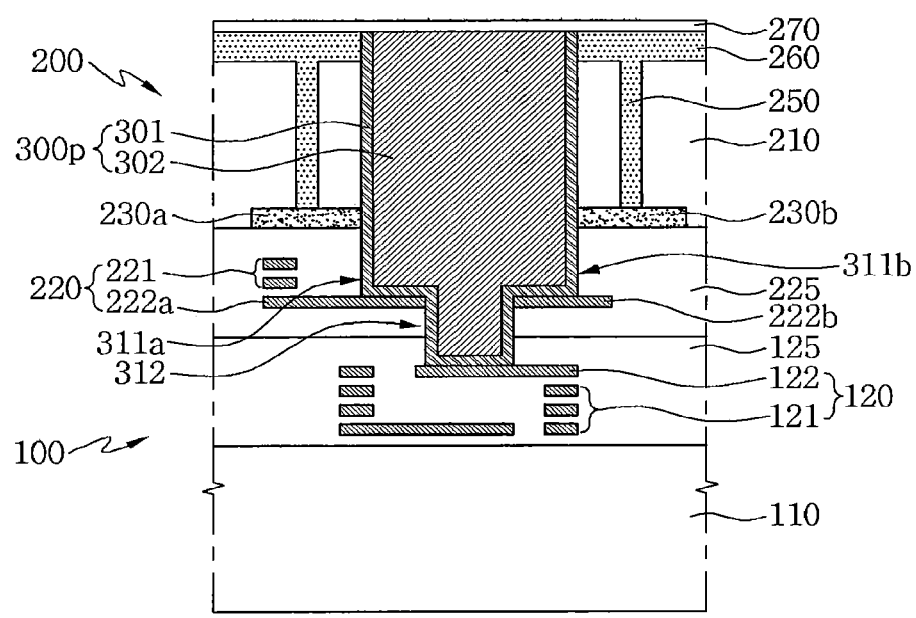

Referring to FIG. 2B, as compared with the via structure 12a shown in FIG. 2A, the second etch-delay structures 240a and 240b may be omitted in a via structure 12b according to the embodiment of the inventive concepts.

Figure 2C:
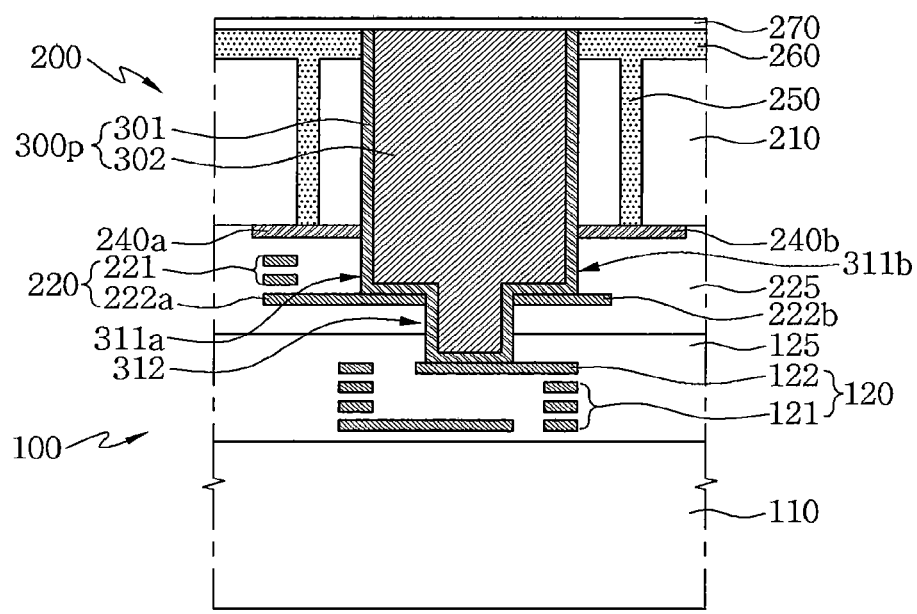

Referring to FIG. 2C, as compared with the via structure 12c shown in FIG. 2A, the first etch-delay structures 230a and 230b may be omitted in a via structure 12c according to the embodiment of the inventive concepts.

Figure 3A:
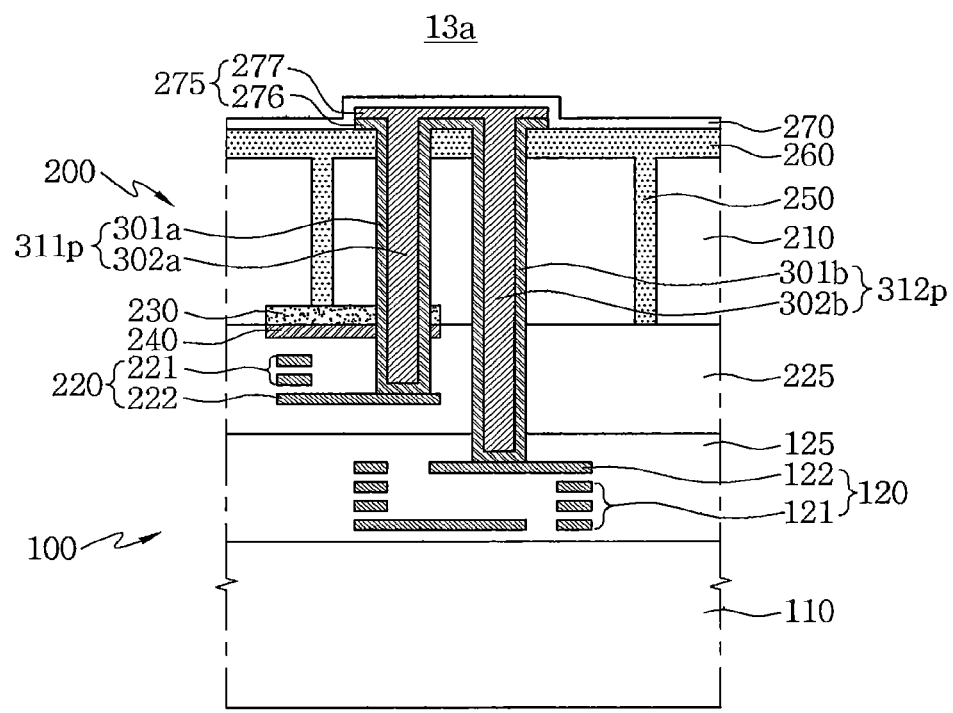

Referring to FIG. 3A, a via structure 13a according to the embodiment of the inventive concepts may include a first via plug 311p having a relatively small length, a second via plug 312p having a relatively great length, and a plug connector 275 configured to electrically connect the first and second via plugs 311p and 312p.

The first via plug 311p and the second via plug 312p may be physically separated from each other and independently disposed.

The first via plug 311p may penetrate the first and second etch-delay structures 230 and 240 and be electrically connected to and in contact with the upper plug pad 222.

The second via plug 312p may be neither aligned with nor in contact with the first and second etch-delay structures 230 and 240 but electrically connected to and in contact with the lower plug pad 122.

The plug connector 275 may be on the capping insulating layer 260. The plug connector 275 may include a connector barrier layer 276 and a connector core 277, which may be materially in continuity with the first and second via plugs 311p and 312p.

Figure 3B:
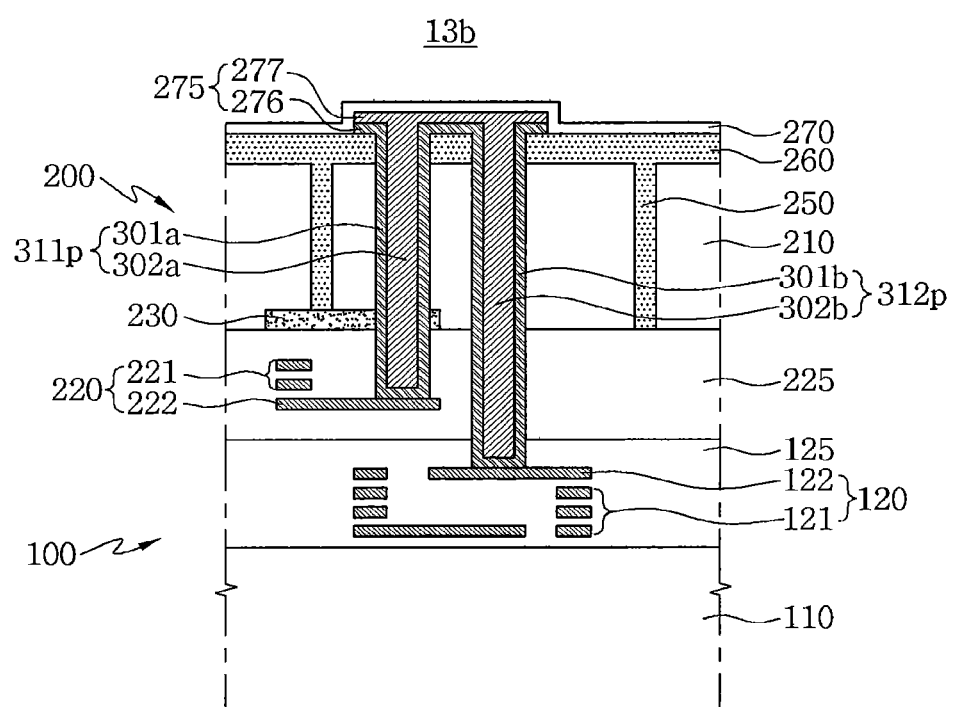

Referring to FIG. 3B, as compared with the via structure 13a shown in FIG. 3A, the second etch-delay structure 240 may be omitted in a via structure 13b according to the embodiment of the inventive concepts.

Figure 3C:
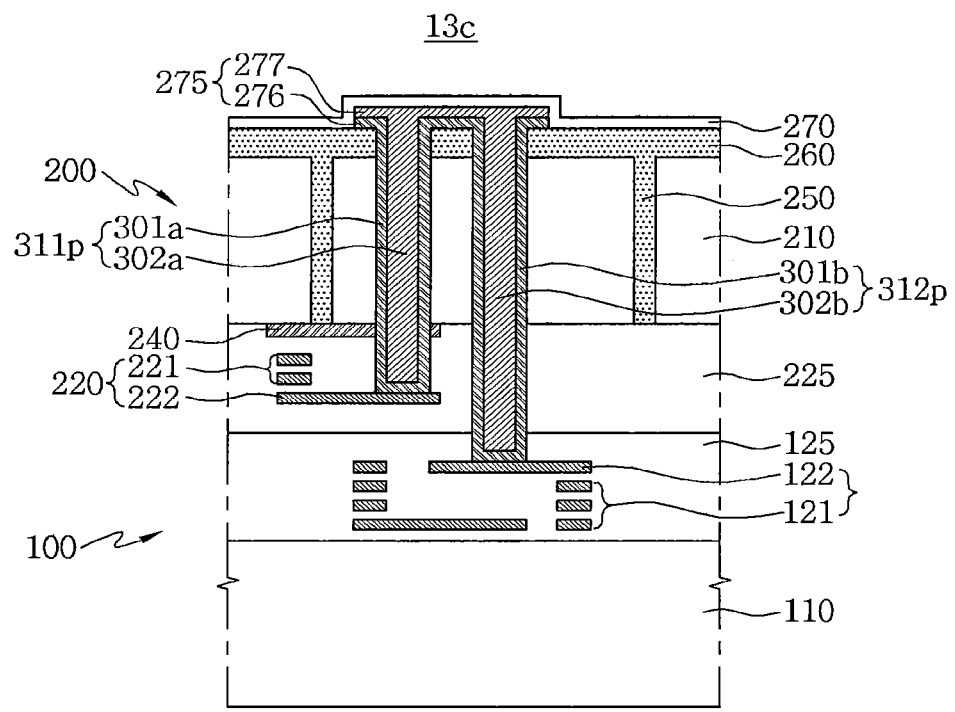

Referring to FIG. 3C, as compared with the via structure 13b shown in FIG. 3A, the first etch-delay structure 230 may be omitted in a via structure 13c according to the embodiment of the inventive concepts.

FIGS. 3A-3C also illustrate other embodiments of the inventive concepts, wherein a semiconductor device includes a substrate, which may be embodied by a combination of the lower device 100 and the upper device 200; a first via plug 311p that extends from a face of the substrate into the substrate and a second via plug 312p that is spaced apart from the first via plug 311p and extends from the face of the substrate deeper into the substrate than the first via plug 311p. The first and/or second etch-delay structures 230 and/or 240 may provide an embodiment of a buried non-conductive layer, i.e., a buried conductor and/or semiconductor layer in the substrate beneath the face and surrounding the first via plug 311p from the plan view. The first via plug 311p extends deeper into the substrate from the face than the buried non-conductive layer and the buried non-conductive layer does not surround the second via plug 312p from a plan view.

FIGS. 3A-3C also illustrate various embodiments of the inventive concepts, wherein the substrate comprises a lower device 100 and an upper device 200 on the lower device, such that an outer face of the upper device 200 defines the face. The buried non-conductive layer is buried in the upper device 200, the first via plug 311p does not extend into the lower device 100 and the second via plug extends through the upper device 200 and into the lower device 100.

In any of these embodiments, the buried non-conductive layer may have higher etch resistance to a given etchant than a portion of the substrate adjacent the buried non-conductive layer.

Figure 4A:
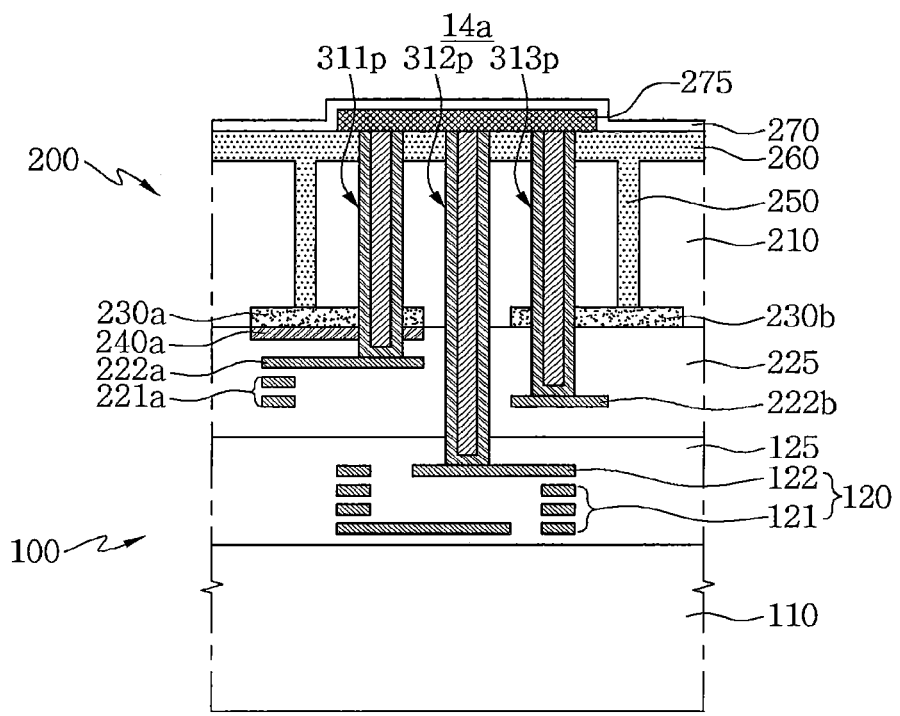

Referring to FIG. 4A, a via structure 14a according to the embodiment of the inventive concepts may include a plurality of via plugs 311p, 312p, and 313p having different lengths. For example, the via structure 14a may include a first via plug 311p having the smallest length, a second via plug 312p having the greatest length, and a third via plug 313p having a middle length. The via structure 14a may include at least three plug pads 122, 222a, and 222b disposed at different levels. For example, the via structure 14a may include at least two upper plug pads 222a and 222b disposed in the upper interlayer dielectric layer 225.

The first via plug 311a may penetrate the first and second etch-delay structures 230a and 240a, while the third via plug 313p may penetrate only the first etch-delay structure 230b.

The plug connector 275 may not be materially in continuity with the first through third via plugs 311p, 312p, and 313p. For example, a chemical mechanical polishing (CMP) process may be performed such that top end portions of the first through third via plugs 311p, 312p, and 313p are coplanar with a top surface of the capping insulating layer 260. Thereafter, the plug connector 275 may be formed using a conductor, such as a metal, to electrically connect the first through third via plugs 311p, 312p, and 313p.

Referring to FIG. 4B, as compared with the via structure 14a shown in FIG. 4A, in a via structure 14b according to the embodiment of the inventive concepts, the third via plug 300p may penetrate only the second etch-delay structure 240b. The third via plug 313p may penetrate only the second etch-delay structure 240b.

Referring to FIG. 4C, in a via structure 14c according to the embodiment of the inventive concepts, a first via plug 311p and a third via plug 300p may penetrate only one of a first etch-delay structure 230 or a second etch-delay structure 240.

FIGS. 4A-4C may also be regarded as illustrating other embodiments of the inventive concepts that further comprise a third via plug 313p that is spaced apart from the first and second via plugs 311p and 312p and extends from the face of the substrate deeper than the first via plug 311p, but less deep than the second via plug 312p. The first etch-delay structure 230a can provide an embodiment of a first buried non-conductive layer and the second etch-delay structure 240b can provide an embodiment of a second buried non-conductive layer in the substrate beneath the face and surrounding the third via plug 313p from a plan view. As illustrated, the second buried non-conductive layer does not surround the second via plug 312p from a plan view. However, in some embodiments, as illustrated for example in FIG. 4B, the second buried non-conductive layer also surrounds the first via plug 311p from a plan view.

FIGS. 5A through 5H are longitudinal sectional views of via structures according to various embodiments of the inventive concepts.

Referring to FIGS. 5A through 5H, each of via structures 15a through 15h may further include a frame-shaped dam pattern 350. The dam pattern 350 may include a plurality of fame-shaped fence patterns 351 and a plurality of frame-shaped panel patterns 352.

The fence patterns 351 and the panel patterns 352 may be alternately stacked. The fence patterns 351 and the panel patterns 352 may be compatible with the upper circuit 220. For example, the fence patterns 351 may be at the same level as an upper via plug 223 and include the same material as the upper via plug 223. The panel patterns 352 may be at the same level as an upper interconnection 221 and an upper plug pad 222 and include the same material as the upper interconnection 221 and the upper plug pad 222. The upper via plug 223 may be electrically connected to the upper interconnection 221. The upper plug pad 222 may be used as a portion of the panel pattern 352. That is, the upper plug pad 222 and the lowest panel pattern 352 may be unified to be materially in continuity with each other. The dam pattern 350 may include the same metal as the upper interconnection 221.

The via structure 15a may further include a middle interlayer dielectric layer 150 and a buffer insulating layer 155. The middle interlayer dielectric layer 150 may be under the upper plug 222 and the lowest panel pattern 352. The middle interlayer dielectric layer 150 may include an insulating material (e.g., SiN, SiCN, or SiON) denser than the upper interlayer dielectric layer 225.

The buffer insulating layer 155 may be under the middle interlayer dielectric layer 150. The buffer insulating layer 155 may include silicon oxide.

Referring back to FIGS. 5E through 5H, the via structures 15e through 15h according to various embodiments of the inventive concepts may further include tap patterns 160a through 160d on the top end portions of the dam patterns 350, respectively. The dam pattern 350 may be in direct contact with each of the tap patterns 160a to 160d.

The tap patterns 160a to 160d may include an insulating material denser and harder than the upper interlayer dielectric layer 225. For example, the tap patterns 160 to 160d may include one of SiN, SiCN and/or SiON.

Figure 5A:
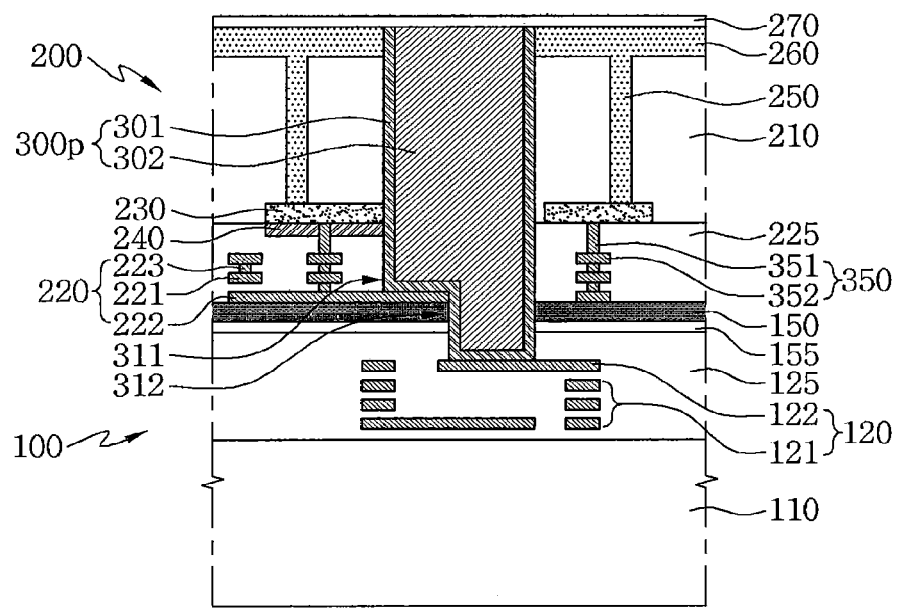
FIGS. 5A through 5H are longitudinal sectional views of via structures according to various embodiments of the inventive concepts.
Figure 5B:
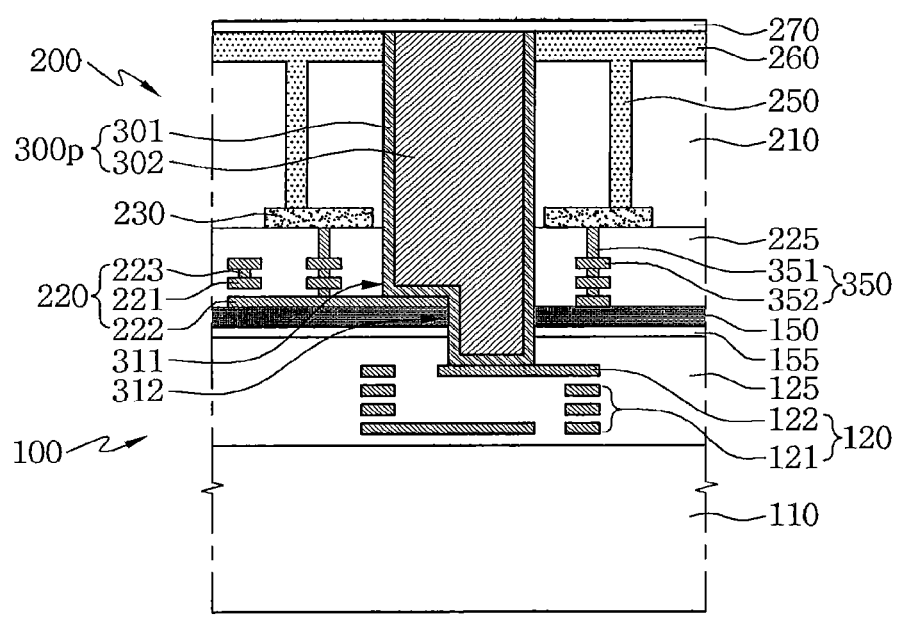
Figure 5C:
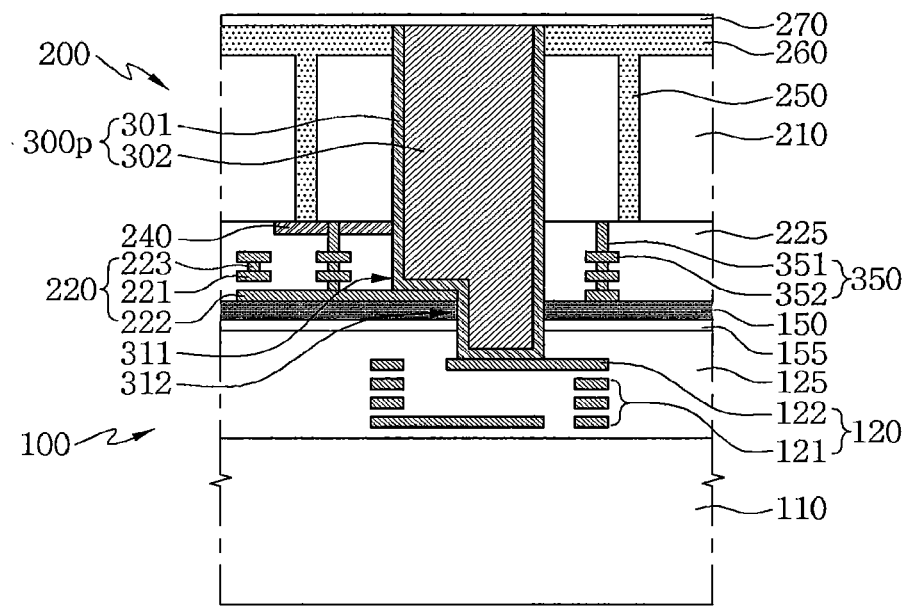
Figure 5D:
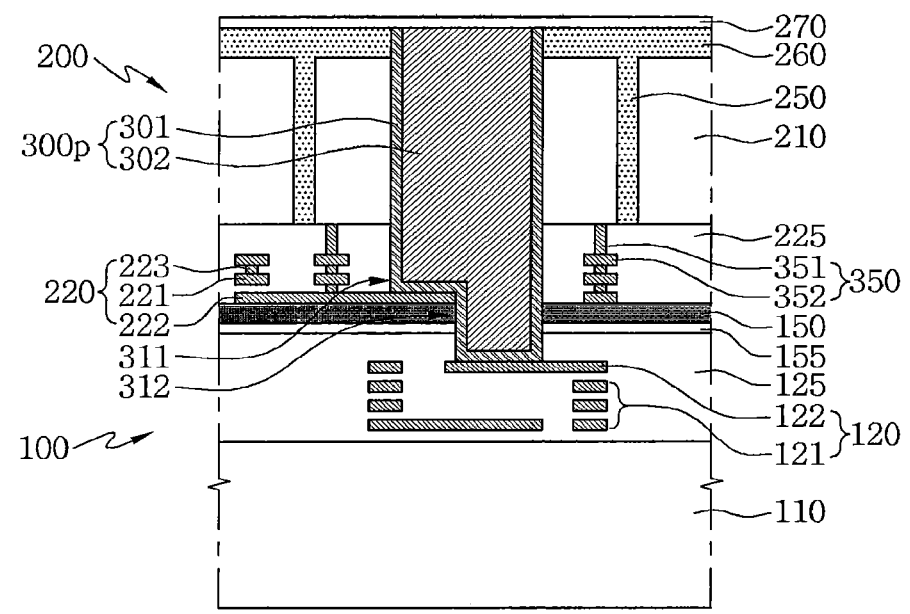
Figure 5E:
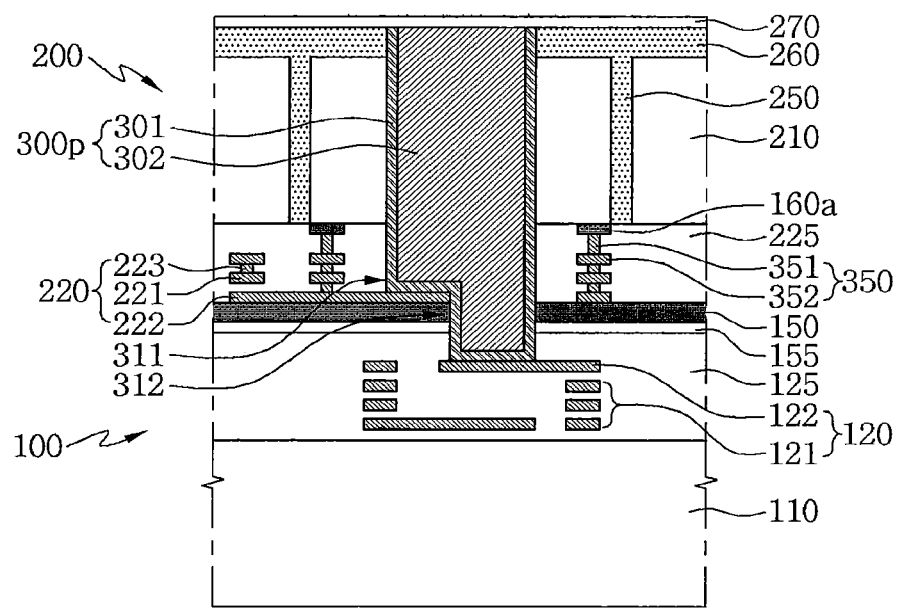

Referring to FIG. 5E, the tap pattern 160a may be on a bottom surface of the upper substrate 210 and on, and in some embodiments covered with, the upper interlayer dielectric layer 225.

Figure 5F:
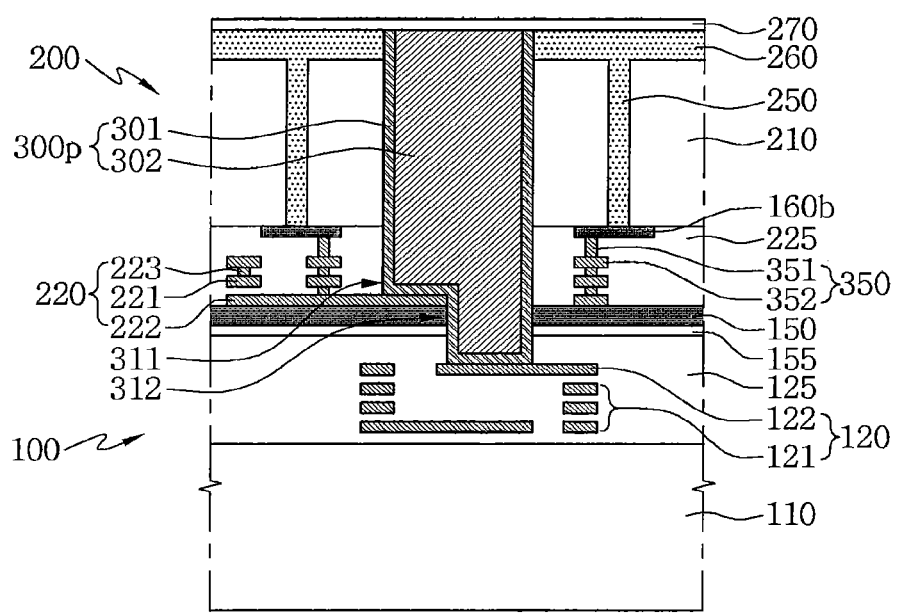

Referring to FIG. 5F, the tap pattern 160b may be on, and in some embodiments covered with, the upper interlayer dielectric layer 225, and on a bottom surface of the upper substrate 210 to be in contact with the floating insulating layer 250.

Figure 5G:
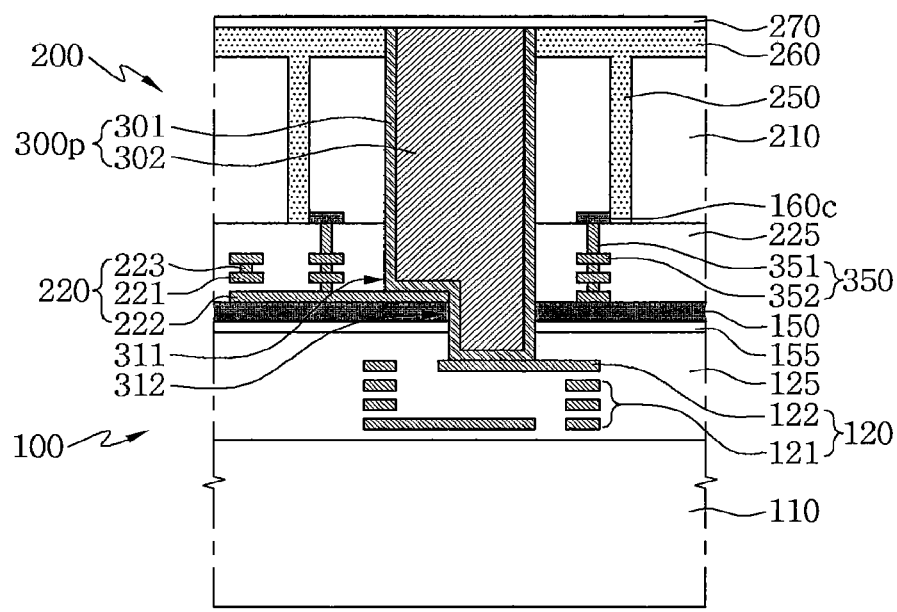

Referring to FIG. 5G, the tap pattern 160c may be buried in the upper substrate 210.

Figure 5H:
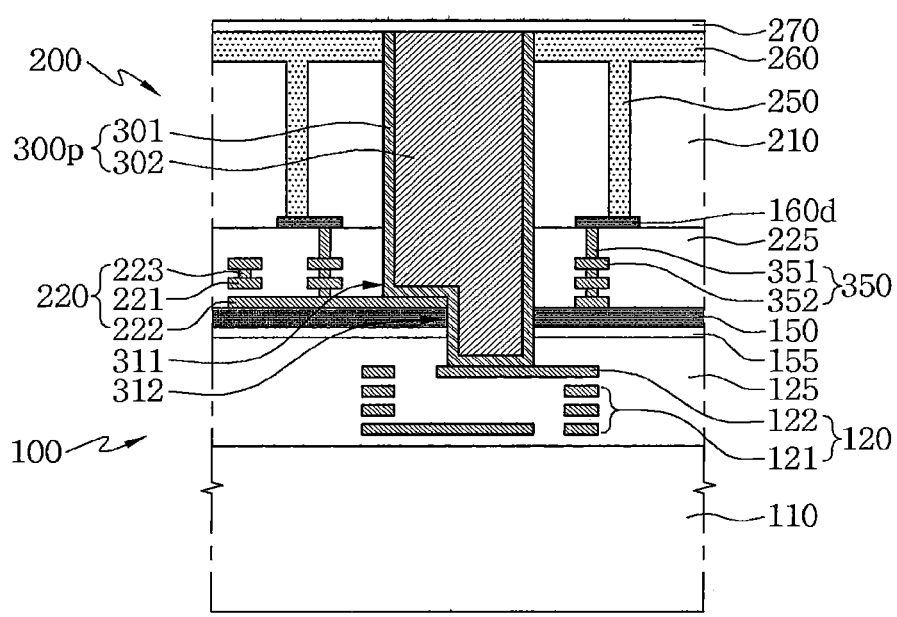

Referring to FIG. 5H, the tap pattern 160d may be buried in the upper substrate 210 to be in contact with the floating insulating layer 250.

The via structures 15a to 15h shown in FIGS. 5A through 5H, according to various embodiments of the inventive concepts, may be variously combined with the via structures 11a to 14c shown in FIGS. 1A through 4C, according to various embodiments of the inventive concepts.

Figure 5I:
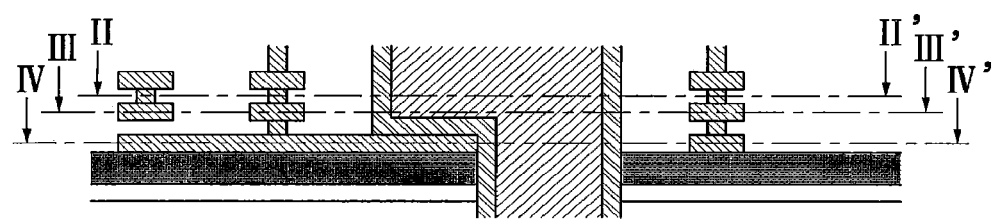
FIG. 5I is an enlarged longitudinal sectional view of a via plug and a dam pattern.
Figure 5J:
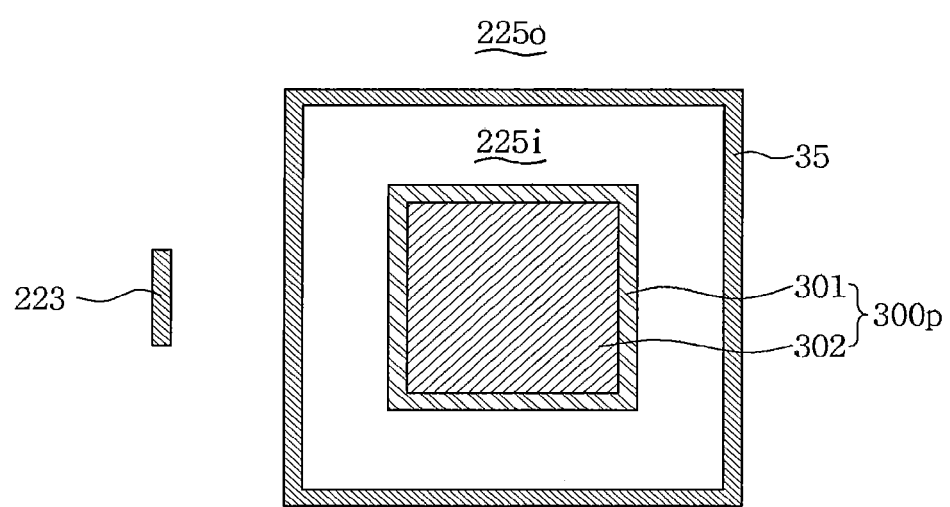
FIGS. 5J through 5L are respectively cross-sectional views taken along lines II-II', III-III' and IV-IV' of FIG. 5I.
Figure 5K:
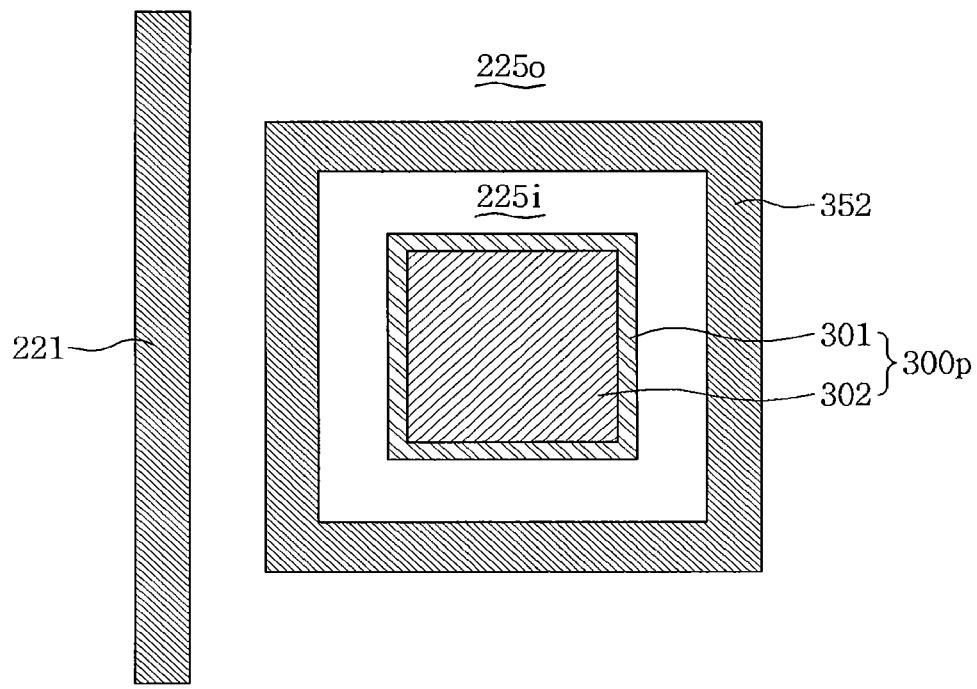
Figure 5L:
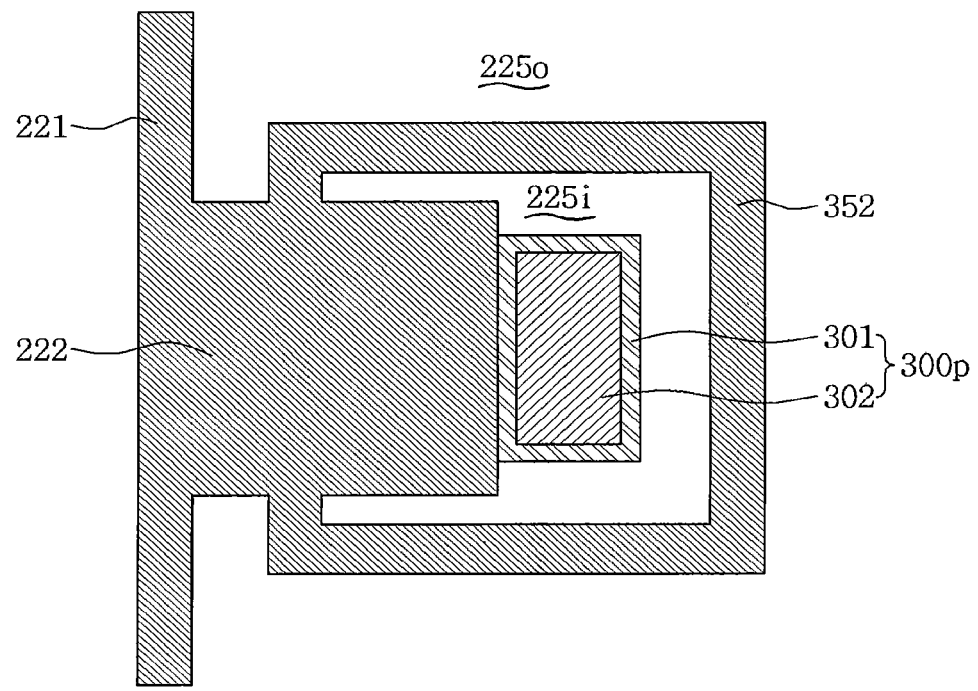

FIG. 5I is a detailed enlarged longitudinal sectional view of the via plug 300p and the dam pattern 350, and FIGS. 5J through 5L are cross-sectional views taken along lines II-II' III-III' and IV-IV' of FIG. 5I.

Referring to FIGS. 5I and 5J, the frame-shaped fence pattern 351 may wholly surround the via plug 300p in four directions. The fence pattern 351 may physically separate the upper interlayer dielectric layer 225 into an external upper interlayer dielectric layer 225o and an internal upper interlayer dielectric layer 225i. The via barrier layer 301 may surround the via core 302. The upper via plug 223 may have an island shape or a bar shape.

Referring to FIGS. 5I and 5K, the frame-shaped panel pattern 352 may wholly surround the via plug 300p in four directions. The panel pattern 352 may also physically separate the upper interlayer dielectric layer 225 into an external upper interlayer dielectric layer 225o and an internal upper interlayer dielectric layer 225i. The upper interconnection 221 may extend in a line shape.

Referring to FIGS. 5I and 5L, the pad-shaped upper plug pad 222 may overlap and be unified with the panel pattern 352. The upper plug pad 222 may overlap and be unified with the upper interconnection 221.

The dam patterns 350 according to various embodiments of the inventive concepts may physically separate the via plugs 300p and the internal upper interlayer dielectric layer 225i from the external upper interlayer dielectric layer 225o. Accordingly, hydrogen ($H_2$), oxygen ($O_2$) and/or other reactive materials generated from the external upper interlayer dielectric layer 225o may be reduced prevented from affecting the via plug 300p.

FIGS. 6A through 6F, 7A through 7C, and 8A through 8H are longitudinal sectional views of semiconductor devices according to various embodiments of the inventive concepts.

Figure 6A:
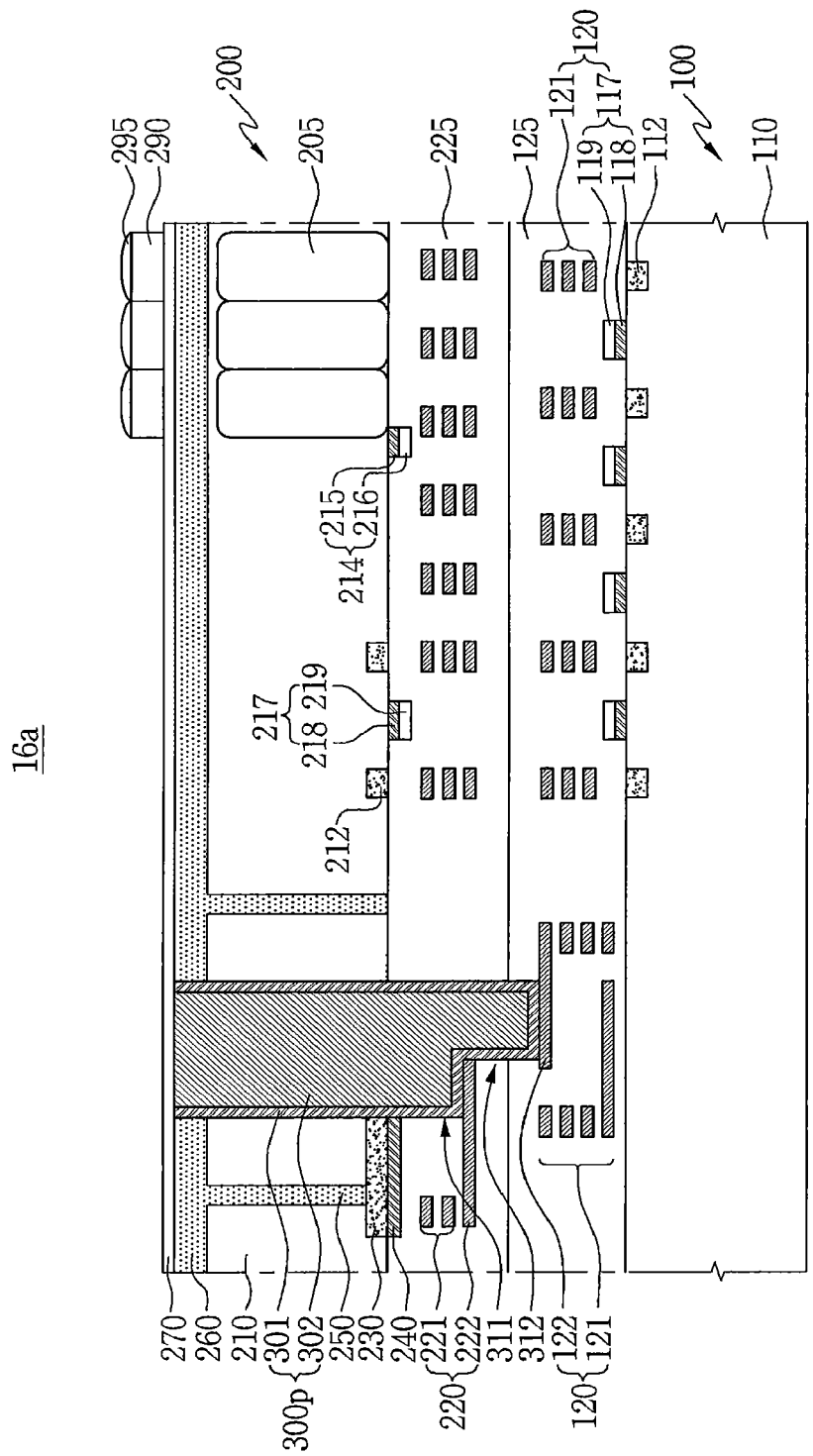

Referring to FIG. 6A, a semiconductor device 16a according to the embodiment of the inventive concepts, for example, a backside illuminated image sensor, may include a lower device 100 and an upper device 200 bonded to the lower device 100.

The lower device 100 may include a lower substrate 110 and a lower circuit 120 on the lower substrate 110.

The lower circuit 120 may include a lower gate structure 117 and a lower interconnection 121. The semiconductor device 16a may further include a lower interlayer dielectric layer 125 configured to surround, and in some embodiments to cover, the lower gate structure 117 and the lower interconnection 121.

The lower interconnection 121 may include a lower plug pad 122.

A lower device isolation region 112 may be in the lower substrate 110. For example, the lower device isolation region 112 may be buried in the lower substrate 110 like a shallow trench isolation (STI).

The lower substrate 110 may include a bulk single-crystalline silicon wafer, a SOI wafer, a compound semiconductor wafer and/or a wafer on which a silicon epitaxial layer is grown.

The lower gate structure 117 may include a lower gate electrode 118 and a lower gate capping layer 119. The lower gate electrode 118 may include poly-Si, a metal silicide and/or a conductor such as a metal. The lower gate capping layer 119 may include an insulating material such as silicon nitride.

The lower interconnection 121 and the lower plug pad 122 may include a conductor, such as a metal, a metal silicide and/or doped poly-Si.

The lower interlayer dielectric layer 125 may include an insulator such as silicon oxide.

The upper device 200 may include a first etch-delay structure 230, a floating insulating layer 250, and a photodiode 205, which may be in an upper substrate 210, a second etch-delay structure 240 and an upper circuit 220, which may be on a bottom surface of the upper substrate 210, a capping insulating layer 260, a passivation layer 270, a color filter 290, and a microlens 295, which may be on a top surface of the upper substrate 210, a via plug 300p extending through the upper substrate 210.

The upper circuit 220 may include an upper gate structure 217 and an upper interconnection 221. The upper device 200 may include an upper interlayer dielectric layer 225 configured to surround, and in some embodiments to cover, the upper gate structure 217 and the upper interconnection 221.

The upper interconnection 221 may include an upper plug pad 222.

An upper device isolation region 212 may be in the upper substrate 210. For example, the upper device isolation region 212 would be understood with reference to a STI technique.

The upper substrate 210 may include a bulk single-crystalline silicon wafer, a SOI wafer, a compound semiconductor wafer and/or a wafer on which a silicon epitaxial layer is grown.

The upper gate structure 217 may include an upper gate electrode 218 and an upper gate capping layer 219. The upper gate electrode 218 may include poly-Si, a metal silicide and/or a conductor such as a metal. The upper gate capping layer 219 may include an insulating material such as silicon nitride.

The upper interconnection 221 may include a conductor, such as a metal, a metal silicide and/or doped poly-Si.

The upper interlayer dielectric layer 225 may include an insulator such as silicon oxide.

The upper device 200 may include a transmission gate structure 214. The transmission gate structure 214 may include a transmission gate electrode 215 and a transmission gate capping layer 216. The transmission gate structure 214 may be disposed adjacent to the photodiode 205.

The transmission gate electrode 215, the upper gate electrode 218, and the second etch-delay structure 240 may include the same material formed at the same level.

The via plug 300 may include a first portion 311 having a relatively small length and a second portion 312 having a relatively great length. The first portion 311 may be aligned with and in contact with the upper plug pad 222, and the second portion 312 may be aligned with and in contact with the lower plug pad 122. The first portion 311 may be in contact with the first and second etch-delay structures 230 and 240. An ending of the first portion 311 may be disposed in the upper interlayer dielectric layer 225, and an ending of the second portion 312 may be disposed in the lower interlayer dielectric layer 125.

The via plug 300p may include a via barrier layer 301 and a via core 302. The via barrier layer 301 may conformally surround side and bottom surfaces of the via core 302.

The passivation layer 270 may be on top surfaces of the via plug 300p and the capping insulating layer 260. The passivation layer 270 may include silicon nitride so that the passivation layer 270 can be disposed on the photodiode 205 and used as an anti-reflective layer.

The color filter 290 and the microlens 295 may be aligned with the photodiode 205.

Figure 6B:
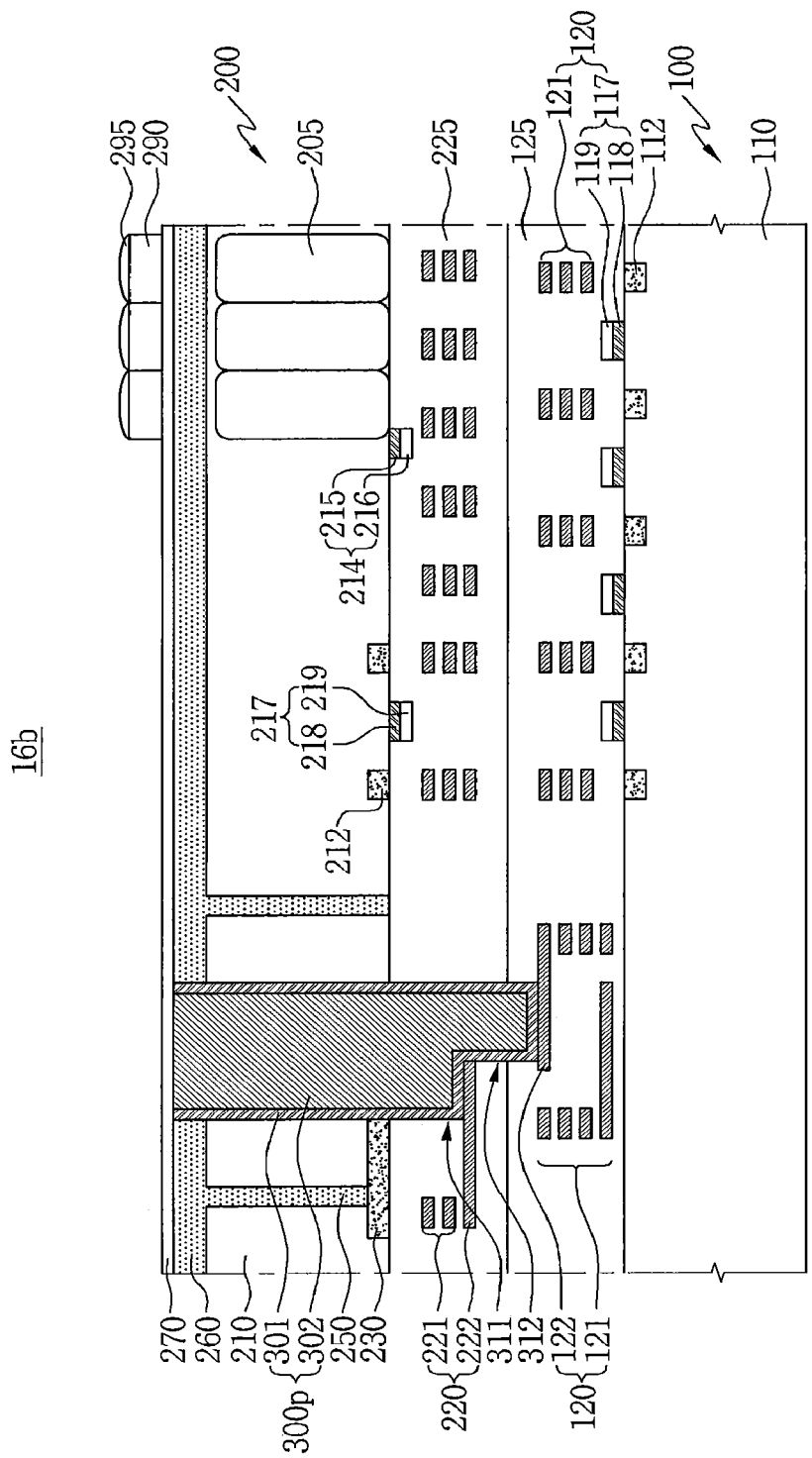

Referring to FIG. 6B, as compared with the semiconductor device 16a shown in FIG. 6A, the second etch-delay structure 240 may be omitted in a semiconductor device 16b according to embodiments of the inventive concepts.

Figure 6C:
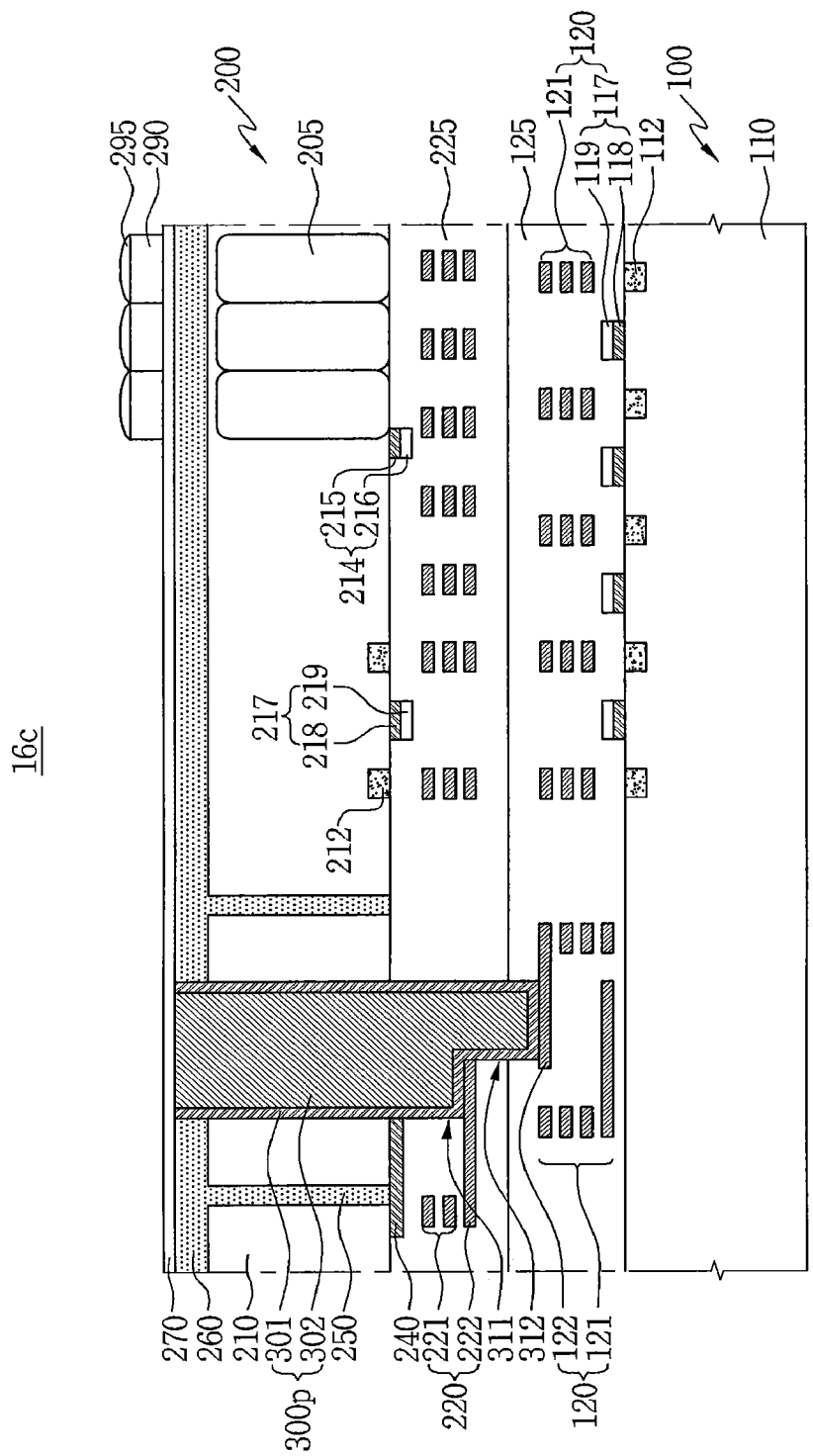

Referring to FIG. 6C, as compared with the semiconductor device 16a shown in FIG. 6A, the first etch-delay structure 230 may be omitted in a semiconductor device 16c according to embodiments of the inventive concepts.

Figure 7A:
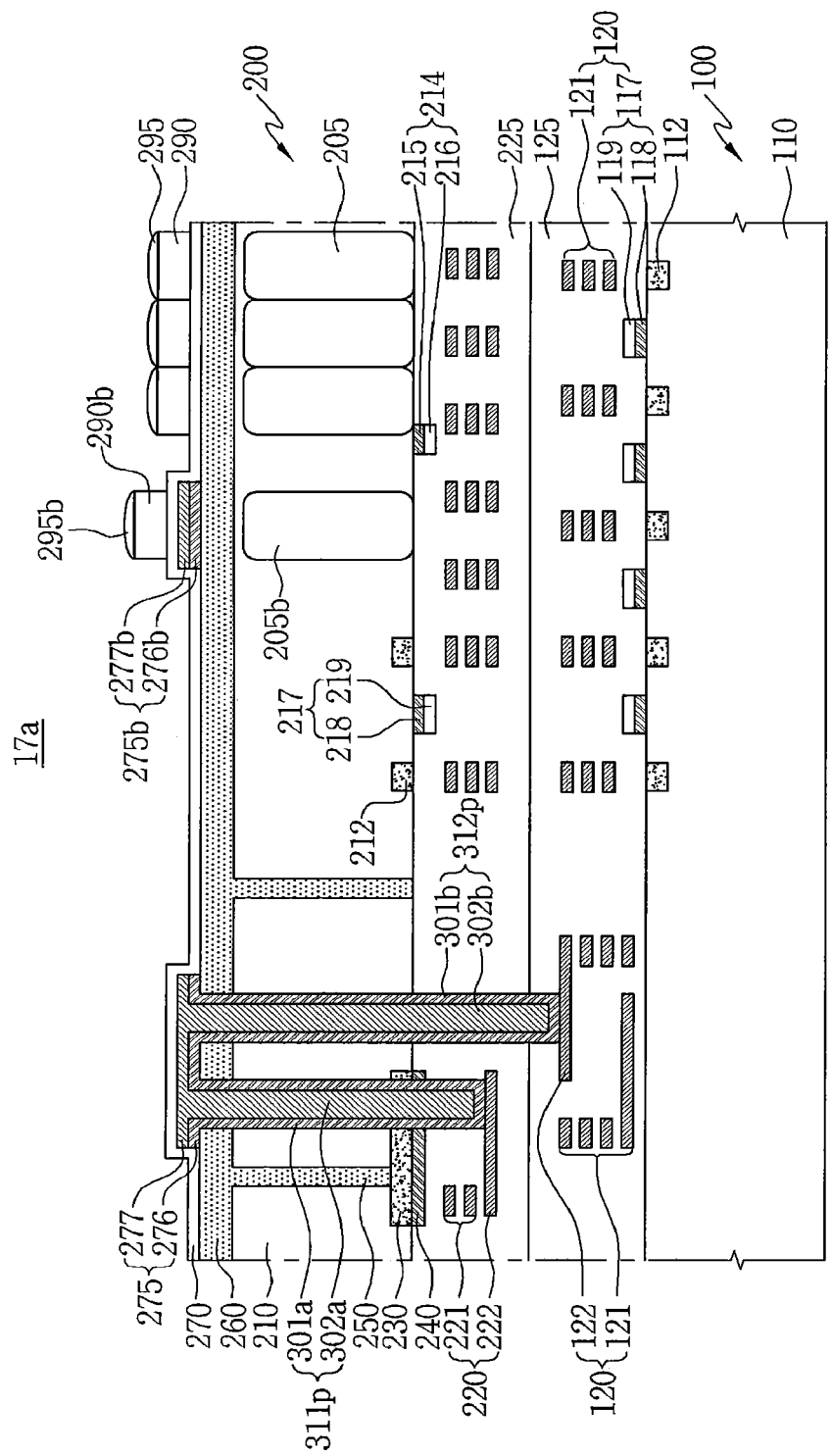

Referring to FIG. 7A, a semiconductor device 17a according to embodiments of the inventive concepts, for example, a backside illuminated image sensor may include a first via plug 311p having a relatively small length, a second via plug 312p having a relatively great length, and a plug connector 275 configured to electrically connect the first and second via plugs 311p and 312p. An upper device 200 may further include a black-level photodiode 205b in the upper substrate 210, a blocking pattern 275b on the capping insulating layer 260 in alignment with the black-level photodiode 205b and covered with the passivation layer 270, and a black-level color filter 290b and a black-level microlens 295b on the passivation layer 270 in alignment with the blocking pattern 275b.

The blocking pattern 275b may include a blocking barrier layer 276b and a blocking core 277b on the capping insulating layer 260. The blocking barrier layer 276b may include the same material as the via barrier layer 301, and the blocking core 277b may include the same material as the via core 302. The blocking pattern 275b may block light so that light cannot be radiated into the black-level photodiode 205b.

Undescribed elements would be understood with reference to FIGS. 3A and 6A.

Figure 7B:
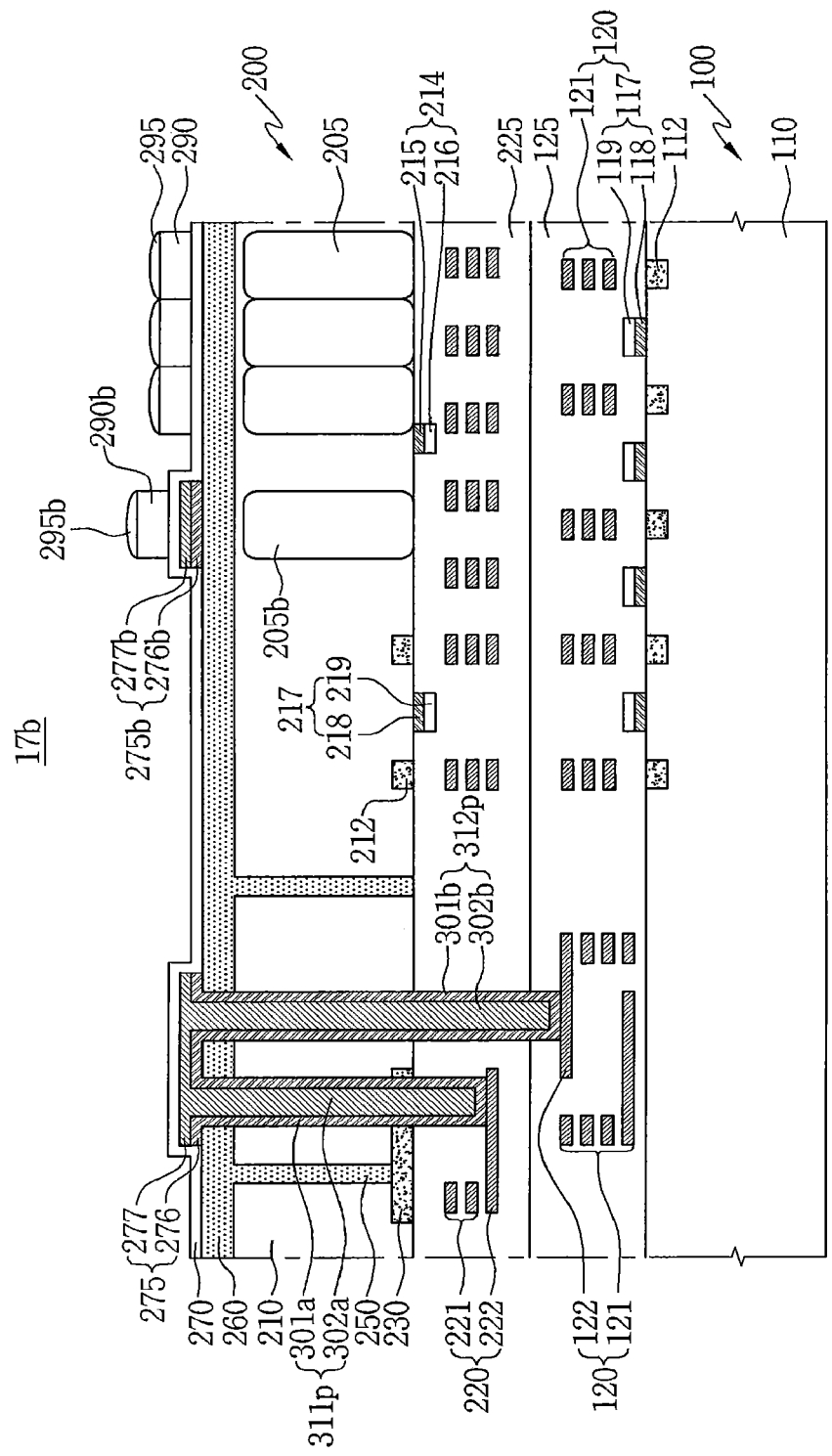

Referring to FIG. 7B, as compared with the semiconductor device 17a shown in FIG. 7A, a second etch-delay structure 240 may be omitted in a semiconductor device 17b according to the embodiment of the inventive concepts.

Figure 7C:
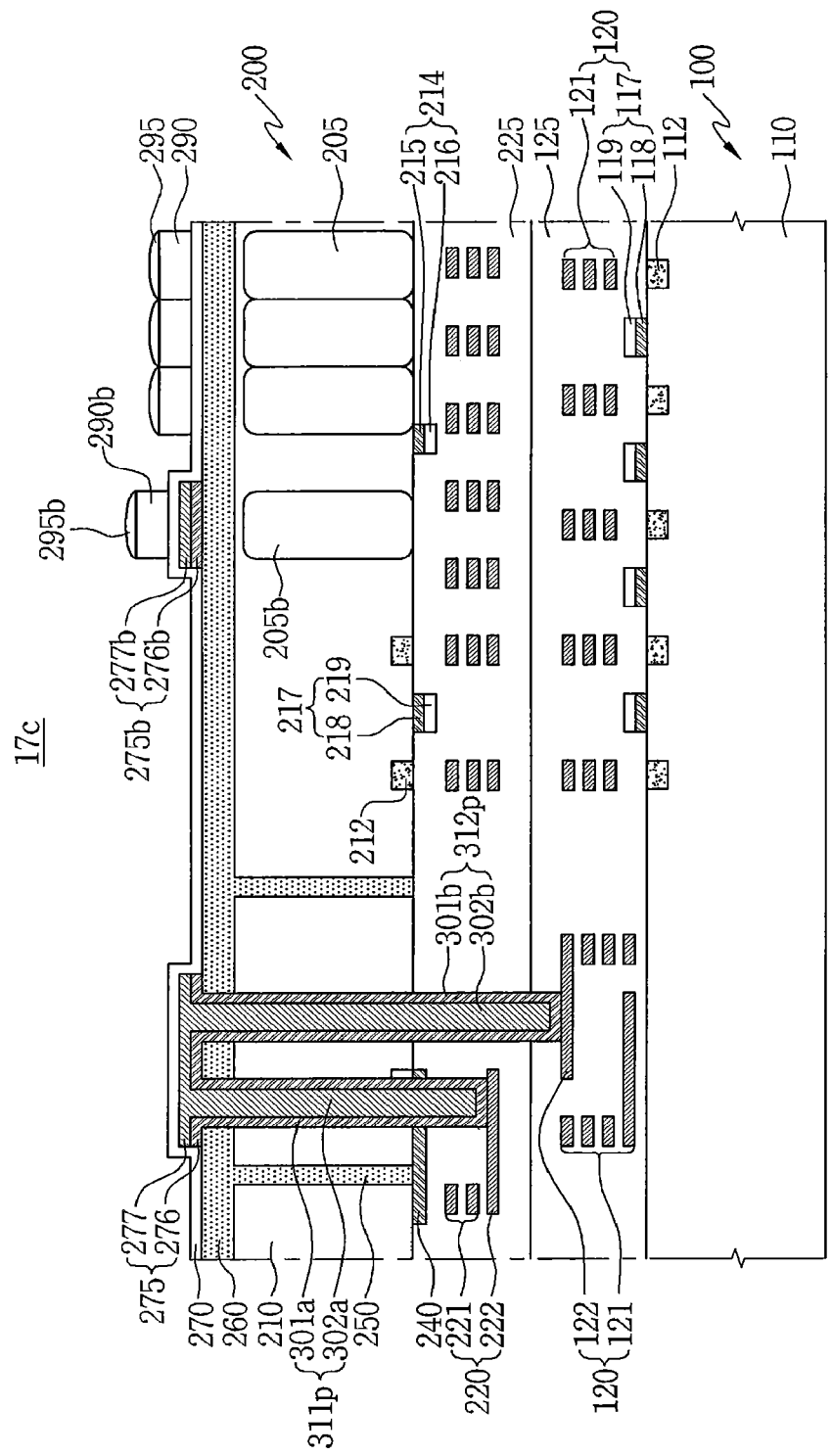
Figure 8A:
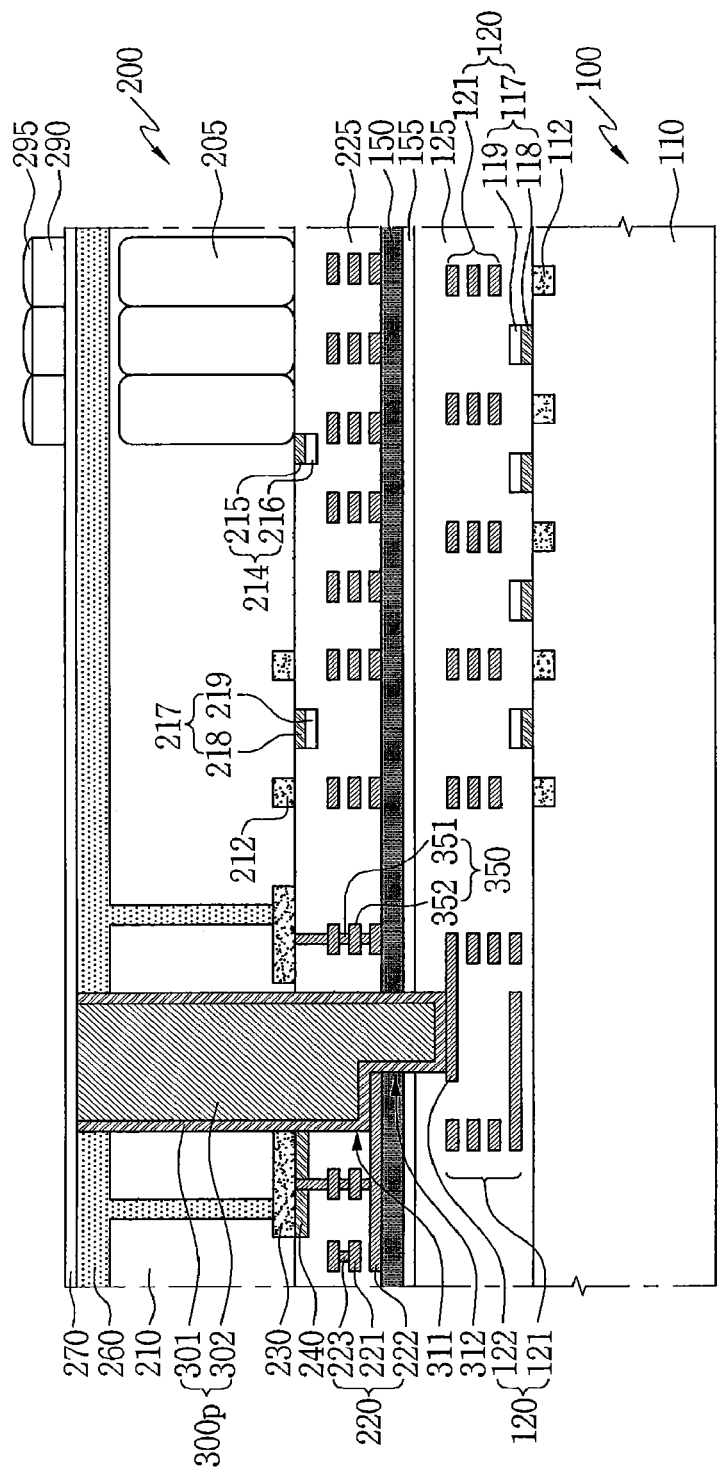
Figure 8B:
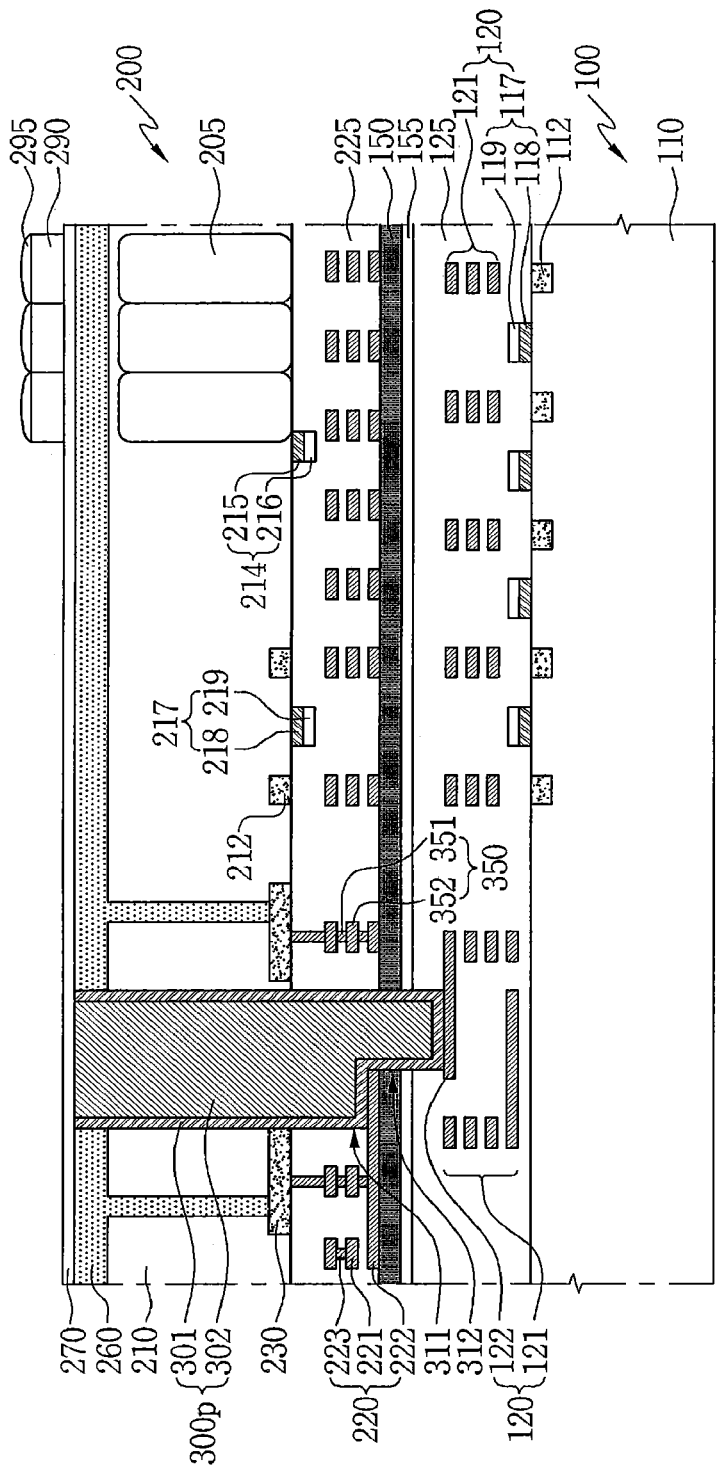
Figure 8C:
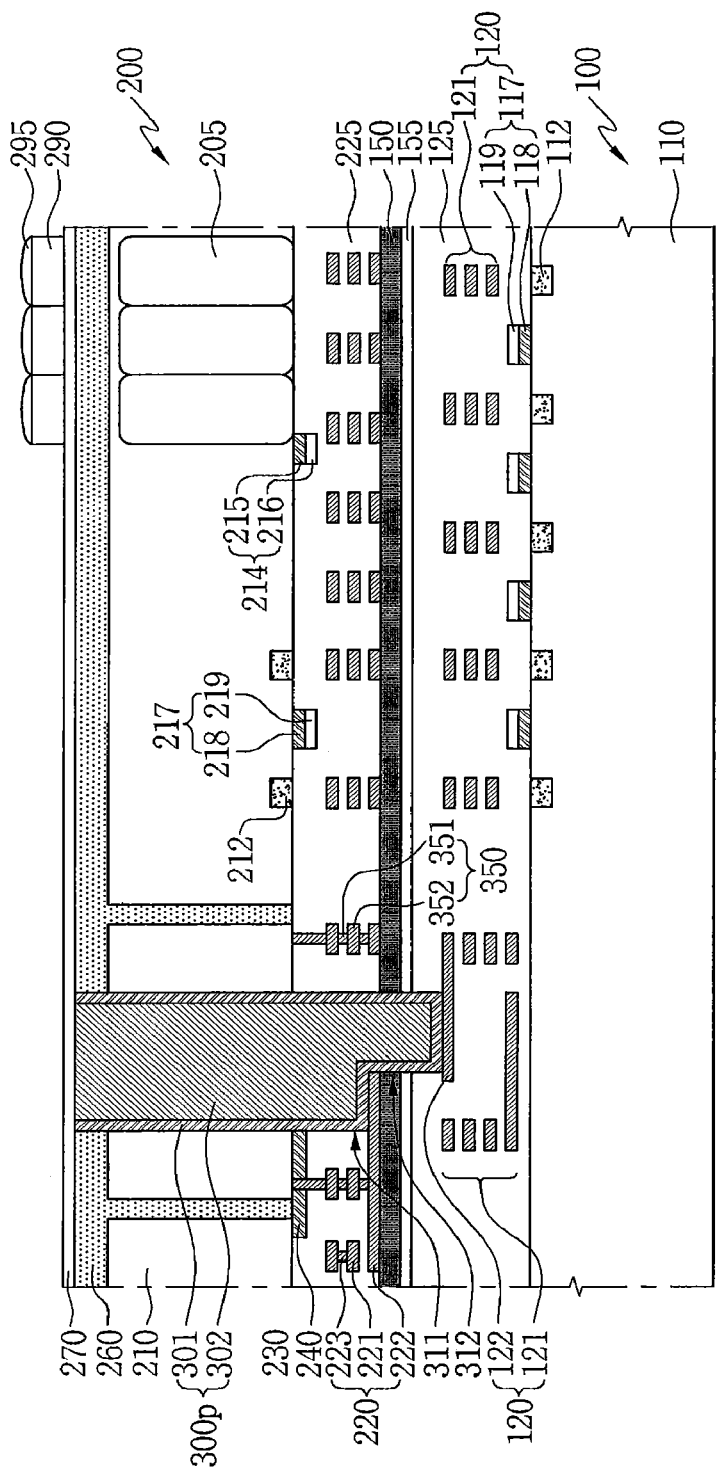
Figure 8D:
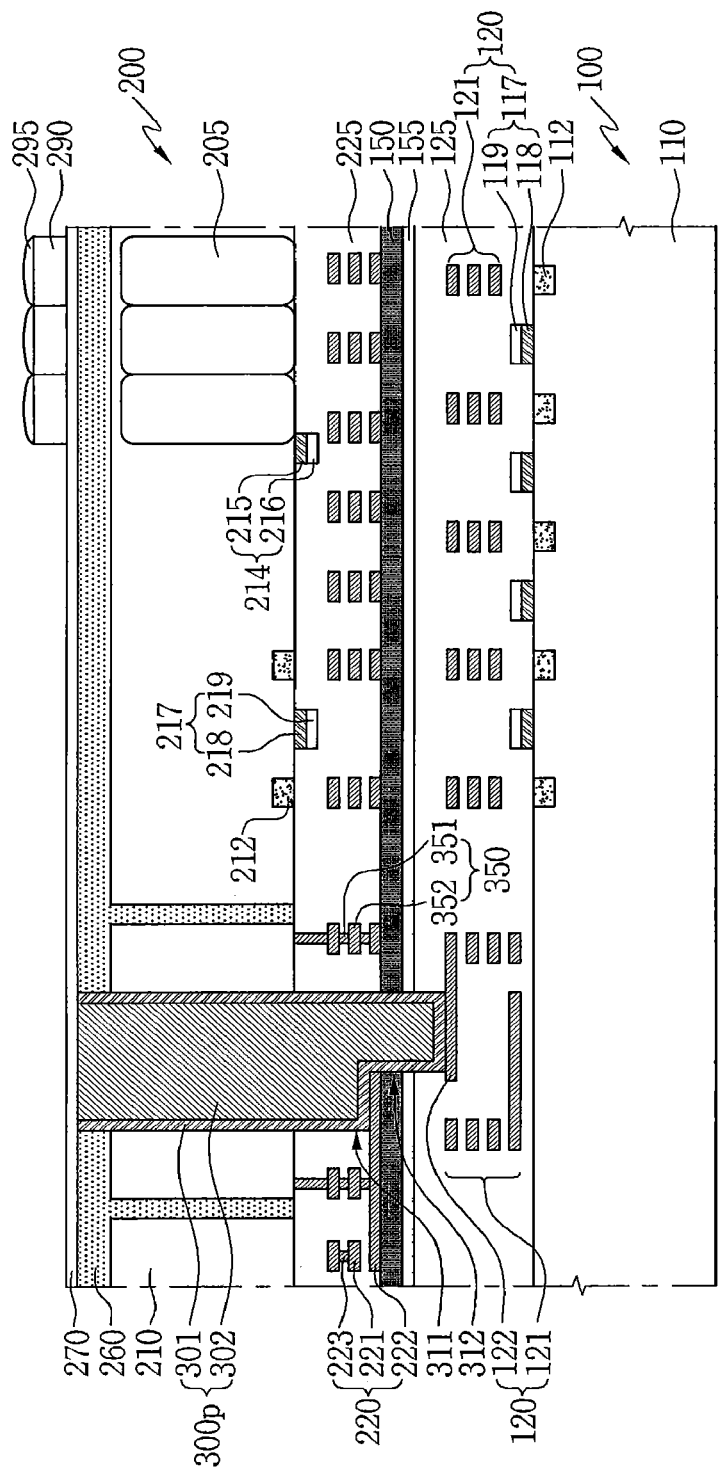
Figure 8E:
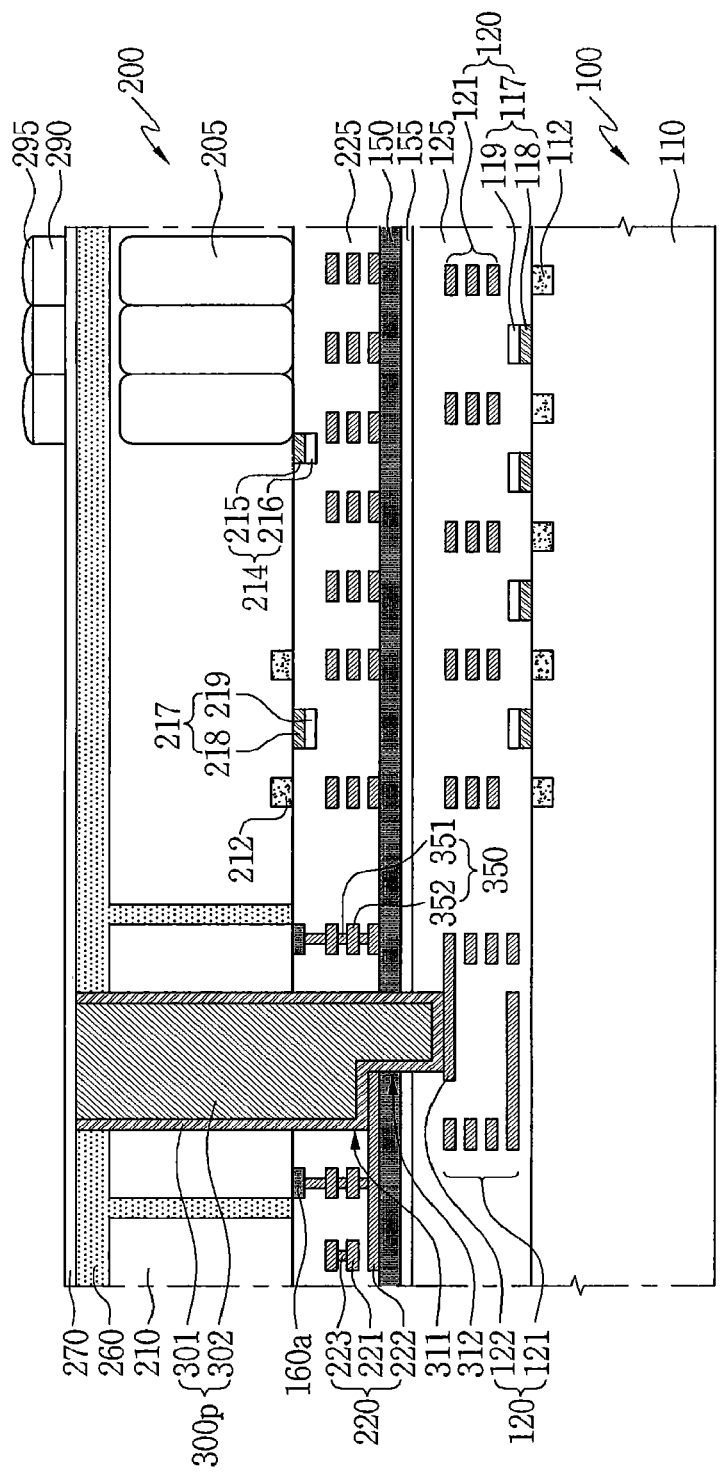
Figure 8F:
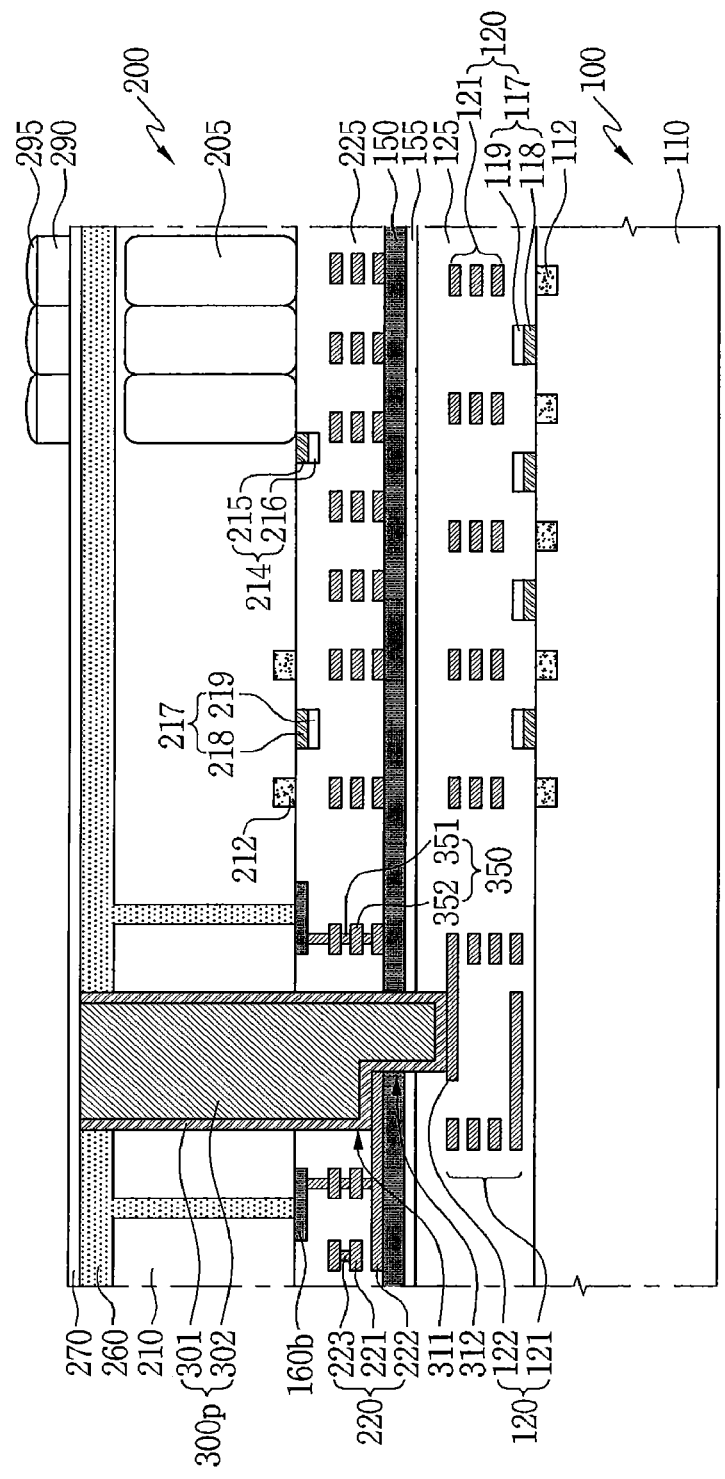
Figure 8H:
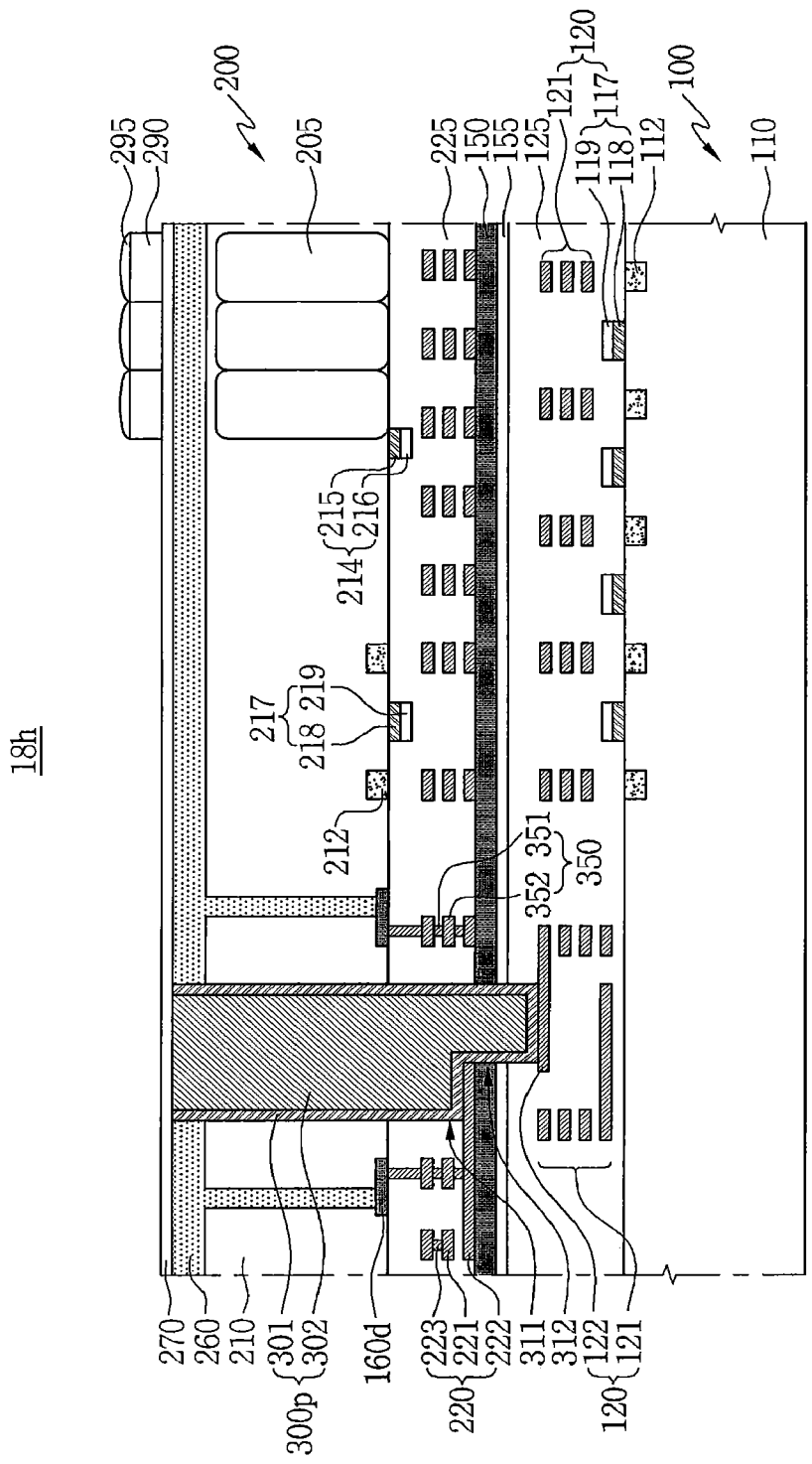

Referring to FIG. 7C, as compared with the semiconductor device 17a shown in FIG. 7A, a first etch-delay structure 230a may be omitted in a semiconductor device 17c according to the embodiment of the inventive concepts.

Referring to FIGS. 8A through 8H, semiconductor devices 18a to 18h according to various embodiments of the inventive concepts, for instance, backside illuminated image sensors, may further include dam patterns 350, a middle interlayer dielectric layer 150, a buffer insulating layer 155, and tap patterns 160d to 160d. The middle interlayer dielectric layer 150 and the buffer insulating layer 155 may horizontally extend to a region in which photodiodes 205 are formed.

A detailed description of the dam patterns 350, the middle interlayer dielectric layer 150, the buffer insulating layer 155, and the tap patterns 160 to 160d would be understood with reference to FIGS. 5A through 5F.

In addition, the embodiments of the inventive concepts, which have been described with reference to FIGS. 8A through 8H, may be combined with all other embodiments.

FIGS. 9A through 12D are diagrams illustrating methods of manufacturing via structures and semiconductor devices according to various embodiments of the inventive concepts.

Figure 9A:
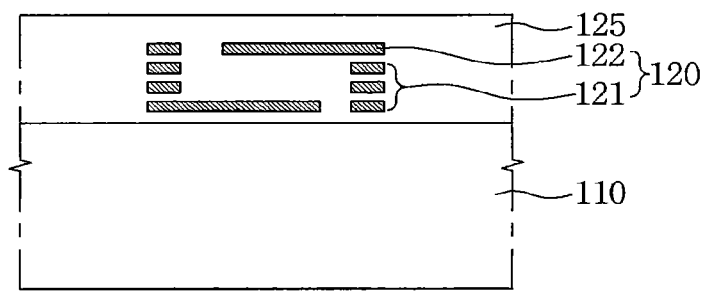
FIGS. 9A through 12D are diagrams illustrating methods of manufacturing semiconductor devices according to various embodiments of the inventive concepts.

Referring to FIG. 9A, a method of manufacturing a via structure according to the embodiment of the inventive concepts may include forming a lower device 100.

The forming the lower device 100 may include forming a lower circuit 120 on a lower substrate 110.

The forming the lower circuit 120 may include forming a lower interconnection 121 on the lower substrate 110 and forming a lower interlayer dielectric layer 125 to cover the lower interconnection 121.

The lower interconnection 121 may include a metal, a metal silicide and/or doped poly-Si formed using a deposition process, a plating process, and/or a patterning process. The lower interconnection 121 may include a lower plug pad 122.

The lower interlayer dielectric layer 125 may include silicon oxide.

Referring to FIGS. 9B through 9G, the method may include forming an upper device 200.

Figure 9B:
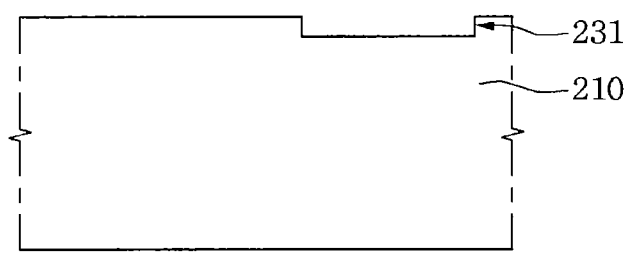

Referring to FIG. 9B, the forming the upper device 200 may include an etch-delay trench 231 in the upper substrate 210. The upper substrate 210 may include a bulk single-crystalline silicon wafer, a SOI wafer, a compound semiconductor wafer and/or a wafer on which a silicon epitaxial layer is grown. The etch-delay trench 231 may have a closed curve shape of a line type, a bar type, a rim type and/or a square type from a plan view.

Figure 9C:
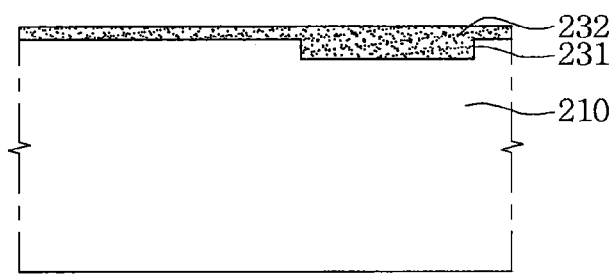

Referring to FIG. 9C, the forming the upper device 200 may include forming a first etch-delay material 232 on the upper substrate 210 to fill the etch-delay trench 231. The first etch-delay material 232 may include silicon oxide formed using a deposition or coating process. An oxidized silicon layer or a deposited silicon nitride layer may be further interposed in inner side surfaces of the etch-delay trench 231, i.e., an interface between the first etch-delay material 232 and the upper substrate 210. For example, before filling the etch-delay trench 231 with the first etch-delay material 232, an oxidation process of oxidizing the surface of the upper substrate 210 and/or a deposition process of forming a silicon nitride layer on the surface of the upper substrate 210 may be further performed.

Figure 9D:
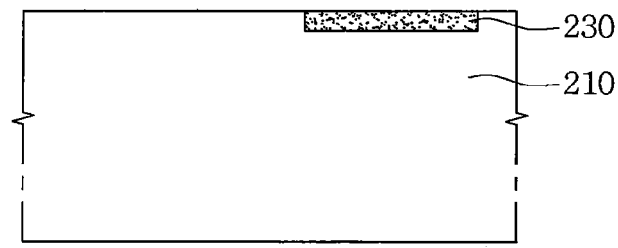

Referring to FIG. 9D, the forming the upper device 200 may include removing the first etch-delay material 232 from the upper substrate 210 using a planarization process, such as a CMP process, to form a first etch-delay structure 230. The surface of the upper substrate 210 may be substantially coplanar with the surface of the first etch-delay structure 230.

Figure 9E:
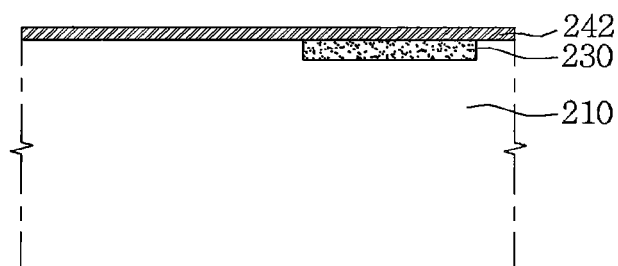

Referring to FIG. 9E, the forming the upper device 200 may include forming a second etch-delay material 242 on the first etch-delay structure 230. The second etch-delay material 242 may include a metal, a metal silicide and/or poly-Si.

Figure 9F:
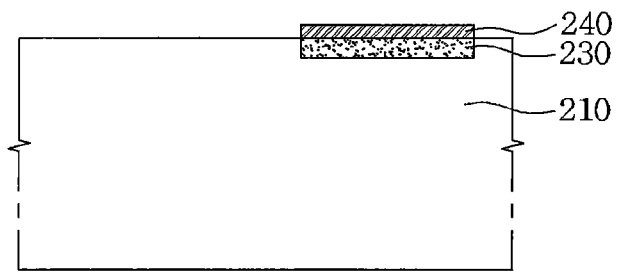

Referring to FIG. 9F, the forming the upper device 200 may include patterning the second etch-delay material 242 using a patterning process to form a second etch-delay structure 240. The patterning process may include a photolithography process and a selective etching process. For brevity, FIG. 9F illustrates a case in which side surfaces of the first etch-delay structure 230 and the second etch-delay structure 240 are aligned.

Figure 9G:
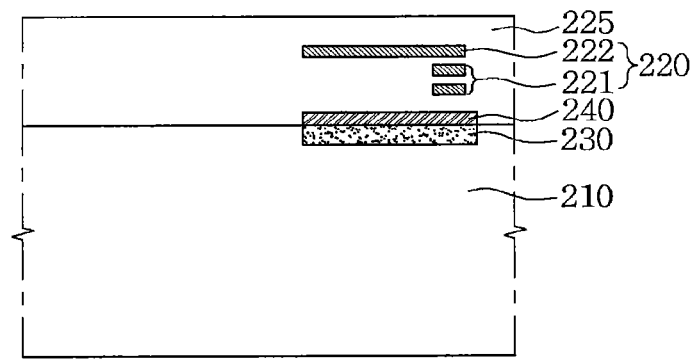

Referring to FIG. 9G, the forming the upper device 200 may include forming an upper circuit 220 on the upper substrate 210. The forming the upper circuit 220 may include forming an upper interconnection 221 on the upper substrate 210 and forming an upper interlayer dielectric layer 225 to cover the upper interconnection 221. The upper interconnection 221 may include a metal, a metal silicide and/or doped poly-Si. The upper interconnection 221 may include an upper plug pad 222. The upper interlayer dielectric layer 225 may include silicon oxide.

Figure 9H:
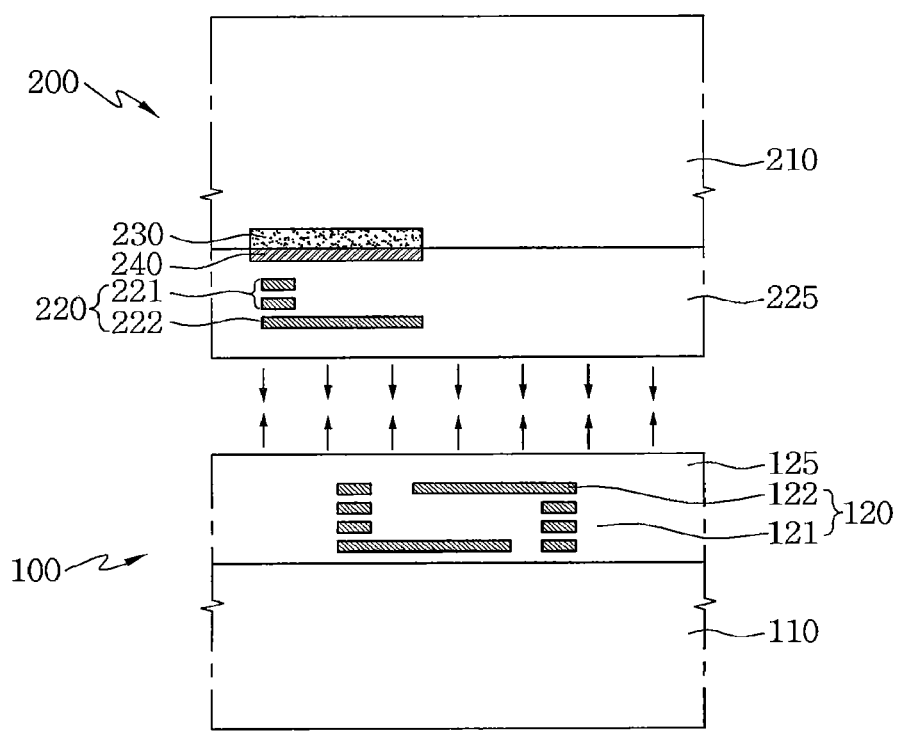

Referring to FIG. 9H, the forming the via structure may include bonding the lower device 100 and the upper device 200 to each other. For example, the upper interlayer dielectric layer 225 of the upper device 200 may be brought into contact with the lower interlayer dielectric layer 125 of the lower device 100. The upper device 200 may be inverted.

Figure 9I:
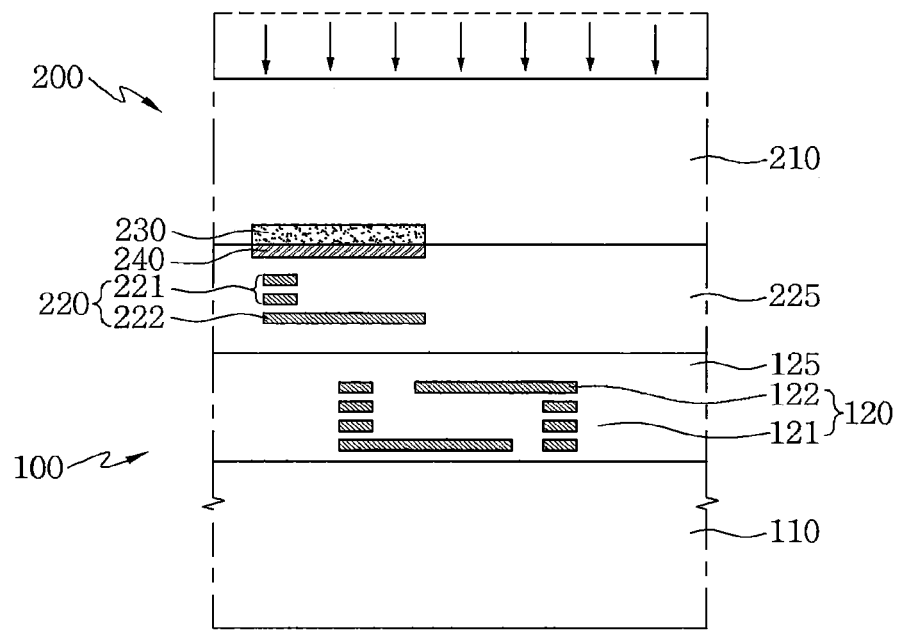

Referring to FIG. 9I, the method may include partially removing a back surface of the upper substrate 210 of the upper device 200 using a thinning process, such as a grinding process.

Figure 9J:
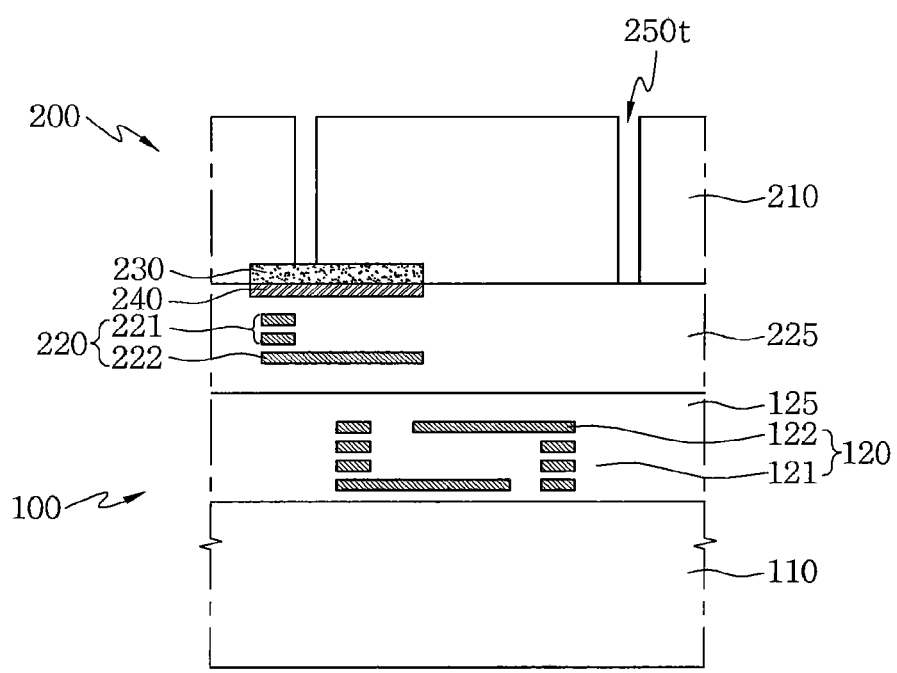

Referring to FIG. 9J, the method may include forming an isolating trench 250t. The isolating trench 250t may have a circular rim shape or a polygonal rim shape from a plan view.

Figure 9K:
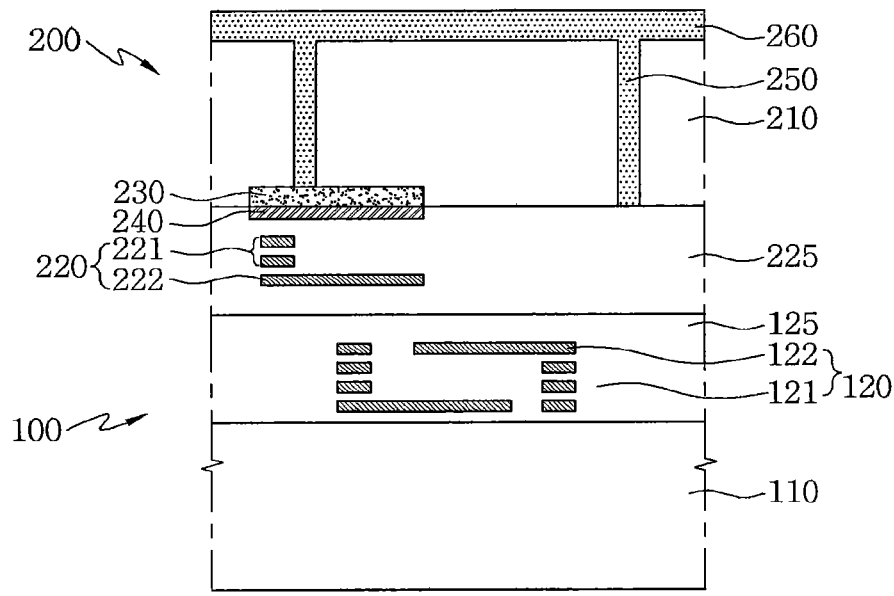

Referring to FIG. 9K, the method may include forming a floating insulating layer 250 to fill the isolating trench 250t and forming a capping insulating layer 260 on the upper substrate 210. Since both the floating insulating layer 250 and the capping insulating layer 260 are formed using the same process, the floating insulating layer 250 and the capping insulating layer 260 may include the same material and be materially in continuity with each other. For example, the floating insulating layer 250 and the capping insulating layer 260 may include an insulating material (e.g., silicon oxide) formed using a deposition process.

Figure 9L:
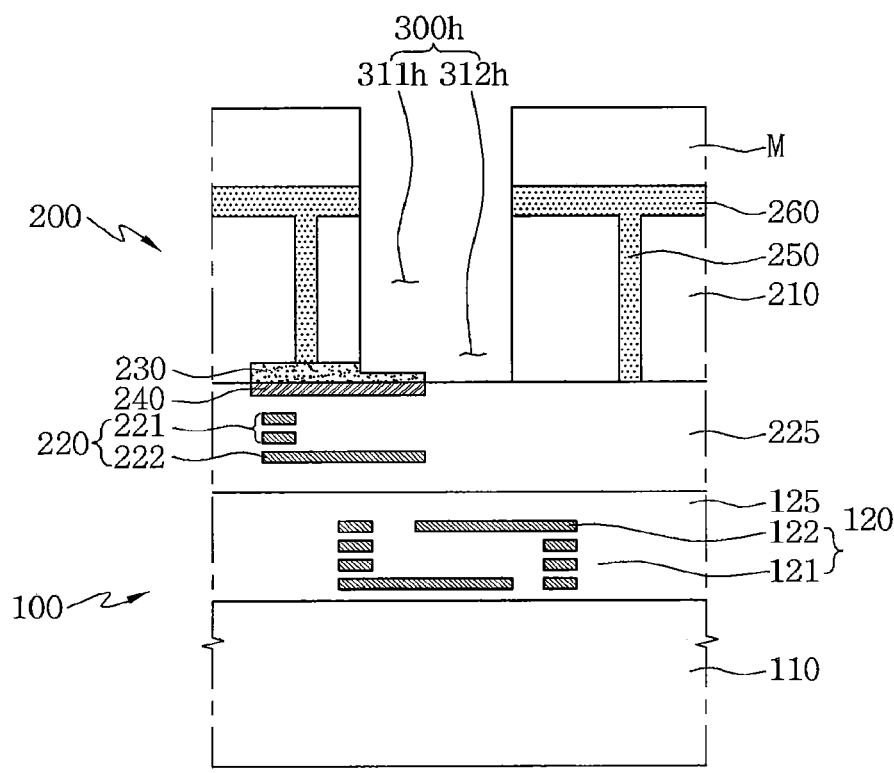

Referring to FIG. 9L, the method may include forming a mask pattern M and performing a first etching process to form a via hole 300h having a bottom through which the first etch-delay structure 230 and the upper interlayer dielectric layer 225 are exposed. The mask pattern M may include an organic material such as photoresist and/or an inorganic material such as silicon oxide and/or silicon nitride. The first etching process may include a front-process of etching the capping insulating layer 260 and a back-process of etching the upper substrate 210. The front-process may include a process of etching silicon oxide, and the back-process may include a process of etching silicon. The first etch-delay structure 230 may delay the first etching process since it has a higher etch resistance to a given etchant than the adjacent material. Accordingly, the via hole 300h may include a first hole portion 311h, which is aligned with the first etch-delay structure 230 and/or the second etch-delay structure 240, and a second hole 312h, which is not aligned with the first etch-delay structure 230 and/or the second etch-delay structure 240. The first hole portion 311h may be thinner than the second hole portion 312h, and the second hole portion 312h may be deeper than the first hole portion 311h.

Figure 9M:
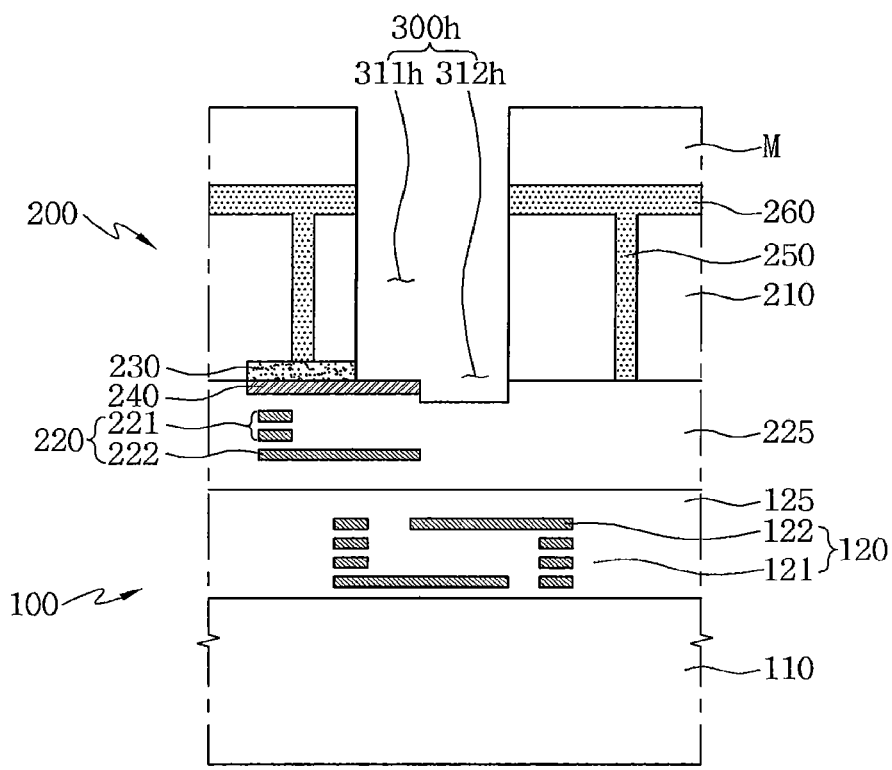

Referring to FIG. 9M, the method may include performing a second etching process to expose the second etch-delay structure 240 and the recessed upper interlayer dielectric layer 225 through the bottom of the via hole 300h. The second etching process may include etching silicon oxide.

Figure 9N:
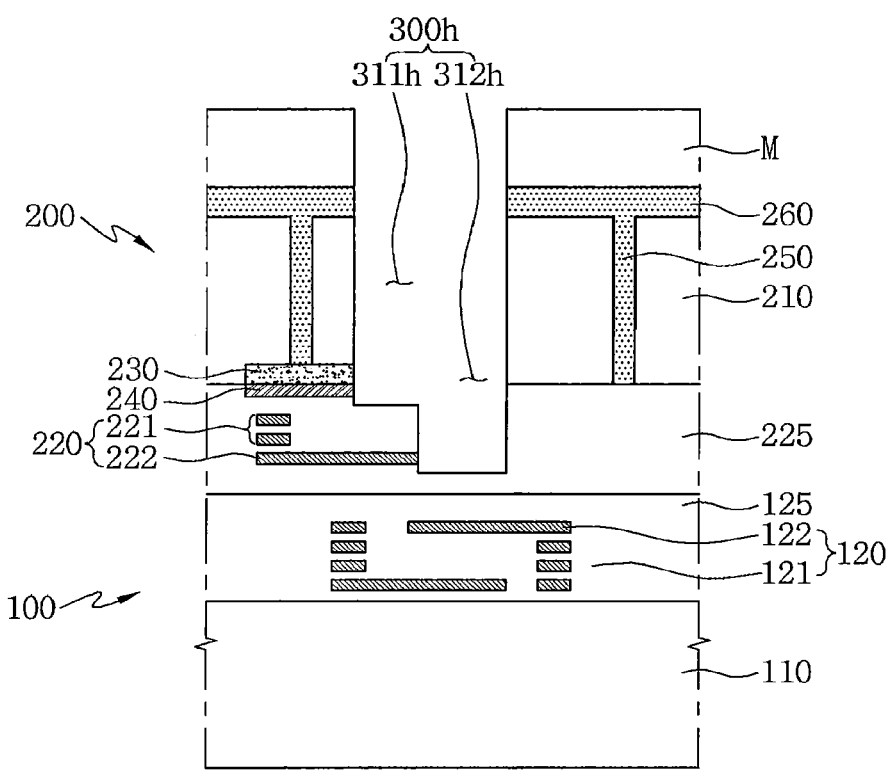

Referring to FIG. 9N, the method may include continuously performing the second etching process to remove the second etch-delay structure 240 exposed through the bottom of the via hole 300h and expose the upper interlayer dielectric layer 225 through the bottom of the via hole 300h. The upper plug pad 222 may be exposed in the first hole portion 311h, which is relatively thinly recessed in the via hole 300h, and the lower plug pad 122 may be exposed in the second hole portion 312h, which is relatively deeply recessed in the via hole 300h. The second etch-delay structure 240 may delay the second etching process since it has a higher etch resistance to a given etchant than the adjacent material.

Figure 9O:
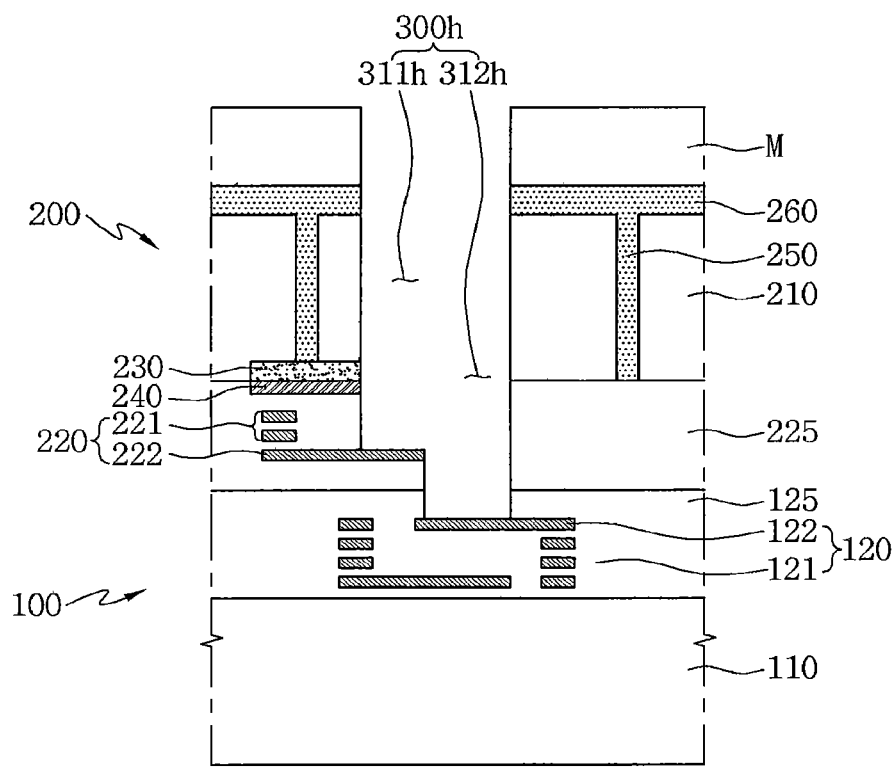

Referring to FIG. 9O, the method may include continuously performing the second etching process to expose the upper plug pad 222 and the lower plug pad 122 through the bottom of the via hole 300h. The second etching process may include removing the lower interlayer dielectric layer 125. The first etch-delay structure 230 and the second etch-delay structure 240 may similarly adjust time points in which the upper plug pad 222 and the lower plug pad 122 are exposed. Accordingly, even if the second etching process is excessively performed, the upper plug pad 222 and the lower plug pad 122 may not sustain remarkable damage but maintain obtained shapes and thicknesses. Subsequently, the mask pattern M may be removed.

Figure 9P:
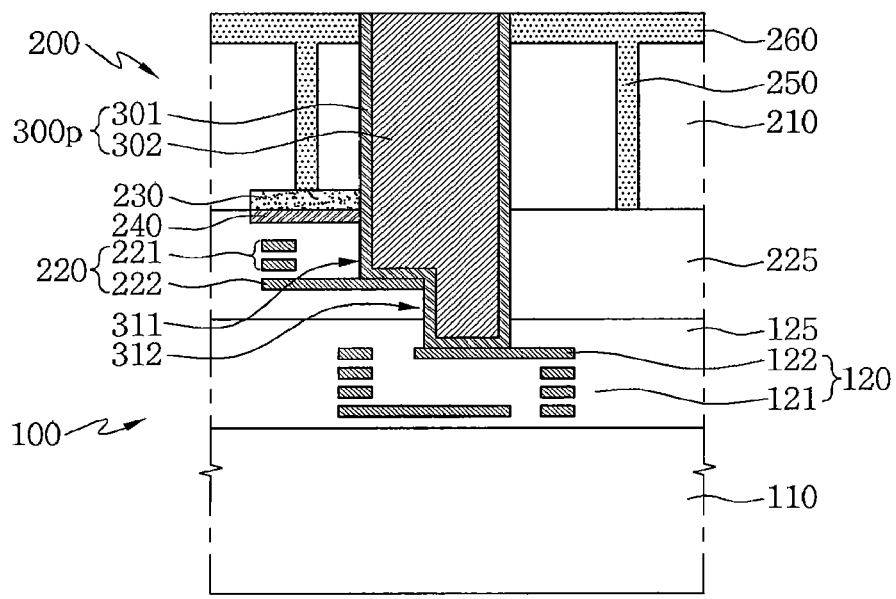

Referring to FIG. 9P, the method may include forming a via plug 300p to fill the inside of the via hole 300h. The via plug 300p may include a via barrier layer 301 conformally formed on an inner wall of the via hole 300h and a via core 302 filling the via hole 300h. The via barrier layer 301 may include titanium (Ti), titanium nitride (TiN), tantalum (Ta), tantalum nitride (TaN), titanium tungsten (TiW) and/or various other barrier metals. The via core 302 may include a metal, such as tungsten, aluminum, cobalt, nickel and/or copper, and/or a metal silicide. FIG. 9P illustrates a case in which the capping insulating layer 260 is exposed using a planarization process, such as a CMP process.

Thereafter, referring back to FIG. 1A, the method may include forming a passivation layer 270 on the capping insulating layer 260 and the via plug 300p. The passivation layer 270 may include silicon nitride.

Figure 10A:
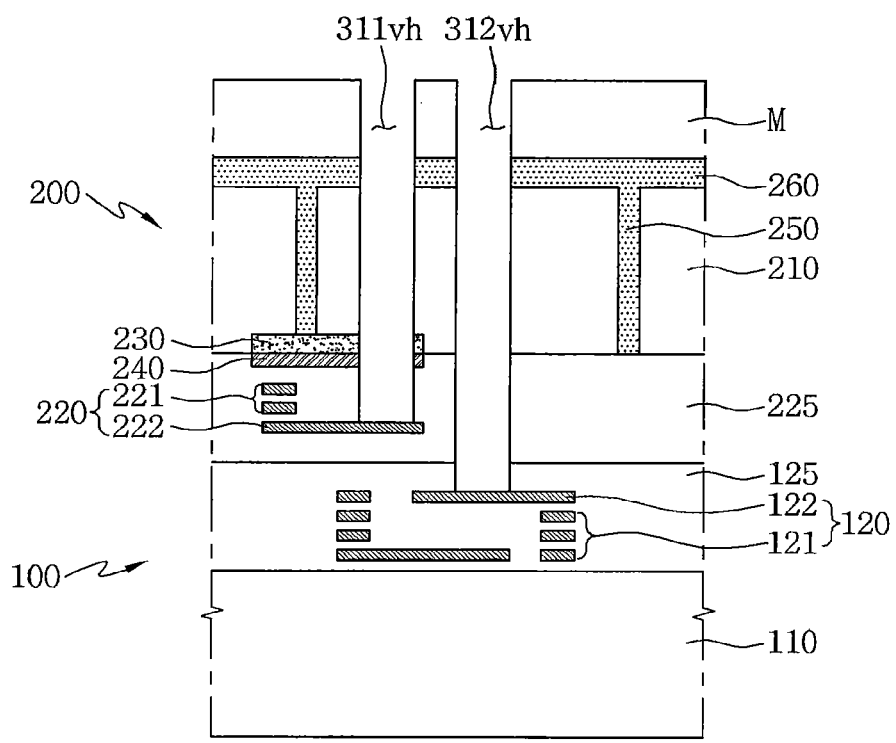

Referring to FIG. 10A, a method of manufacturing a via structure according to an embodiment of the inventive concepts may include performing the processes described with reference to FIGS. 9A through 9M to form a first via hole 311vh exposing the upper plug pad 222 and a second via hole 312vh exposing the lower plug pad 122. The first via hole 311vh may penetrate the first etch-delay structure 230 and the second etch-delay structure 240. Accordingly, the first etching process and the second etching process may be delayed by the first etch-delay structure 230 and the second etch-delay structure 240 so that the first via hole 311*vh* can be formed to a smaller thickness than the second via hole 312*vh*. Thereafter, the mask pattern M may be removed.

Figure 10B:
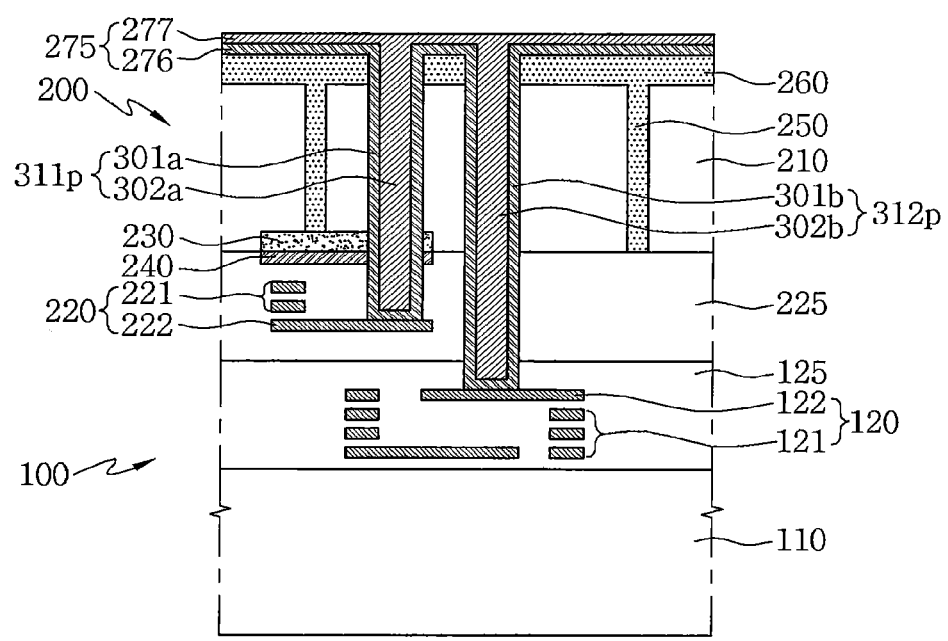

Referring to FIG. 10B, the method may include forming a first via plug 311*p* and a second via plug 312*p* to fill the insides of the first via hole 311*vh* and the second via hole 312*vh*. The first and second via plugs 311*p* and 312*p* may include first and second via barrier layers 301*a* and 301*b* conformally formed on inner walls of the first and second via holes 311*h* and 312*h* and first and second via cores 302*a* and 302*b* filling the first and second via holes 311*h* and 312*h*. The via barrier layers 301*a* and 301*b* and the via cores 302*a* and 302*b* may be present on the capping insulating layer 260.

Figure 10C:
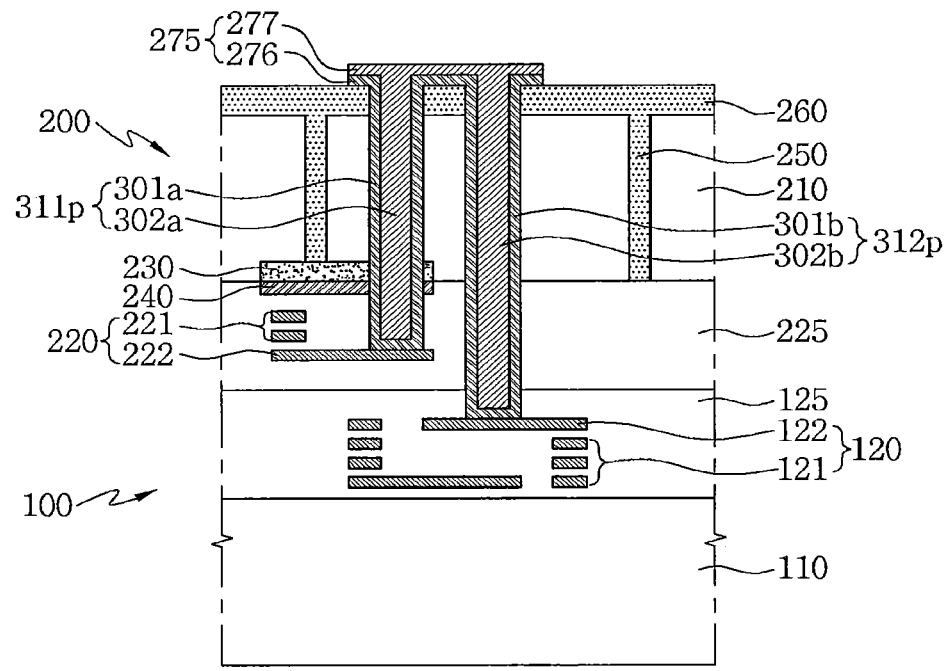

Referring to FIG. 10C, the method may include patterning the via barrier layer 301 and the via core 302 formed on the capping insulating layer 260 to form a plug connector 275. The forming the plug connector 275 may include a photolithography process and an etching process. The plug connector 275 may include a connector barrier layer 276, which may be materially in continuity with the via barrier layers 301*a* and 301*b*, and a connector core 277, which may be materially in continuity with the via cores 302*a* and 302*b*.

Thereafter, referring to FIG. 3A, the method may include forming a passivation 270 on the capping insulating layer 260 and the plug connector 275.

Figure 10D:
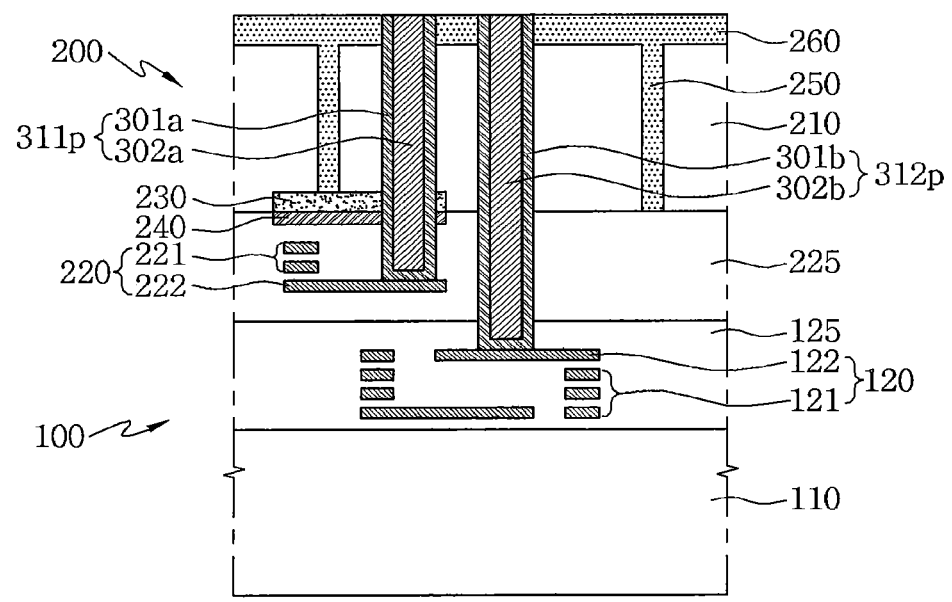

Alternatively, referring to FIG. 10D, after the process described with reference to FIG. 10B is performed, the method may include performing a planarization process, such as a CMP process, to electrically and physically separate the first via plug 311*p* and the second via plug 312*p* from each other.

Figure 10E:
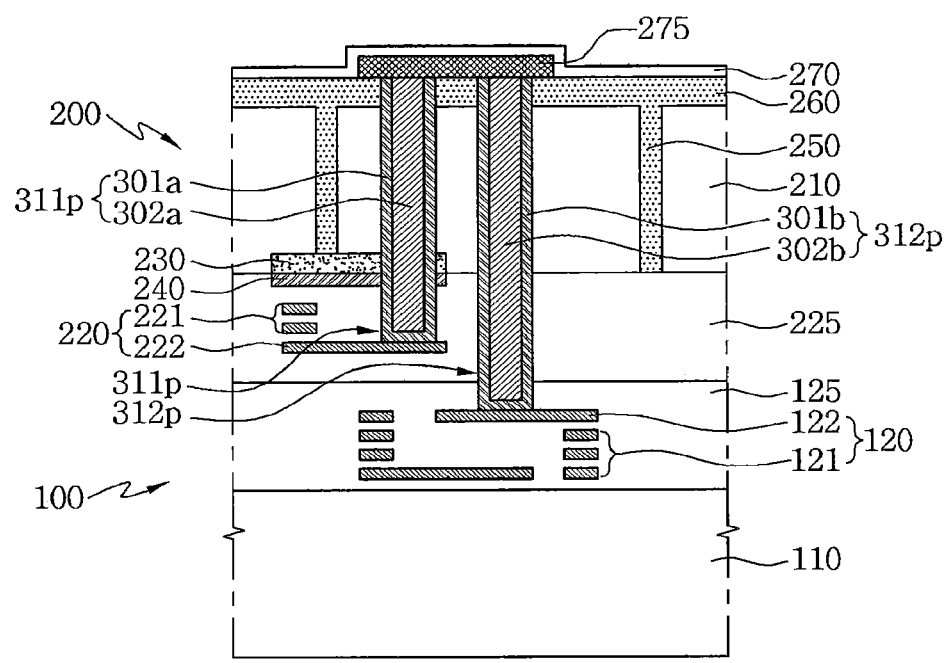

Subsequently, referring to FIG. 10E, the method may include forming a plug connector 275 on the capping insulating layer 260 to electrically and physically connect a top end portion of the first via plug 311*p* and a top end portion of the second via plug 312*p*. The forming the plug connector 275 may include a photolithography process and an etching process. The plug connector 275 may include a metal. Thereafter, referring again to FIG. 10E, the method may include forming a passivation layer 270 on the capping insulating layer 260 and the plug connector 275.

Figure 11A:
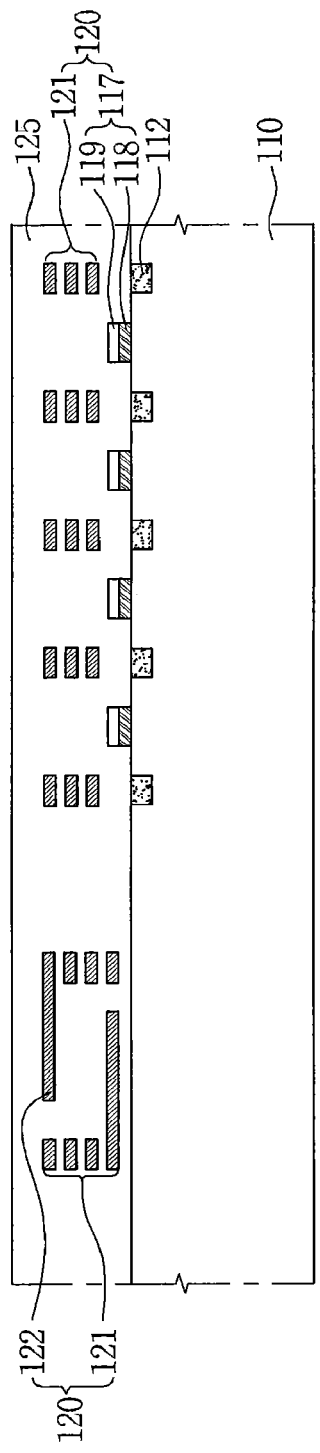

Referring to FIG. 11A, a method of manufacturing a semiconductor device according to an embodiment of the inventive concepts may include forming a lower device 100.

Referring back to FIG. 9A, the forming the lower device 100 may include forming a lower device isolation region 112 in a lower substrate 110, forming a lower gate structure 117 on the lower substrate 110, and forming a lower circuit 120 and a lower interlayer dielectric layer 125 above the lower substrate 110. The lower circuit 120 may include a lower interconnection 121 and a lower plug pad 122.

The lower substrate 110 may include a bulk single-crystalline silicon wafer, a SOI wafer, a compound semiconductor wafer and/or a wafer on which a silicon epitaxial layer is grown.

The forming the lower device isolation region 112 may include a trench in the lower substrate 110 and filling the trench with an insulating material.

The forming the lower gate structure 117 may include forming a lower gate electrode 118 and a lower gate capping layer 119 on the lower substrate 110 using a deposition process, a photolithography process, and an etching process. The lower gate electrode 118 may include poly-Si, a metal silicide and/or a metal. The lower gate capping layer 119 may include silicon nitride.

The lower circuit 120 may include a multilayered lower interconnection 121 and a lower interlayer dielectric layer 125 covering the lower interconnection 121. The lower interconnection 121 may include a lower plug pad 122. The lower interconnection 121 and the lower plug pad 122 may include a metal. The lower interlayer dielectric layer 125 may include silicon oxide.

Figure 11B:
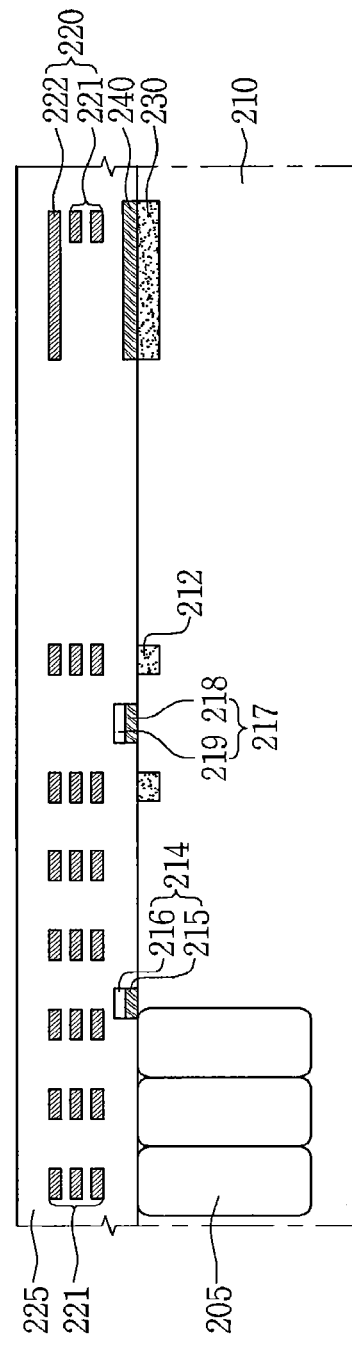

Referring to FIG. 11B, the method may include forming an upper device 200.

For instance, referring back to FIG. 9B through 9G, the forming the upper device 200 may include forming a photodiode 205, an upper device isolation region 212, and a first etch-delay structure 230 in an upper substrate 210, forming a transmission gate structure 214, an upper gate structure 217, and a second etch-delay structure 240 on the upper substrate 210, forming an upper circuit 220 above the upper substrate 210, and forming an upper interlayer dielectric layer 225 to cover the upper circuit 220. The upper circuit 220 may include an upper plug pad 222.

The upper substrate 210 may include a bulk single-crystalline silicon wafer, a SOI wafer, a compound semiconductor wafer and/or a wafer on which a silicon epitaxial layer is grown.

The forming the upper device isolation region 212 may include forming a trench in the upper substrate 210 and filling the trench with a device isolation insulating material.

The forming the first etch-delay structure 230 may include an etch-delay trench in the upper substrate 210 and filling the etch-delay trench with an etch-delay material. The device isolation insulating material and the etch-delay material may include silicon oxide.

The forming transmission gate structure 214 may include forming a transmission gate electrode 215 and a transmission gate capping layer 216 on the upper substrate 210 using a deposition process, a photolithography process, and/or an etching process. The transmission gate electrode 215 may include poly-Si, a metal silicide and/or a metal. The transmission gate capping layer 216 may include silicon nitride.

The forming the upper gate structure 217 may include forming an upper gate electrode 218 and an upper gate capping layer 219 on the upper substrate 210 using a deposition process, a photolithography process, and/or an etching process. The upper gate electrode 218) may include poly-Si, a metal silicide, or a metal. The upper gate capping layer 219 may include silicon nitride. The transmission gate structure 214 and the upper gate structure 217 may be formed at the same time.

The second etch-delay structure 240 may be formed at the same time with the transmission gate electrode 215 and the upper gate electrode 218. Accordingly, the second etch-delay structure 240 may include the same material as the transmission gate electrode 215 and the upper gate electrode 218.

The upper circuit 220 may include a multilayered upper interconnection 221 and an upper interlayer dielectric layer 225 covering the upper interconnection 221. The upper interconnection 221 may include an upper plug pad 222. The upper interconnection 221 and the upper plug pad 222 may include a metal. The upper interlayer dielectric layer 225 may include silicon oxide.

Figure 11C:
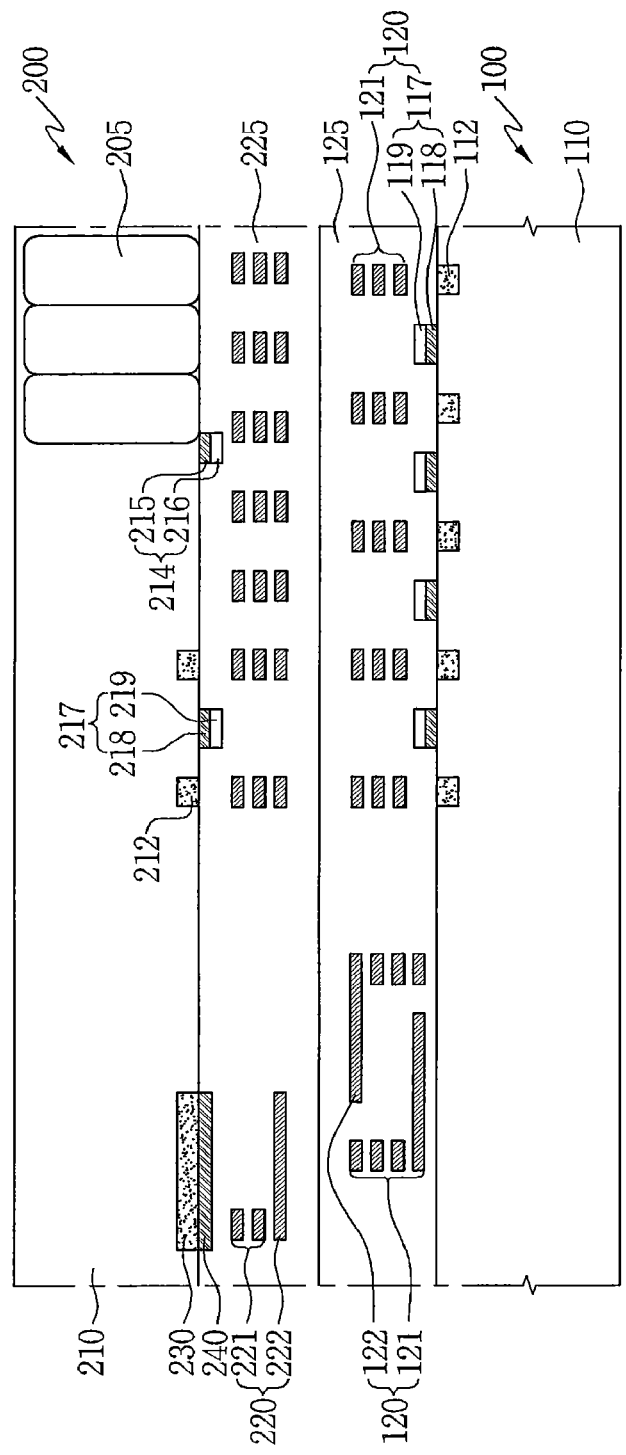

Referring to FIG. 11C, the forming the semiconductor device may include performing the processes described with reference to FIGS. 9H and 9I to bond the lower device 100 and the upper device 200 and thinning the upper substrate 210 of the upper device 200.

Figure 11D:
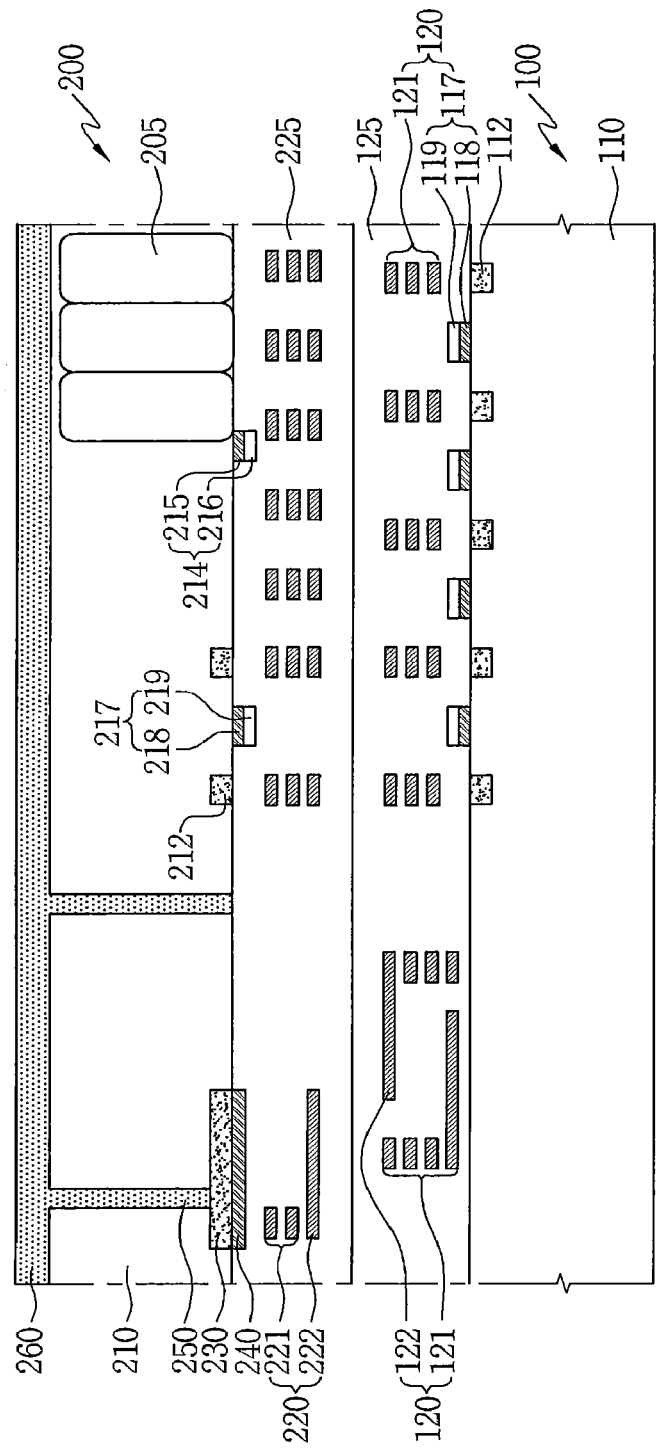

Referring to FIG. 11D, the method may include performing the processes described with reference to FIGS. 9J and 9K to form a floating insulating layer 250 and a capping insulating layer 260. The isolating trench 250t and/or the floating insulating layer 250 may have a circular rim shape or a polygonal rim shape from a top view. The capping insulating layer 260 may include silicon oxide.

Figure 11E:
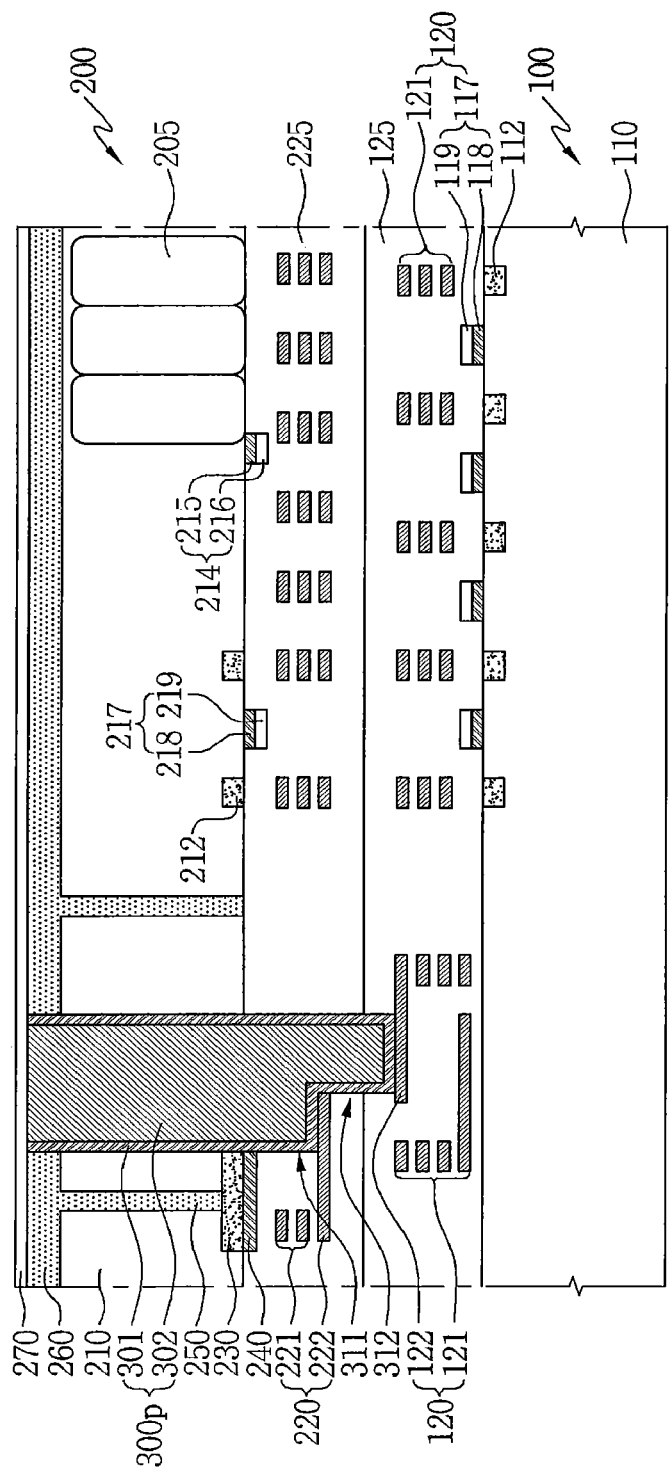

Referring to FIG. 11E, the method may include performing the processes described with reference to FIGS. 9L through 9P and 1A to form a via plug 300p and form a passivation layer 270 on the capping insulating layer 260 and the via plug 300p. The via plug 300p may include a via barrier layer 301 and a via core 302. The via plug 300p may be electrically and physically connected to the lower plug pad 122 and the upper plug pad 222. The passivation layer 270 may include silicon nitride.

Thereafter, referring back to FIG. 6A, the method may include forming a color filter 290 and a microlens 295 on the passivation layer 270 in alignment with the photodiode 205.

Figure 12A:
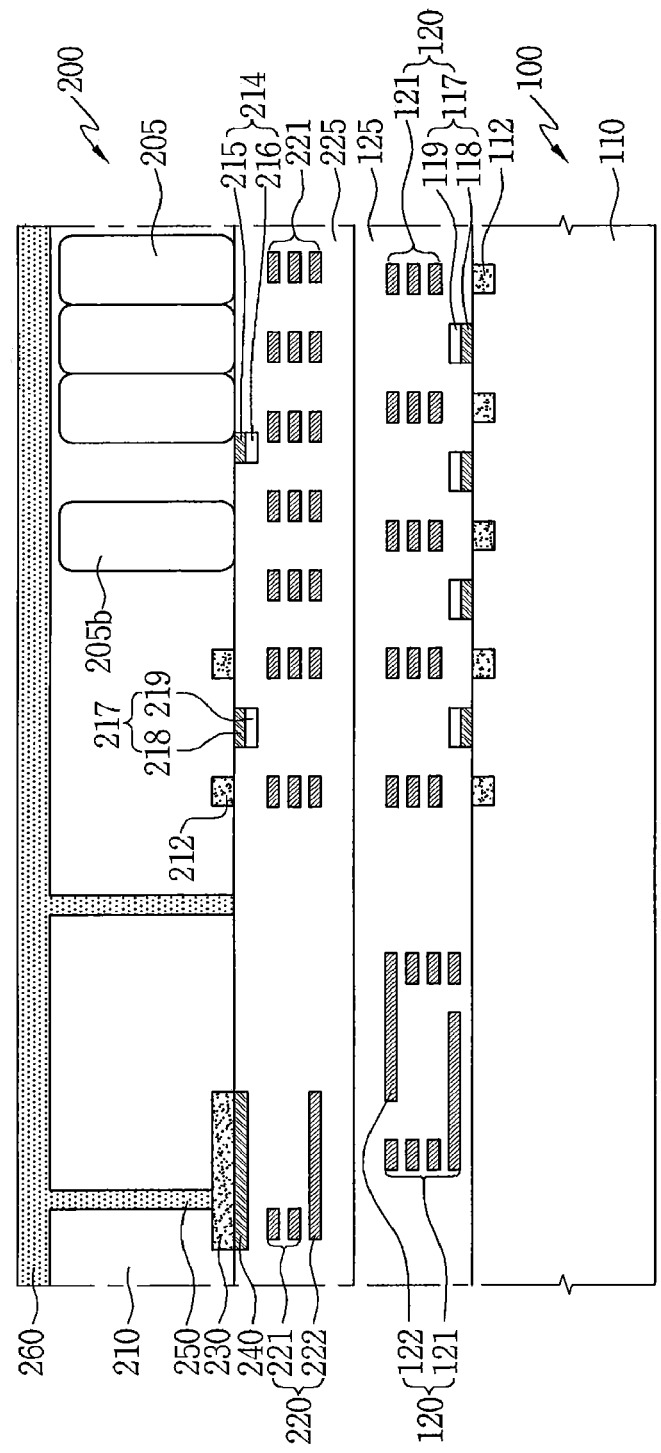

Referring to FIG. 12A, a method of manufacturing a semiconductor device according to embodiments of the inventive concepts may include performing the processes described with reference to FIGS. 11A through 11D to form a lower device 100 and an upper device 200, bond the lower device 100 and the upper device 200, thin an upper substrate 210 of the upper device 200, and form a capping insulating layer 260 on the upper substrate 210. The upper device 200 may further include a black-level photodiode 205b formed in the upper substrate 210.

Figure 12B:
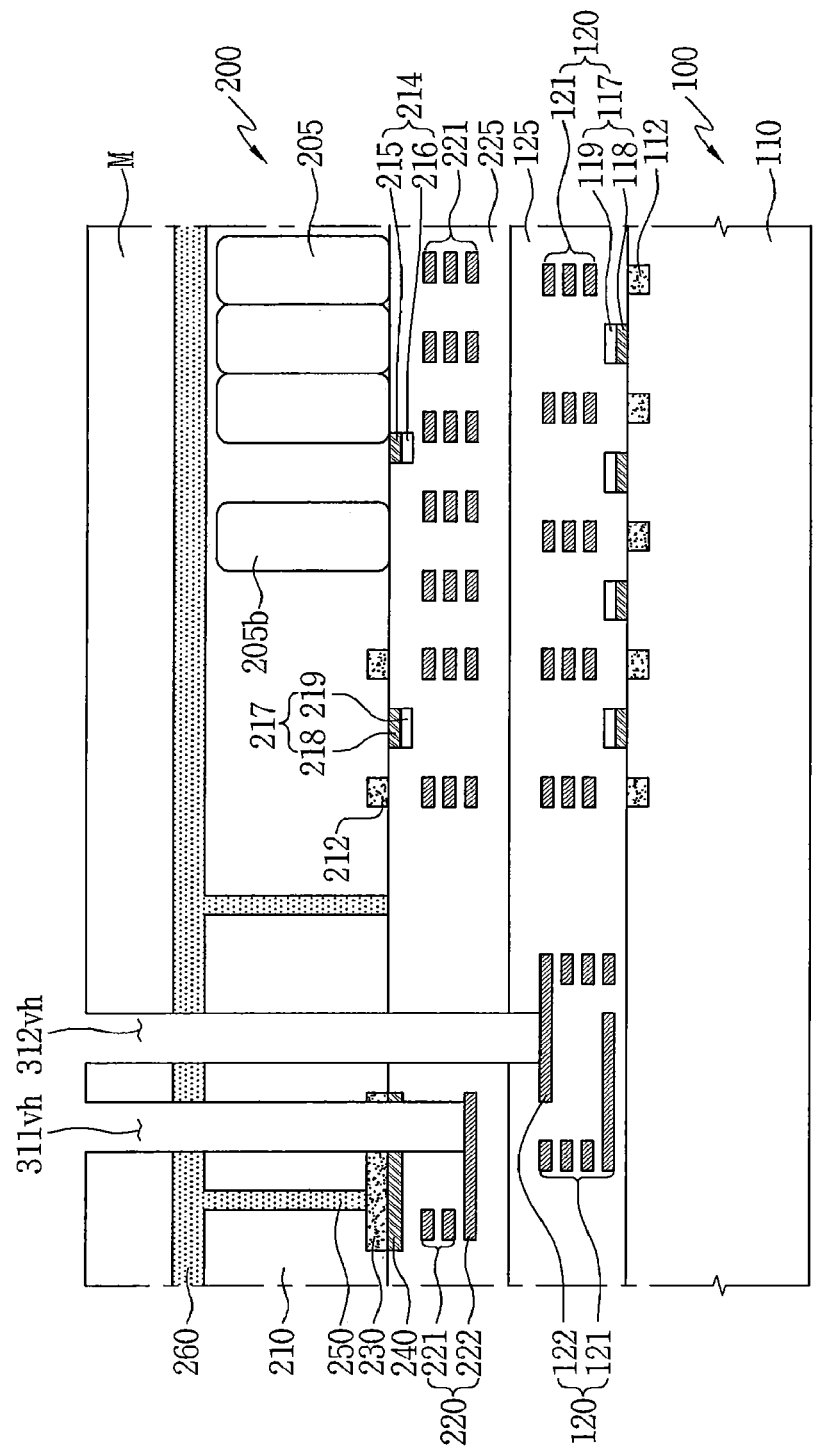

Referring to FIG. 12B, the method may include performing the processes described with reference to FIGS. 9A through 9M and 10A to form a first via hole 311h exposing the upper plug pad 222 and form a second via hole 312h exposing the lower plug pad 122.

Figure 12C:
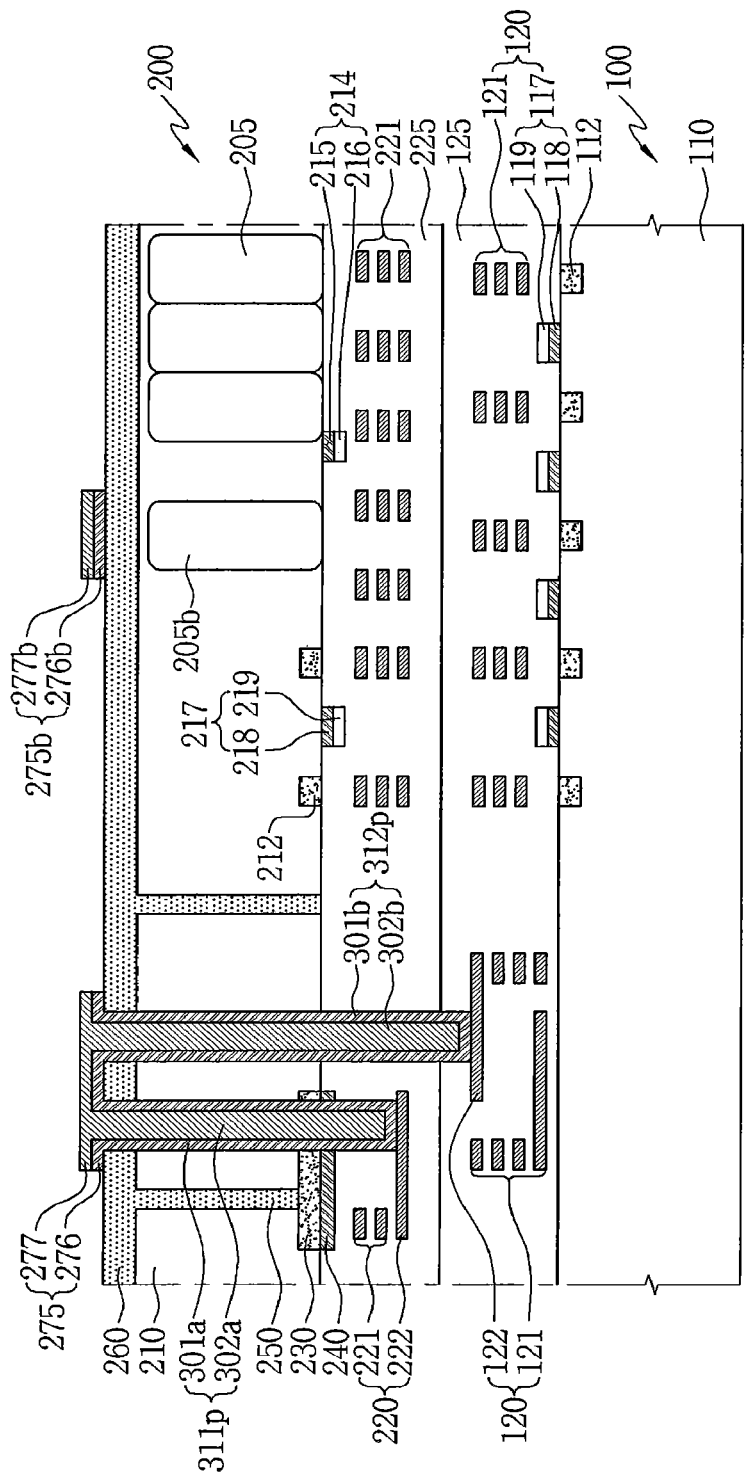

Referring to FIG. 12C, the method may include performing the processes described with reference to FIG. 10B to form a first via plug 311p filling the first via hole 311h, a second via plug 312p filling the second via hole 312h, and a blocking pattern 275b vertically aligned with the black-level photodiode 205b. The blocking pattern 275b may include a blocking barrier layer 276b formed on the capping insulating layer 260 and a blocking core layer 277b formed on the blocking barrier layer 276b. Thereafter, referring back to FIG. 7A, the method may include blanket forming a passivation layer 270 and forming a color filter 290 and a microlens 295 on the passivation layer 270. A black-level color filter 290b and a black-level microlens 295b may be formed on the blocking pattern 275b in alignment with the black-level photodiode 205b.

Figure 12D:
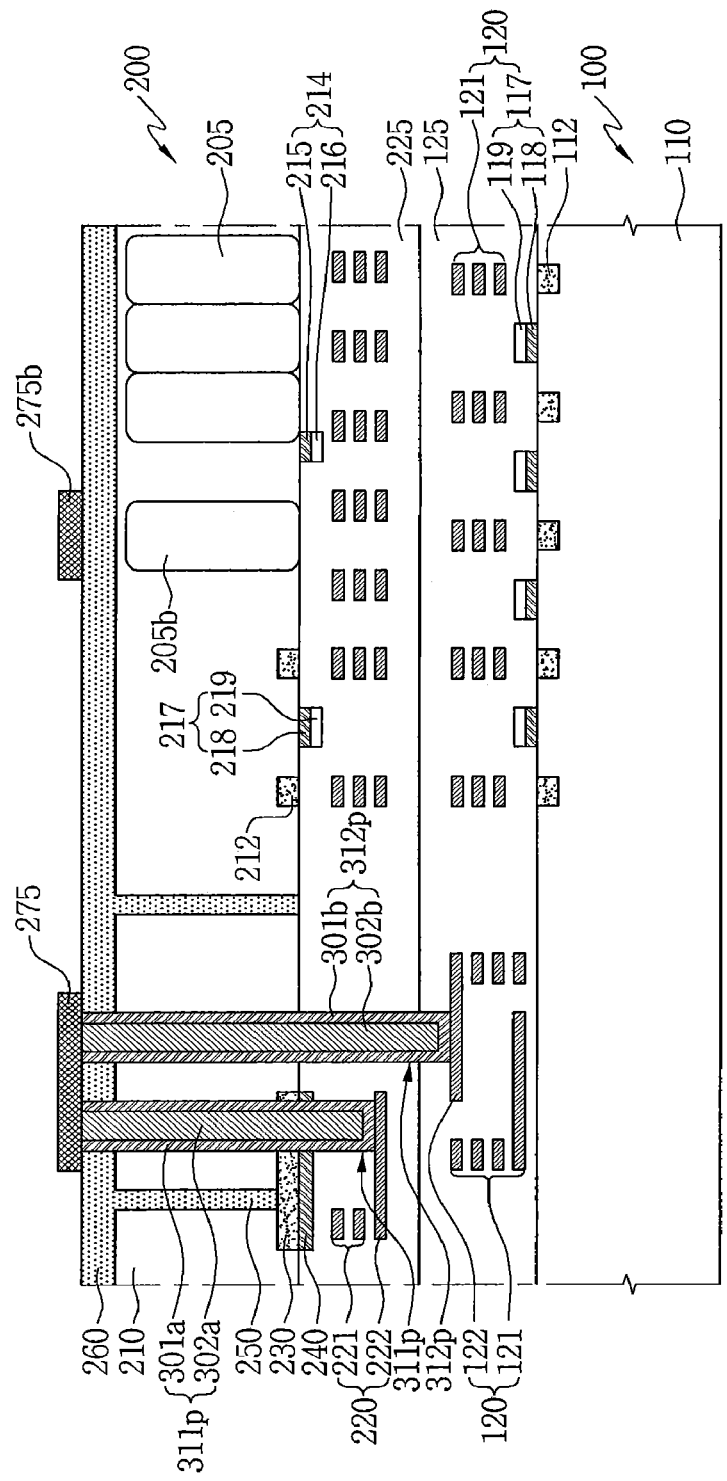

Referring to FIG. 12D and referring back to FIG. 10E, the method may include performing a planarization process to electrically and physically separate the first via plug 311p and the second via plug 312p from each other and forming a plug connector 275 and a blocking pattern 275b on the capping insulating layer 260. The plug connector 275 may be aligned with the first via plug 311p and the second via plug 312p and electrically and physically connect the first via plug 311p and the second via plug 312p. The blocking pattern 275b may be aligned with the black-level photodiode 205b.

Figure 13A:
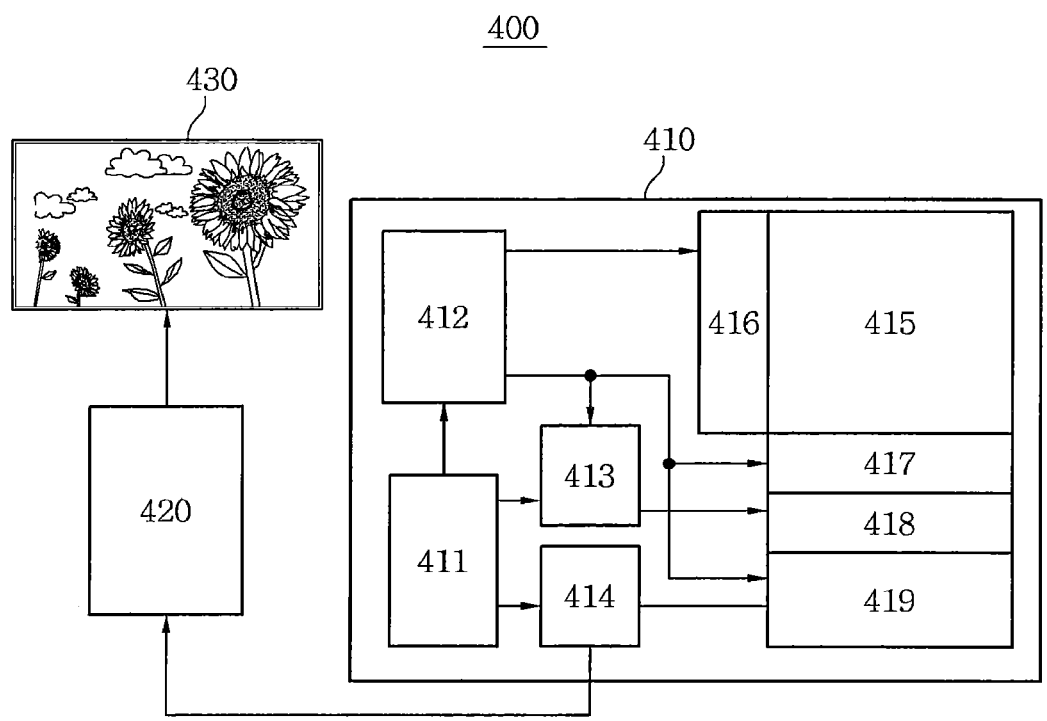
FIG. 13A is a schematic block diagram of a camera system according to an embodiment of the inventive concepts.

FIG. 13A is a schematic block diagram of a camera system 400 according to an embodiment of the inventive concepts. Referring to FIG. 13A, the camera system 400 according to the embodiment of the inventive concepts may include an image sensing part 410, an image signal processing part 420, and an image display part 430. The image sensing part 410 may include a control register block 411, a timing generator 412, a lamp generator 413, a buffering part 414, an active pixel sensor array 415, a row driver 416, a correlated double sampler 417, a comparing part 418, and an analog-to-digital converter (ADC) 419. The control register block 411 may wholly control operations of the image sensor 400. In particular, the control register block 411 may directly transmit operation signals to the timing generator 412, the lamp generator 413, and the buffering part 414. The timing generator 412 may generate an operation timing reference signal for time points at which several elements of the image sensing part 410 operate. The operation timing reference signal generated by the timing generator 412 may be transmitted to the row driver 416, the correlated double sampler 417, the comparator 418, and/or the ADC 419. The lamp generator 413 may generate and transmit lamp signals used for the correlated double sampler 417 and/or the comparing part 418. The buffering part 414 may include a latch circuit. The buffering part 414 may temporarily store an image signal to be externally transmitted. The active pixel sensor array 415 may sense an external image. The active pixel sensor array 415 may include a plurality of active pixel sensors, each of which may include a backside illuminated image sensor according to embodiments of the inventive concepts. The row driver 416 may selectively activate a row of the active pixel sensor array 415. The correlated double sampler 417 may sample and output an analog signal generated by the active pixel sensor array 415. The comparing part 418 may compare data transmitted by the correlated double sampler 417 with a slope of a lamp signal fed back in response to analog reference voltages and generate various reference signals. The ADC 419 may convert analog image data into digital image data. In other embodiments, various embodiments of the inventive concepts may also be included in other elements of FIG. 13A.

Figure 13B:
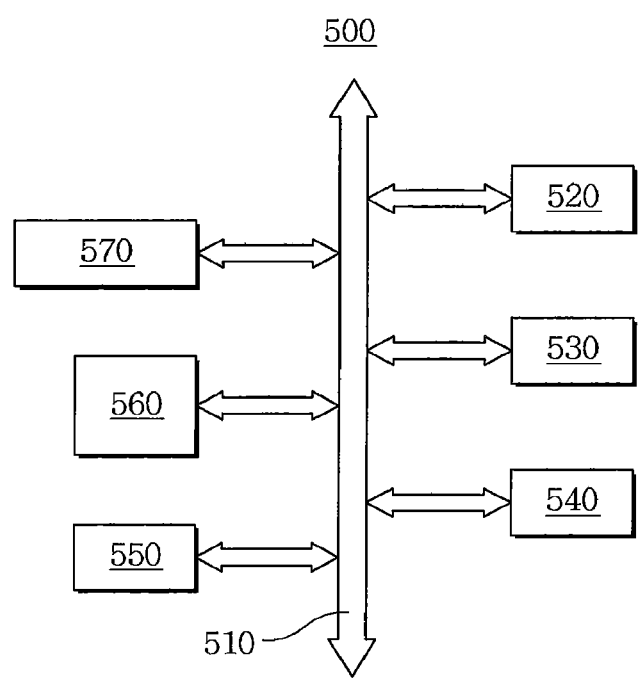
FIG. 13B is a schematic block diagram of an electronic system according to an embodiment of the inventive concepts.

FIG. 13B is a schematic block diagram of an electronic system 500 according to an embodiment of the inventive concepts. Referring to FIG. 13B, the electronic system 500 according to the embodiment of the inventive concepts may include a bus 510, and an image sensing part 520, a central processing unit (CPU) 530, and an input/output (I/O) part 540. The electronic system 500 may further include a memory drive 550. The electronic system 500 may further include an optical disk drive (ODD) 560. The electronic system 500 may further include an external communication part 570. The image sensing part 520 may include a backside illuminated image sensor according to embodiments of the inventive concepts. The CPU 530 may include a microprocessor (MP). The I/O part 540 may include one or more of various input apparatuses including an operation button, a switch, a keyboard, a mouse, a keypad, a touch pad, a scanner, a camera, and an optical sensor or include one of a liquid crystal display (LCD) monitor, a light emitting diode (LED) monitor, a cathode-ray tube (CRT) monitor, a printer, and/or a display device for displaying various pieces of visual information. The memory drive 550 may include a dynamic random access memory (DRAM), a static random access memory (SRAM), a phase-changeable random access memory (PRAM), a resistive random access memory (RRAM), a magnetic random access memory (MRAM), a non-volatile memory (NVM), a flash memory, a solid-state disk (SSD), a hard disk (HD) and/or various memory devices, or drives thereof. The ODD 560 may include, for example, a CD-ROM drive or a DVD drive. The external communication part 570 may include a modem, a LAN card, or a universal serial bus (USB) and include an external memory, a WiBro communication device, or an infrared communication device. In other embodiments, various embodiments of the inventive concepts may also be included in other elements of FIG. 13B.

Via structures and semiconductor devices according to various embodiments of the inventive concepts may include conductive elements, which are electrically connected using one via plug and disposed at different levels or in different regions. The via structures and semiconductor devices according to various embodiments of the inventive concepts may include a via plug or via plugs having endings disposed at different levels or in different regions.

Via structures and semiconductor devices according to various embodiments of the inventive concepts include an etch-delay structure for delaying an etching process so that a via plug can have endings disposed at different levels or in different regions.

In via structures and semiconductor devices according to various embodiments of the inventive concepts, since an etching structure may control a process of etching a via plug, a via plug having endings disposed at respectively different levels or in respectively different regions.

The technical objectives of the inventive disclosure are not limited to the above disclosure; other objectives may become apparent to those of ordinary skill in the art based on the following descriptions.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor device comprising:
    a substrate;
    an upper dielectric layer on a bottom surface of the substrate;
    a lower dielectric layer on a bottom surface of the upper dielectric layer;
    an etch-delay structure between a portion of an upper surface of the upper dielectric layer and a portion of the bottom surface of the substrate, wherein the upper surface of the upper dielectric layer is opposite the bottom surface of the upper dielectric layer; and
    an upper plug pad in the upper dielectric layer, the upper plug pad comprising a first upper plug pad and a second upper plug pad;
    a lower plug pad in the lower dielectric layer; and
    a via plug extending through the substrate, wherein the via plug comprises:
        a first portion being in direct physical contact with an upper surface of the first upper plug pad and with a first sidewall of the etch-delay structure;
        a second portion being in direct physical contact with an upper surface of the second upper plug pad and with a second sidewall of the etch-delay structure; and
        a third portion between the first portion and the second portion, the third portion being in direct physical contact with the lower plug pad,
        wherein the third portion of the via plug is in direct physical contact with a sidewall of the first upper plug pad and a sidewall of the second upper plug pad, and
        wherein at least a portion of the first portion of the via plug is in direct physical contact with the substrate.

2. The semiconductor device of claim 1, the etch-delay structure comprising a first etch-delay structure and a second etch-delay structure,
    wherein the first portion of the via plug is in direct physical contact with the first etch-delay structure, and
    wherein the second portion of the via plug is in direct physical contact with the second etch-delay structure.

3. The semiconductor device of claim 1, wherein the via plug is electrically connected to the first upper plug pad, the second upper plug pad, and the lower plug pad.

4. The semiconductor device of claim 1, wherein a bottom surface of the third portion of the via plug is at a lower level than a bottom surface of the first portion of the via plug and a bottom surface of the second portion of the via plug.

5. The semiconductor device of claim 1, wherein the lower plug pad and the third portion of the via plug are spaced apart from the etch-delay structure.

6. The semiconductor device of claim 1,
    wherein at least one of the substrate and the upper dielectric layer has a recessed portion, and
    wherein the etch-delay structure is flat, is in the recessed portion, and is in direct physical contact with the portion of the upper surface of the upper dielectric layer and the portion of the bottom surface of the substrate.

7. The semiconductor device of claim 1,
    wherein the first portion and the second portion of the via plug penetrate at least a portion of the upper dielectric layer, and
    wherein the third portion of the via plug penetrates the upper dielectric layer and at least a portion of the lower dielectric layer.

8. The semiconductor device of claim 1, wherein a portion of the etch-delay structure extends continuously from a sidewall of the via plug to a sidewall of the upper dielectric layer or to a sidewall of the substrate.

9. A semiconductor device comprising:
    a semiconductor wafer;
    an upper dielectric layer on a bottom surface of the semiconductor wafer;
    a lower dielectric layer on a bottom surface of the upper dielectric layer;
    a lower plug pad in the lower dielectric layer;
    an upper plug pad in the upper dielectric layer, the upper plug pad comprising a first upper plug pad and a second upper plug pad;
    an etch-delay structure between a first portion of the bottom surface of the semiconductor wafer and a first portion of an upper surface of the upper dielectric layer, the etch-delay structure comprising a first etch-delay structure and a second etch-delay structure, wherein a second portion of the bottom surface of the semiconductor wafer is in direct physical contact with a second portion of the upper surface of the upper dielectric layer, and wherein the upper surface of the upper dielectric layer is opposite the bottom surface of the upper dielectric layer; and
    a via plug in a via hole, the via hole penetrating the semiconductor wafer, and the via hole comprising:
        a first via hole exposing the first upper plug pad and the first etch-delay structure;
        a second via hole exposing the second upper plug pad and the second etch-delay structure; and
        a third via hole exposing the lower plug pad, wherein the third via hole is connected to the first via hole and the second via hole.

10. The semiconductor device of claim 9, wherein the third via hole is spaced apart from the first etch-delay structure and the second etch-delay structure in a plan view.

11. The semiconductor device of claim 9, wherein via plug is electrically connected to the first upper plug pad, the second upper plug pad, and the lower plug pad.

12. The semiconductor device of claim 9,
wherein the first via hole has a first sidewall exposing the first etch-delay structure,
wherein the second via hole has a second sidewall exposing the second etch-delay structure,
wherein the first sidewall faces the second sidewall.

13. The semiconductor device of claim 12, wherein the via plug comprises:
a barrier layer on the first sidewall of the first via hole, the second sidewall of the second via hole, the lower plug pad, the first upper plug pad, and the second upper plug pad; and
a conductive via core on the barrier layer in the via hole.

14. The semiconductor device of claim 9, wherein the third via hole is between the first via hole and the second via hole.

15. The semiconductor device of claim 9, wherein the etch-delay structure is in direct physical contact with the semiconductor wafer and the upper dielectric layer.

16. A semiconductor device comprising:
a semiconductor wafer;
an interlayer dielectric layer on a bottom surface of the semiconductor wafer;
a lower pad in the interlayer dielectric layer;
a first upper pad at a higher level than the lower pad in the interlayer dielectric layer;
a second upper pad at a higher level than the lower pad in the interlayer dielectric layer;
a buried non-conductive layer between and in direct physical contact with a first portion of the bottom surface of the semiconductor wafer and a first portion of an upper surface of the interlayer dielectric layer, the buried non-conductive layer comprising a first buried non-conductive layer and a second buried non-conductive layer, wherein the upper surface of the interlayer dielectric layer is opposite a bottom surface of the interlayer dielectric layer; and
a via plug extending through the semiconductor wafer, wherein the via plug comprises:
a first conductive portion penetrating at least a portion of the first buried non-conductive layer and electrically connected to the first upper pad;
a second conductive portion penetrating at least a portion of the second buried non-conductive layer and electrically connected to the second upper pad; and
a third conductive portion electrically connected to the lower pad,
wherein the first buried non-conductive layer extends over an upper surface of the first upper pad,
wherein the second buried non-conductive layer extends over an upper surface of the second upper pad, and
wherein a second portion of the bottom surface of the semiconductor wafer is in direct physical contact with a second portion of the upper surface of the interlayer dielectric layer.

17. The semiconductor device of claim 16, wherein the third conductive portion is spaced apart from the first buried non-conductive layer and the second buried non-conductive layer.

18. The semiconductor device of claim 16, wherein the third conductive portion is between and connected to the first conductive portion and the second conductive portion.

19. The semiconductor device of claim 16, wherein the buried non-conductive layer has higher etch resistance to an etchant than the semiconductor wafer.

20. The semiconductor device of claim 16,
wherein the buried non-conductive layer is in direct physical contact with a first portion of a sidewall of the via plug, and
wherein the semiconductor wafer is in direct physical contact with a second portion of the sidewall of the via plug.

* * * * *